(12) United States Patent
Sakuma et al.

(10) Patent No.: US 8,508,046 B2
(45) Date of Patent: Aug. 13, 2013

(54) CIRCUIT SUBSTRATE AND METHOD OF MANUFACTURING SAME

(75) Inventors: Masao Sakuma, Yokohama (JP); Kanji Otsuka, Higashiyamato (JP)

(73) Assignee: DISCO Corporation, Tokyo (JP)

( * ) Notice: Subject to any disclaimer, the term of this patent is extended or adjusted under 35 U.S.C. 154(b) by 0 days.

(21) Appl. No.: 13/371,323

(22) Filed: Feb. 10, 2012

(65) Prior Publication Data

US 2012/0193799 A1      Aug. 2, 2012

Related U.S. Application Data

(63) Continuation of application No. PCT/JP2010/063782, filed on Aug. 13, 2010.

(30) Foreign Application Priority Data

| Aug. 13, 2009 | (JP) | 2009-203084 |
| Jan. 22, 2010 | (JP) | 2010-012589 |
| Feb. 12, 2010 | (JP) | 2010-029449 |
| Mar. 12, 2010 | (JP) | 2010-056710 |
| Mar. 12, 2010 | (JP) | 2010-056711 |
| Mar. 12, 2010 | (JP) | 2010-056712 |
| Aug. 13, 2010 | (JP) | 2010-181464 |
| Aug. 13, 2010 | (JP) | 2010-181465 |
| Aug. 13, 2010 | (JP) | 2010-181466 |
| Aug. 13, 2010 | (JP) | 2010-181467 |
| Aug. 13, 2010 | (JP) | 2010-181468 |

(51) Int. Cl.
*H01L 23/48*   (2006.01)
*H01L 23/52*   (2006.01)
*H01L 29/40*   (2006.01)
*H01L 23/00*   (2006.01)

(52) U.S. Cl.
CPC ..................... *H01L 24/49* (2013.01)
USPC ........... 257/738; 257/762; 257/775; 257/765; 438/612

(58) Field of Classification Search
USPC ................. 257/770, 741, 773, 776, 745, 748, 257/765
See application file for complete search history.

(56) References Cited

U.S. PATENT DOCUMENTS

| 7,745,938 B2 * | 6/2010 | Nakasato et al. ............. 257/773 |
| 2002/0070440 A1 | 6/2002 | Aiba et al. |

(Continued)

FOREIGN PATENT DOCUMENTS

| JP | 2001-135742 | 5/2001 |
| JP | 2003-073801 | 3/2003 |

(Continued)

OTHER PUBLICATIONS

Crofton, Kevin, "TSV Formation Equipment & Integration Challenges," Aviza Technology, CTO Forum, Semicon Taiwan, 2008.

(Continued)

*Primary Examiner* — Walter H Swanson
*Assistant Examiner* — Wilner Jean Baptiste
(74) *Attorney, Agent, or Firm* — Silicon Valley Patent Group LLP

(57) ABSTRACT

A circuit substrate is presented. The circuit substrate comprises internal terminal electrode 2; a substrate 1; a wiring layer 21 formed on a portion of the surface of the substrate and having one end thereof connected to the internal terminal electrode; an insulating film contacting as a surface with the wiring layer; and an external terminal electrode 9 connected to the other end of the wiring layer and used for connecting to the exterior. The angle of the cross-section of the wiring layer taken perpendicularly to the surface of the substrate in the edge portion that the wiring layer contains is 55° (55 degree) or less, and the wiring layer that contains multiple mutually independent columnar crystals extending perpendicularly in a direction different from the direction of the surface of the substrate.

22 Claims, 53 Drawing Sheets

(56) References Cited

U.S. PATENT DOCUMENTS

| | | |
|---|---|---|
| 2002/0093082 A1 | 7/2002 | Miyamoto et al. |
| 2003/0207574 A1 | 11/2003 | Aiba et al. |
| 2004/0155351 A1 | 8/2004 | Miyamoto et al. |
| 2005/0173809 A1 | 8/2005 | Yamamoto et al. |
| 2008/0023836 A1 | 1/2008 | Watanabe |
| 2008/0174016 A1* | 7/2008 | Sato et al. ............ 257/741 |
| 2008/0242087 A1 | 10/2008 | Matsunaka et al. |
| 2011/0074032 A1 | 3/2011 | Watanabe |

FOREIGN PATENT DOCUMENTS

| | | |
|---|---|---|
| JP | 2004-111840 | 4/2004 |
| JP | 2004-200247 | 7/2004 |
| JP | 2004-207319 | 7/2004 |
| JP | 2004-214345 | 7/2004 |
| JP | 2004-232026 | 8/2004 |
| JP | 2004-319792 | 11/2004 |
| JP | 2006-210406 | 8/2006 |
| JP | 2007-157879 | 6/2007 |
| JP | 2007-318058 | 12/2007 |
| JP | 2008-214709 | 9/2008 |
| JP | 2001-214262 | 8/2011 |
| WO | 00/44043 | 7/2000 |

OTHER PUBLICATIONS

Hopwood, J., "Ionized physical vapor deposition of integrated circuit Interconnects," Physics of Plasmas, vol. 5, No. 5, American Institute of Physics, May 1998, pp. 1624-1631.

"Microelectronics Packaging Handbook," Tummala, Rao R. et al (editors), Van Nostrand Reinhold, New York, New York, 1989, pp. 379-380.

"VLSI Technology," International Student Edition, Sze, S. M. (editor), McGraw-Hill International Book Company, Tokyo, Japan, 1983, pp. 364-366.

* cited by examiner

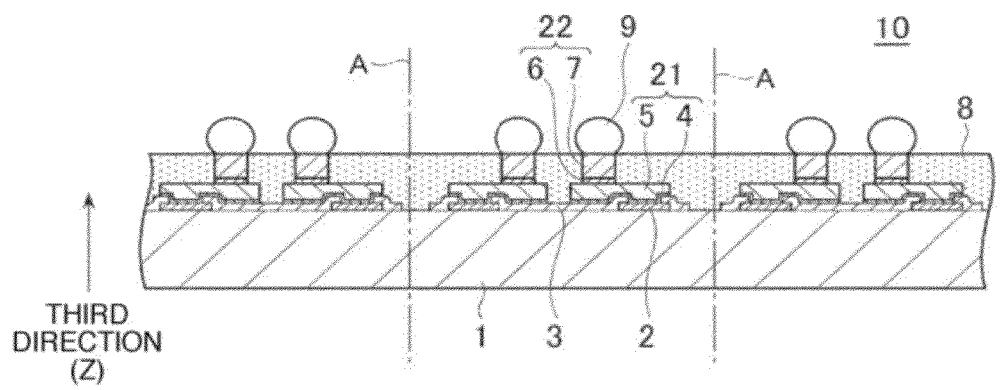
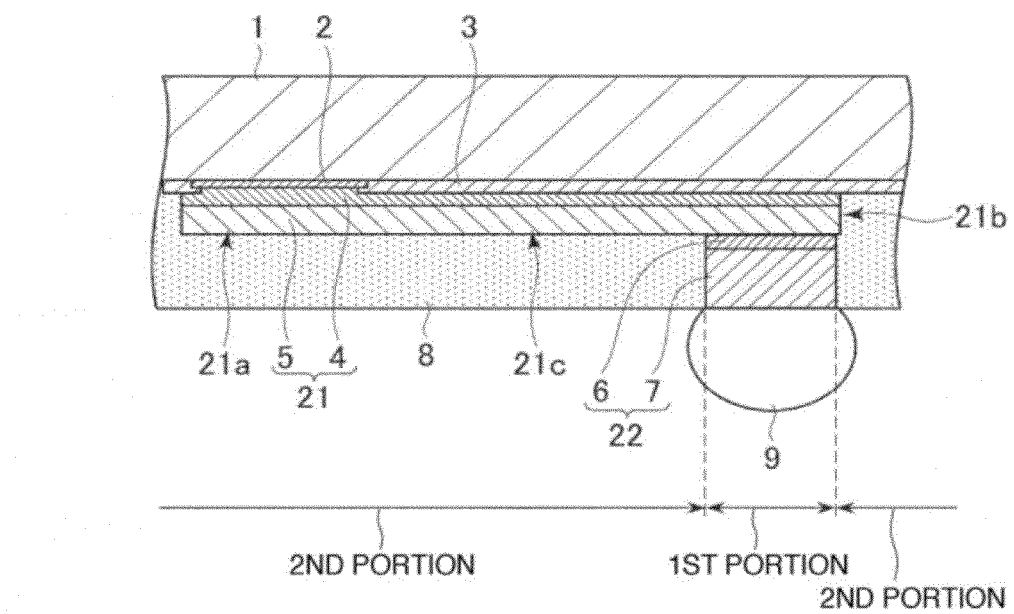

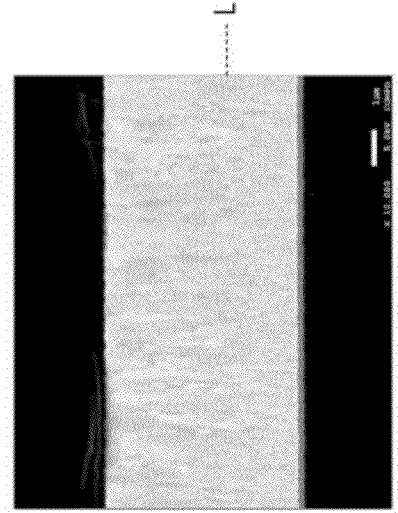
FIG. 63C CONDITION 3
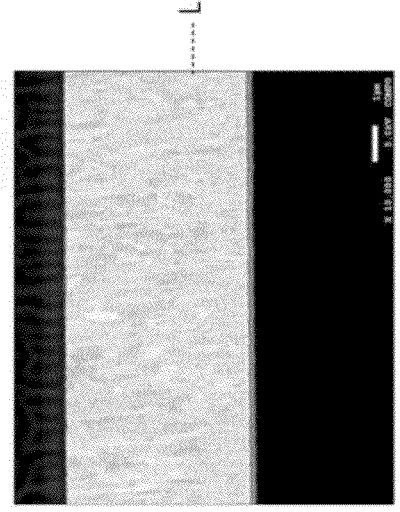
FIG. 63D CONDITION 4
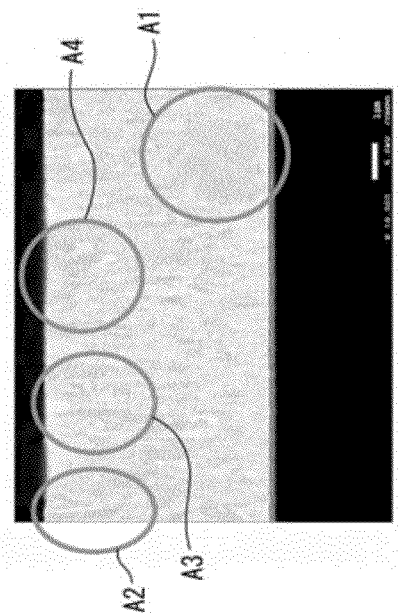
FIG. 63A CONDITION 1
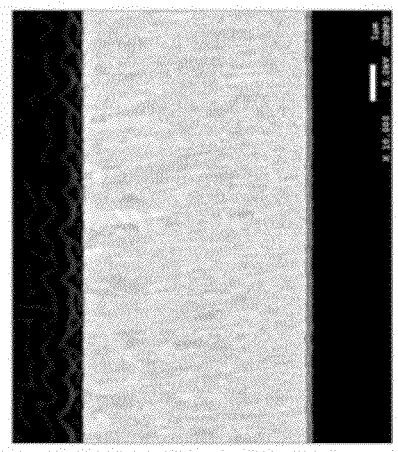
FIG. 63B CONDITION 2

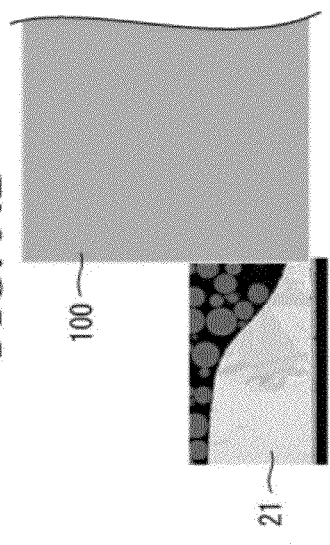
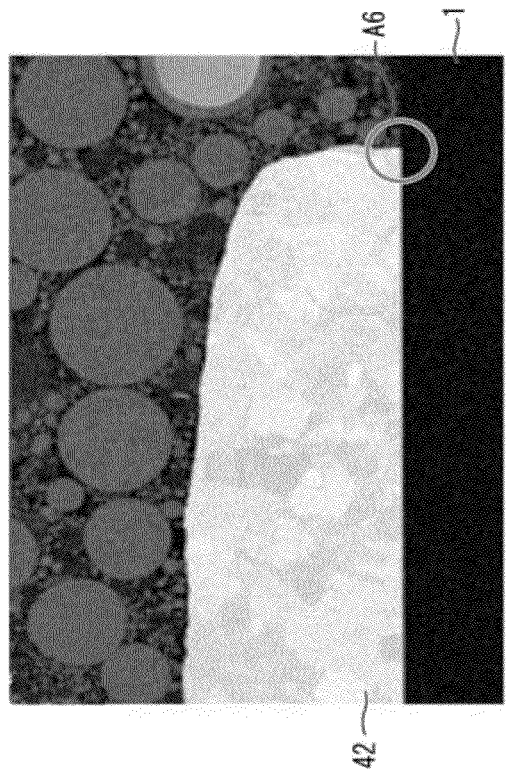
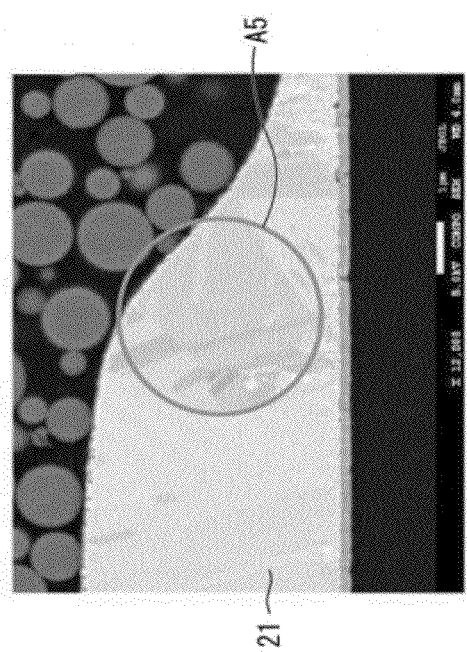
FIG. 64B
FIG. 64C
FIG. 64A

CIRCUIT SUBSTRATE AND METHOD OF MANUFACTURING SAME

CROSS-REFERENCE TO RELATED APPLICATIONS

This application is a continuation of International Patent Application No. PCT/JP2010/063782, filed on Aug. 13, 2010 (incorporated herein by reference), which, in turn, claims the benefit of priority from Japanese Patent Application No. 2009-203084, filed Aug. 13, 2009; Japanese Patent Application No. 2010-012589, filed Jan. 22, 2010; Japanese Patent Application No. 2010-029449, filed Feb. 12, 2010; Japanese Patent Application No. 2010-056710, filed Mar. 12, 2010; Japanese Patent Application No. 2010-056711, filed Mar. 12, 2010; Japanese Patent Application No. 2010-056712, filed Mar. 12, 2010; Japanese Patent Application No. 2010-181464, filed Aug. 13, 2010; Japanese Patent Application No. 2010-181465, filed Aug. 13, 2010; Japanese Patent Application No. 2010-181466, filed Aug. 13, 2010; Japanese Patent Application No. 2010-181467, filed Aug. 13, 2010; and Japanese Patent Application No. 2010-181468, filed Aug. 13, 2010; each of which is incorporated herein by reference.

BACKGROUND OF THE INVENTION

1. Field of the Invention

The present invention relates to a circuit substrate and a method of manufacturing the same. The present invention also relates to a semiconductor device, a method of manufacturing the same, and a system that employs them. The present invention also relates to a wafer-level packaging structure and a method of manufacturing the same.

2. Description of the Related Art

In recent years, there has been an explosion of demand for miniaturization of circuit systems utilizing semiconductor chips, such as computers, mobile communication devices, and the like. To meet such demand, semiconductor chips may be mounted in the form of chip-size packages (CSP) that are close in size to the chips.

One well-known method of implementing CSPs is a packaging method called "wafer-level packaging" (WLP) (see Japanese Patent Laid-open Publication No. 2004-319792 and Japanese Patent Laid-open Publication No. 2007-157879). WLP is a method, in which an external terminal electrode and the like are formed on a silicon wafer prior to its singulation by dicing, with singulation by dicing performed after WLP. It is expected that the use of WLP may be able to increase productivity because an external terminal electrode and the like can be formed simultaneously on multiple semiconductor chips.

However, high production costs present a problem for WLP because it is a step carried out subsequent to the front-end-of-line steps used to manufacture a substrate with internal terminal electrode, and because, unlike regular packaging methods utilizing bonding wires, it normally includes photolithography steps (resist coating, exposure, development, and resist stripping) among the back-end-of-line processing steps used to finish the final product containing the substrate. For example, a method, in which external terminal electrode (31) is formed after patterning a wiring layer (12) using a photolithographic process and then patterning an insulating layer (21) using a photolithographic process, is depicted in FIG. 9 of Japanese Patent Laid-open Publication No. 2004-319792. In addition, a method, in which external terminal electrode (16) is formed after patterning a wiring layer (13) using a photolithographic process and then patterning an insulating layer (15) using a photolithographic process, is also depicted in FIGS. 3-4 of Japanese Patent Laid-open Publication No. 2007-157879.

Such problems are not limited to semiconductor chip WLP and also occur in other cases, in which external terminal electrode is formed on various circuit substrates having fine internal circuitry formed therein.

Accordingly, there is a need for a less expensive method of forming external terminal electrode on circuit substrates having fine internal circuitry formed therein, especially on silicon wafers at wafer level.

Furthermore, the present inventors have also noted the following. For example, when contemplating a system-in-package (SIP) semiconductor device having a mixture of circuit substrates and other function chips mounted thereon, mounting in a package (CSP) that is close in size to the semiconductor chips contained in the package is preferable in terms of the package size of the semiconductor device. For instance, when a first chip contained on a circuit substrate and a second chip that communicates with the first chip are of different chip sizes, chip-level mounting technology is required to combine these chips into a laminate structure. Packaging multiple chips as a single unit at wafer level is preferable for further miniaturization and price reduction.

In addition, when, for example, multiple second chips are laminated on a wafer comprised of multiple corresponding first chips and the chips are connected using bonding wires, redistribution wiring (redistribution wiring layers) connected to the bonding wires has to be formed on the wafer. However, in terms of its metal, Cu wiring produced by additive (damascene) plating subsequent to sputtering regular underlying metallization is not particularly suitable for connection to bonding wires due to wettability and other problems. As a result, gold plating has to be additionally applied to the Cu wiring layer used as the redistribution wiring, thereby producing a redistribution wiring layer structure that is multi-layered and fraught with high production costs.

SUMMARY OF THE INVENTION

The present invention seeks to solve one or more of the above problems, or to improve upon those problems at least in part.

In one embodiment, there is provided a method of manufacturing a circuit substrate, wherein, on a semiconductor substrate comprising internal terminal electrode, the circuit substrate forming external terminal electrode electrically coupling the internal terminal electrode to the exterior, the method comprising: masking, during which a metallic metal mask that has openings exposing a portion of the surface of the semiconductor substrate including the internal terminal electrode and is connected to the negative side is placed over the semiconductor substrate; film forming, during which metallic conductor layer is formed from positively charged ion particles by an ion plating process on the portion of the surface of the semiconductor substrate and on the metal mask; lift-off, during which the metal mask is stripped away, leaving a wiring line that is contained a wiring layer including the metallic conductor layer, the wiring line electrically coupled to the internal terminal electrode and formed on a portion of the surface of the semiconductor substrate; and forming, the external terminal electrode electrically coupled to the wiring line.

In another embodiment, there is provided a method of manufacturing a circuit substrate, wherein, on a substrate comprising internal terminal electrode, the circuit substrate forming external terminal electrode that electrically coupling the internal terminal electrode to the exterior, the method comprising: masking, during which a metallic metal mask that has openings exposing a portion of the surface of the substrate including the internal terminal electrode and is connected to the negative side is placed over the substrate; film forming, during which metallic conductors layer is formed from positively charged ion particles using an ion plating process on the portion of the surface of the substrate and on the metal mask, the ion plating process applying a predetermined potential to the substrate and applying a deposition energy of 0.01 eV to 250 eV to a deposition metal ionized by a potential different from the predetermined potential; liftoff, during which the metal mask is stripped away, leaving a wiring line that is contained a wiring layer including the metallic conductor layer, the wiring line electrically coupled to the internal terminal electrode and formed on a portion of the surface of the substrate; and forming, the external terminal electrode electrically coupled to the wiring line.

In another embodiment, there is provided a circuit substrate, comprising: a substrate containing silicon and comprising an internal terminal electrode containing metal; a wiring layer containing metal chosen from group of Cu, Al, Ti, and Ni that is formed on a portion of a surface of the substrate and is electrically coupled to the internal terminal electrode; an insulating film that covers a second portion of the surface of, the wiring layer while not covering a first portion of a surface of the wiring layer; and an external terminal electrode containing metal and electrically couple the internal terminal electrode to the exterior by covering the first portion of the wiring layer and electrically coupling to the wiring layer, wherein: the second portion of the wiring layer includes an edge portion viewed from the direction perpendicular to the surface of the substrate, the angle of the cross-section of the wiring layer taken perpendicularly to the surface of the substrate in the edge portion contacting with the substrate is 55° (55 degree) or less, and the wiring layer that comprises a plurality of mutually independent columnar crystals extending in a direction different from the direction of the surface of the substrate.

In another embodiment, there is provided a circuit substrate, comprising: a substrate containing silicon and comprising an internal terminal electrode containing metal; a wiring layer containing a metal chosen from the group of Cu, Al, Ti, and Ni that is formed on a portion of a surface of the substrate and has one end thereof connected to the internal terminal electrode; an insulating film contacting as a surface with the wiring layer; and an external terminal electrode containing metal that connects the other end of the wiring layer and is used for connecting to the exterior, wherein the angle of the cross-section of the wiring layer taken perpendicularly to the surface of the substrate in an edge portion that the wiring layer contains is 55° (55 degree) or less, and the wiring layer that contains a plurality of mutually independent columnar crystals extending perpendicularly in a direction different from the direction of the surface of the substrate.

BRIEF DESCRIPTION OF THE DRAWINGS

The above features and advantages of the present invention will be more apparent from the following description of certain preferred embodiments taken in conjunction with the accompanying drawings, in which:

FIG. 1 shows a schematic cross-sectional view illustrating the structure of a circuit substrate (silicon wafer) according to a preferred embodiment of the present invention;

FIG. 2 shows a cross-sectional view illustrating an enlarged view of the principal parts of the silicon wafer 10;

FIG. 5 shows a schematic view used to illustrate the width of the flange portion 22a;

FIGS. 63A to 63D show experimental results showing the relationship between the deposition energy of the metal (Cu) deposited during ion plating and the structure of the deposited Cu crystals; and FIGS. 64A to 64C shows experimental results illustrating the cross-sectional shape of the wiring layer depicted in FIG. 5 and FIG. 6.

DETAILED DESCRIPTION OF THE INVENTION

Figure 3A:
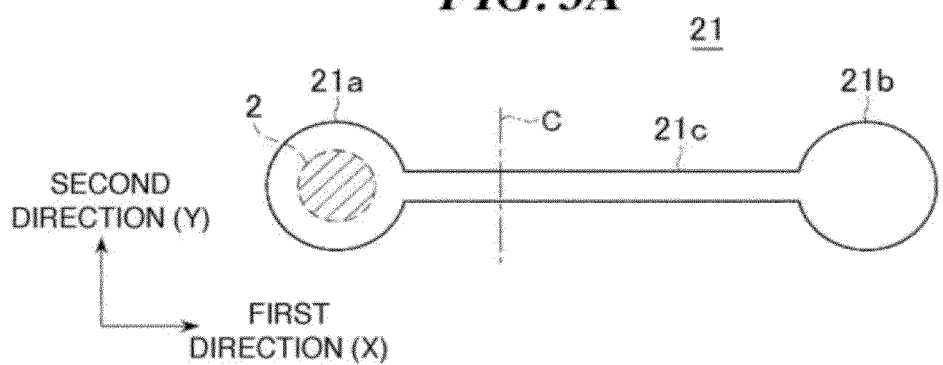
FIG. 3A is a plan view showing an exemplary planar shape of the wiring layer 21.

Below, preferred embodiments of the present invention are described in detail with reference to the accompanying drawings. It should be noted that FIG. 1 through FIG. 18 and FIG. 59 through FIGS. 64A to 64C, which represent Chapter 1, depict the structure and method of manufacturing a circuit substrate, while FIG. 19 through FIG. 58, which represent Chapter 2 and Chapter 3, depict the structure and method of manufacturing a semiconductor device and an electronic system related to this circuit substrate.

After a series of thorough investigations into inexpensive methods of forming external terminal electrode on circuit substrates, the present inventors found a solution to at least one of the problems. It has been found that a wiring layer used for connection to external terminal electrode can be formed without resorting to the use of photolithography steps by employing a method, in which a metallic material is ion plated on a circuit substrate through a metal mask and the metal mask is then stripped off (lifted off). While the ion plating process is itself a well-known method of metal film deposition, a method (ion printing) that combines the ion plating process with the lift-off process to form wiring layers directly, without resorting to the use of a photolithographic process, has no precedents in the field of semiconductor chip WLP. The reason for this is believed to be due to the fact that methods utilizing a photolithographic process along with physical deposition of nonionic species, such as evaporation and sputtering, have been established as methods of forming wiring layers of small film thickness in WLP, while methods utilizing a photolithographic process along with a plating process have been established as methods of forming wiring layers of large film thickness in WLP. However, research conducted by the present inventors has found that, in the above-mentioned method, that is, forming wiring layers on circuit substrates by ion printing, not only are the production costs lower in comparison with the existing processes employing photolithographic methods, but the properties of the formed wiring layers are excellent as well. It has been found that production costs are further reduced if bonding wire technology is applied to wiring layers with such characteristics in order to effect connections between multiple chips.

A description of Chapter 1 is provided below. FIG. 1 is a schematic cross-sectional view (third direction (Z)) illustrating the structure of a circuit substrate (including silicon wafers) according to a preferred embodiment of the present invention.

The present invention is directed to a wafer-level packaged semiconductor circuit having a structure in which a semiconductor circuit pattern of barrier metal 4 is deposited on pick-up electrode portions 2 located on a wafer 1 having multiple semiconductor circuits formed thereon upon completion of front-end-of-line steps as well as on the surface adjoining it through a metal mask (lift-off process), a pattern of copper metal 5 is deposited on top of this pattern through a metal mask (lift-off process) to create a redistribution wiring pattern, then, in order to form electrode used for connection, a pattern of barrier metal 6 is deposited on the redistribution wiring pattern through a metal mask (lift-off process), a pattern of copper metal 7 is deposited on top of this pattern through a metal mask (lift-off process) to create a post electrode, and a liquid organic protective film 8 is formed by printing thereon, with the exception of the post electrode portion; and is characterized in that after forming solder balls 9 etc. on the exposed post portions, basic circuit chips are formed by dicing. This circuit is characterized in that the crystalline state of the metal film, on which the barrier metal and copper metal patterns are formed using ion plating processes, is disordered (amorphous, etc.).

As shown in FIG. 1, a silicon wafer 10 according to this embodiment includes a substrate 1, which constitutes the body of the wafer; chip pick-up electrode (internal terminal electrode) 2 formed on the surface of the substrate 1, and solder balls (external terminal electrode) 9 electrically connected to the chip pick-up electrode 2. The substrate 1 is an aggregate substrate made up of multiple semiconductor chips that is subsequently singulated. The circuits formed on, these semiconductor chips are identical to one another.

Practically the entire surface of the substrate 1, with the exception of the regions where the chip pick-up electrode 2 is provided, is covered by an insulating passivation film 3 (second insulating film). While not particularly limited thereto, the chip pick-up electrode 2 is commonly made up of Al and the passivation film 3 is commonly made up of polyimide with a thickness of about 5 μm. The surface of the chip pick-up electrode 2 placed in contact with the hereinafter described wiring layer may be pre-plated (for example, with Ni+Au). It should be noted that the term "substrate 1", as used herein, includes the chip pick-up electrode 2 as well as the passivation film 3. Therefore, the expression "the surface of the substrate 1" may refer to the surface of the chip pick-up electrode 2 as well as to the surface of the passivation film 3.

The portion comprising the substrate 1, chip pick-up electrode 2, and passivation film 3 are a portion manufactured during what is known as the front-end-of-line steps (diffusion steps). During the front-end-of-line steps, ultra-fine internal wiring lines and the like are formed on a substrate using a photolithographic process of extremely high precision that makes use of a stepper, etc. The portions serving as the terminals of these internal wiring lines are the chip pick-up electrodes 2. The silicon wafer 10 according to this embodiment has wiring layers 21, 22 and solder balls 9 etc. illustrated in FIG. 1 formed thereon by processing its surface at wafer level. The short dash lines A shown in FIG. 1 are scribe lines. Upon completion of processing of the silicon wafer 10 at wafer level (WLP step), the silicon wafer 10 is diced along the scribe lines, thereby singulating it into individual semiconductor chips.

FIG. 2 is a cross-sectional view illustrating an enlarged view of the principal part of the silicon wafer 10. In FIG. 2, the face, on which the solder balls 9 are formed, is shown as the bottom side.

As shown in FIG. 2, a chip pick-up electrode 2 and a passivation film 3 are provided on the surface of the substrate 1. As mentioned above, practically the entire surface of the substrate 1, with the exception of the regions where the chip pick-up electrode 2 is provided, is covered by the passivation film 3. The pick-up electrode 2 is connected to the first wiring layer 21 produced by laminating a barrier metal wiring line 4 and a copper wiring line 5. While not particularly limited thereto, the thickness of the barrier metal wiring line 4 is about 0.3 μm and the thickness of the copper wiring line 5 is about 5 μm.

The first wiring layer 21 has a first end portion 21a, which covers the chip pick-up electrode 2, a second end portion 21b, and a redistribution wiring portion 21c, which extends across the surface of the substrate 1 and connects the end portion 21a to the end portion 21b. An example of the planar shape of the wiring layer 21 (it is shown in a first direction (X) and a second direction (Y)) is illustrated in FIG. 3A. While not particularly limited thereto, the width of the redistribution wiring portion 21c is designed to be smaller than the diameters of the end portions 21a and 21b. In addition, the end portion 21a is designed to be slightly larger than the diameter of the chip pick-up electrode 2 so as to cover the entire surface of the chip pick-up electrode 2. The entire upper face of the wiring layer 21, with the exception of the portion covered by the wiring layer 22; is covered by a protective insulating film 8. In this Specification, the portion not covered by the protective insulating film 8 on the upper face of the wiring layers 21, 22 may be referred to as the "first portion" and the portion covered by the protective insulating film 8 may be referred to as the "second portion". Therefore, the wiring layer 21 does not have a first portion.

Figure 3B:
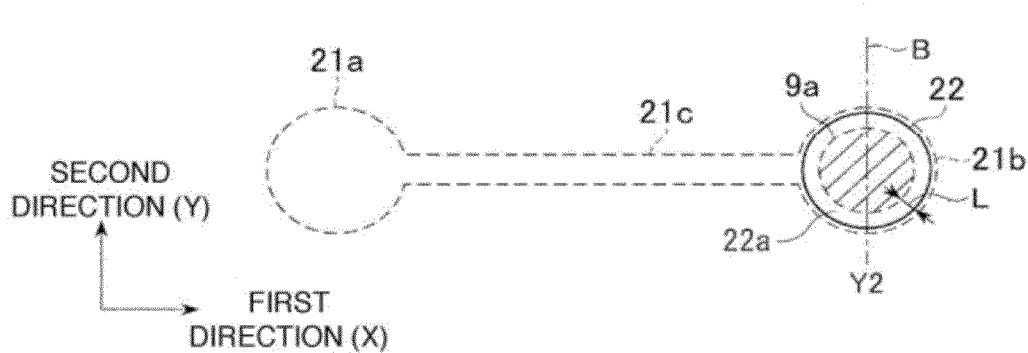
FIG. 3B is a plan view illustrating an exemplary planar shape of the wiring layer 22.
Figure 4:
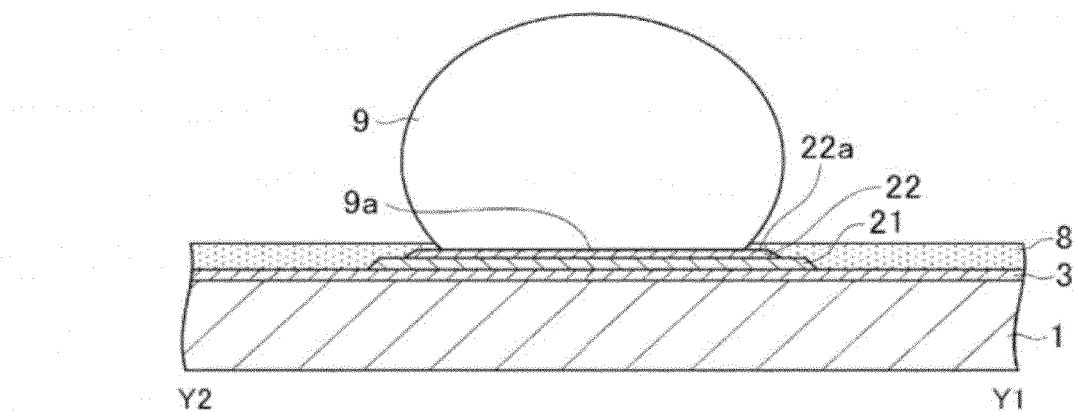
FIG. 4 shows an enlarged cross sectional view taken along line B shown in FIG. 3B.
Figure 5:
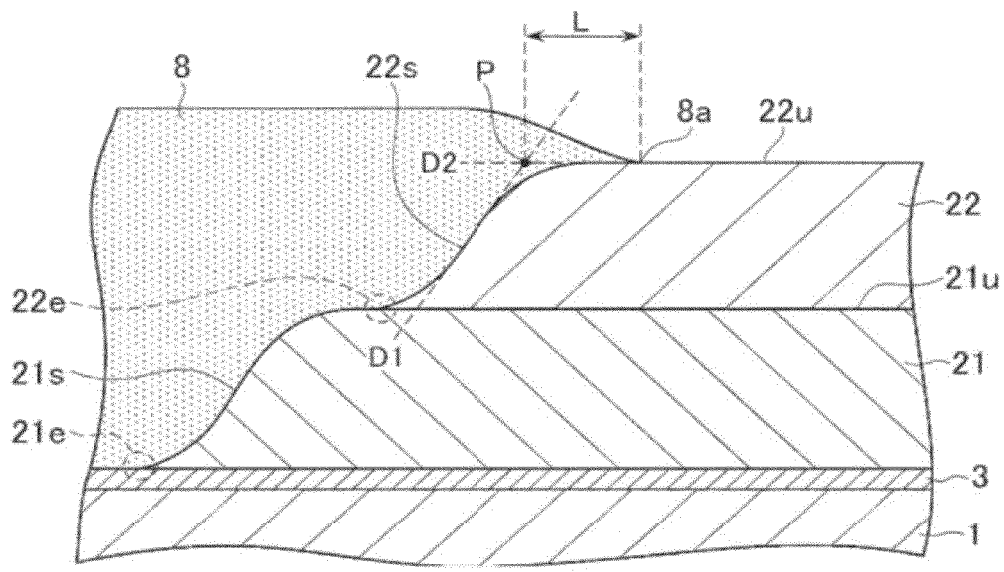

Furthermore, as shown in FIG. 2, the second wiring layer 22, in which a barrier metal trace 6 and a copper trace 7 are laminated, is connected to the end portion 21b of wiring layer 21. While not particularly limited thereto, the thickness of the barrier metal wiring line 6 is about 0.3 μm and the thickness of the copper wiring line 7 is about 10 μm. The second wiring layer 22, which is a wiring layer operating as a post electrode serving as an underlayer for the solder ball 9, is provided perpendicularly to the surface of the substrate 1. In other words, it does not have a portion extending across the surface of the substrate 1 in a manner similar to the redistribution wiring portion 21c. An example of the planar shape of the wiring layer 22 is illustrated in FIG. 3B, in which it has a diameter that is slightly smaller than the end portion 21b of the wiring layer 21. On the other hand, as shown in FIG. 3B, the wiring layer 22 is designed to be somewhat larger than the bottom surface 9a of the solder ball 9 so as to cover the entire bottom surface 9a of the solder ball 9. These features can be appreciated in detail by referring to the discussion of FIG. 5 provided below. While not particularly limited thereto, the diameter of the solder ball 9 is about 500 µm and the diameter of the wiring layer 22 is about 400 µm.

A monolayer film made up of Ti, Cr, Ta, or Pd, or a laminate film of Ti and Ni can be used for the barrier metal wiring lines 4, 6. Although in the present invention the provision of the barrier metal wiring lines 4, 6 is not mandatory, generally speaking, it is desirable to provide them because when the copper wiring line 5 is formed directly on the surface of the passivation film 3, the adhesion between them is insufficient, and when the copper wiring line 7 is formed directly on the surface of the copper wiring line 5 exposed to the atmosphere, the adhesion between them is insufficient as well. However, since in the present invention the copper wiring lines 5, 7 are formed using an ion plating process, it is possible to adjust their adhesion and deposition stress by controlling the energy of deposition. Therefore, in the present invention, the need to provide the barrier metal wiring lines 4, 6 is less critical than in conventional WLP.

As shown in FIG. 2, with the exception of the region where the solder ball 9 is formed, the entire surface of the substrate 1 is covered by the protective insulating film 8. While not particularly limited thereto, the material of the protective insulating film 8 is preferably a material produced by solidifying a liquid organic insulating material by curing and the like.

Such a structure allows for the entire surface of the wiring layer 21, with the exception of the portion covered by the wiring layer 22, to be covered by the protective insulating film 8. In the same manner, with the exception of the portion covered by the bottom surface 9a of the solder ball 9 (the first portion), the entire surface of the wiring layer 22 is covered by the protective insulating film 8 (the second portion). As shown in FIG. 3B, the portion covered by the bottom surface 9a of the solder ball 9 on the surface of the wiring layer 22 is in the central portion of the wiring layer 22 and, for this reason, the flange portion 22a located along the outer periphery on the surface of the wiring layer 22 is covered by the protective insulating film 8. As can be seen from FIG. 4, which is an enlarged cross sectional view taken along line B shown in FIG. 3B, the surface of the flange portion 22a of the wiring layer 22 is covered by the protective insulating film 8.

Such a structure makes it possible to prevent peeling and the like because the flange portion 22a, which includes the edge of the wiring layer 22, is protected by the protective insulating film 8. The term "edge" refers to an end portion viewed in a direction perpendicular to the surface of the substrate 1. In addition, the wiring layer 22 is prevented from falling off etc. because the flange portion 22a of the wiring layer 22 is covered by the protective insulating film 8. This allows for the reliability of the package to be increased.

While not particularly limited thereto, the width L of the flange portion 22a of the wiring layer 22 (see FIG. 3B), i.e. the width covered by the protective insulating film 8, is preferably set to 1 µm or more. This is due to the fact that when the width L of the flange portion 22a is less than 1 µm, it may not be possible to produce the above-described effects to a sufficient degree. While not particularly limited thereto, the upper bound of the width L of the flange portion 22a is preferably set to 30 µm or less. This is due to the fact that if the width L of the flange portion 22a is greater than 30 µm, the above-described effects are not improved, and, in addition, the contact area with the solder ball 9 becomes smaller than necessary. In order to obtain the full extent of the above-described effects while fully ensuring the area of contact with the solder ball 9, it is desirable to set the width L of the flange portion 22a to about 15 µm. It should be noted that, as shown in FIG. 5, the width L of the flange portion 22a is defined by the distance from the end portion 8a of the protective insulating film 8 to an intersection P between the average tangent D1 of the side face 22s of the wiring layer 22 and an imaginary line D2 extending along the upper face 22u of the wiring layer 22. In addition, as shown in FIG. 5, the height of the protective insulating film 8 above the substrate 1 is made taller than height of the upper face 22u of the wiring layer 22 above the substrate 1. As shown in FIG. 5, the side face 22s of the wiring layer 22 is diagonal, not vertical. In this respect, it is similar to the wiring layer 21 and, below, its cross-sectional structure will be described with reference to the wiring layer 21 as an example.

Figure 6:
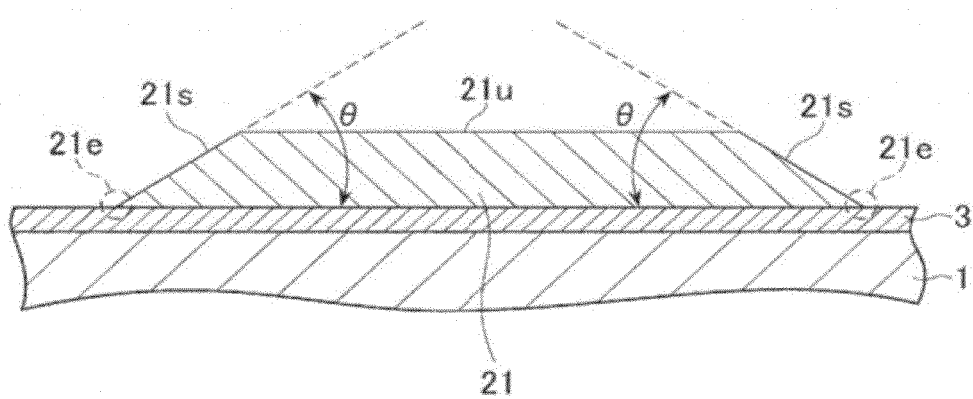
FIG. 6 shows an enlarged cross sectional view taken along line C shown in FIG. 3A.

FIG. 6 is an enlarged cross sectional view taken along line C shown in FIG. 3A.

As shown in FIG. 6, as far as the cross-sectional shape of the wiring layer 21 is concerned, the upper face 21u is nearly parallel to the surface of the substrate 1 while the side face 21s is inclined at an angle to the surface of the substrate 1. In other words, the edge portion 21e of the wiring layer 21 makes an acute angle. The angle theta is 55° (55 degree) or less, preferably not less than 20° (20 degree) and not more than 40° (40 degree), and especially preferably, not less than 25° (25 degree) and not more than 35° (35 degree). Because the edge portion 21e of the wiring layer 21 in the present embodiment has such an angle, stress in the edge portion 21e is alleviated. Furthermore, due to an increase in the contact area between the wiring layer 21 and the protective insulating film 8, adhesion between them is improved. Furthermore, adhesion between the wiring layer 21 and passivation film 3 is also improved because the edge portion 21e is covered from above by the protective insulating film 8. This allows for the reliability of the package to be increased. As shown in FIG. 5, the edge portion 21e having the above-described angle theta is covered by the protective insulating film 8. Accordingly, the "first portion" (the portion not covered by the protective insulating film 8) is an enclosed region produced by excluding the portion constituting the edge portion having said angle theta from the pattern shape of the surface of the wiring layers 21, 22. It should be noted that, as shown in FIG. 5, the cross-section of the side face 21s of the wiring layer 21 is not necessarily rectilinear and may be a curved line with a gradually changing angle. The angle theta in such a case is defined by the angle of the edge portions 21e, 22e illustrated in FIG. 5. The edge portion 21e is the starting point, at which the wiring layer 21 comes into contact with the passivation film 3, and the edge portion 22e is the starting point, at which the wiring layer 22 comes into contact with the wiring layer 21.

The method of manufacturing the silicon wafer 10 according to this embodiment will be described next.

FIGS. 7-8 are flowcharts illustrating the steps of the method of manufacturing the silicon wafer 10 according to this embodiment.

Figure 7A:
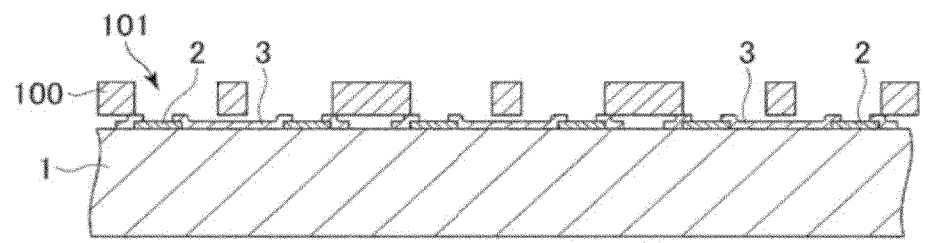
FIGS. 7A to 7C show a flowchart used to illustrate the steps of the manufacturing method of the silicon wafer 10.

First of all, a substrate 1 that has undergone the front-end-of-line steps (diffusion steps) is prepared and its surface is covered with a metal mask 100 as shown in FIG. 7A (masking step). The metal mask 100 (first metal mask) is provided with multiple openings 101 corresponding to the planar shape of the wiring layer 21. The metal mask 100 is placed over the surface of the substrate 1 such that the regions, in which the wiring layer 21 is to be formed, are exposed through the openings 101. The regions, in which the wiring layer 21 is to be formed, are the regions comprising the chip pick-up electrode 2, as shown in FIG. 7A. After aligning the metal mask 100 using a fixture, it is then intimately adhered to the substrate 1 and connected to the negative side of an ion plating apparatus. The metal mask 100 is secured such that certain tension is peripherally applied to the fixture securing portion so as to prevent warpage from developing as a result of temperature and deposition metal-induced strain.

While not particularly limited thereto, the material of the metal mask 100 is a metal, preferably stainless steel and the like. The metal mask 100 is a rigid mask different from photoresist and the like patterned using a photolithographic process. A single metal mask 100 can be placed over the substrate 1 "as is" and can be stripped from the substrate 1 "as is." In this respect, it is clearly different from organic masks such as photoresist and the like.

Figure 7B:
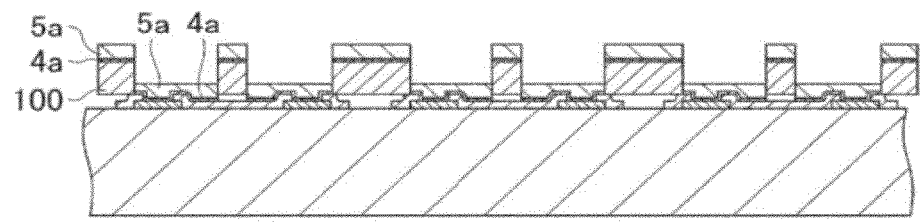

Next, as shown in FIG. 7B, once the metal mask 100 is in place, a barrier metal material 4a and Cu 5a are applied thereto in the above-noted order using an ion plating process (film-forming step). The ion plating process is a process, in which a metallic material to be deposited is evaporated or sublimated in a vacuum and a positive charge is applied to the metal vapor while a negative charge is applied to the deposition substrate, thereby depositing the vapor of the metallic material onto the deposition substrate. Accordingly, the step illustrated in FIG. 7B is carried out by placing the substrate 1 in a vacuum chamber and applying a negative charge to the substrate 1 and a positive charge to the gaseous barrier metal material and Cu.

Figure 9:
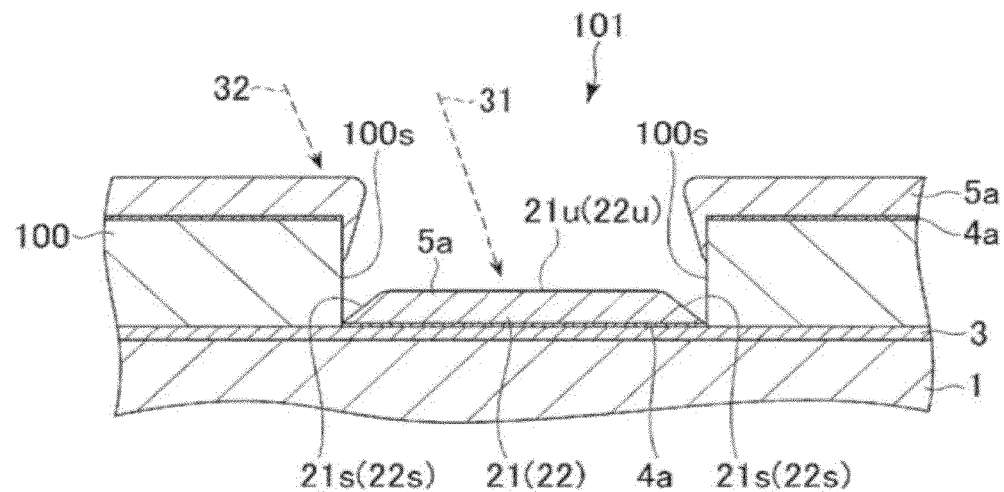
FIG. 9 shows a schematic view used to illustrate a principle whereby the side faces 21s are oriented at a slant to the substrate.

As a result, the barrier metal material 4a and Cu 5a are deposited on the surface of the substrate exposed through the openings 101 of the metal mask 100, as well as on the upper face of the metal mask 100. At such time, as shown in FIG. 9, the upper face 21u of the barrier metal material 4a and Cu 5a formed in the portions exposed through the opening 101 is oriented practically parallel to the surface of the substrate 1 while the side faces 21s are oriented at a slant to the surface of the substrate 1. This feature, which is characteristic of ion plating through a metal mask possessing a certain thickness, is due to the fact that in the regions exposed through the openings 101, the amount of deposit per unit of time in the portions located close to the side faces 100s of the metal mask 100 is decreased.

The reason for this is that, on the one hand, in the center of the opening 101, the components of the metal vapor attracted to the substrate 1, whose direction of travel is oriented somewhat at a slant, are deposited on the substrate 1 without being impeded by the metal mask 100 (see arrow 31), and, on the other hand, in the end portions of the opening 101, these components are impeded by the metal mask 100 and do not reach the substrate 1 (see arrow 32). In addition, as shown in FIG. 9, the metallic material is deposited in an overhang configuration on the side faces 100s of the metal mask 100 and, as a result, acts as a mask and reduces the amount of deposit in the end portions of the opening 101. In accordance with this principle, the upper face 21u is nearly parallel to the substrate 1 whereas the side faces 21s are oriented at a slant to the substrate 1. Therefore, the thickness of the metal mask is preferably between 5 times and 100 times the thickness of the deposited metal layer and preferably between 2 and ⅕ times the trace width of the deposited metal. The effects obtained with this structure are as already explained.

Figure 10:
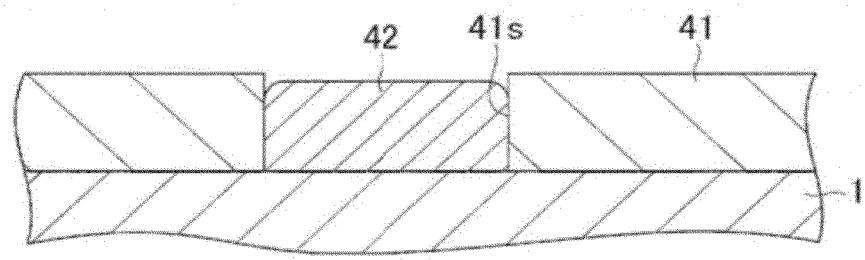
FIG. 10 shows a related art diagram used to illustrate the shape of a wiring layer 21 formed using an additive process.

By contrast, as shown in FIG. 10, when using a plating process (additive process), i.e. the method commonly used for forming wiring layers in WLP, a wiring layer 42 is selectively formed in an opening made in photoresist 41 patterned using a photolithographic process. In this case, due to being patterned using a photolithographic process, the inner walls 41s of the openings in the photoresist 41 are substantially perpendicular to the surface of the substrate 1 and, as a result, the side faces of the wiring layer 42 formed in the openings are also substantially vertical.

Figure 11A:
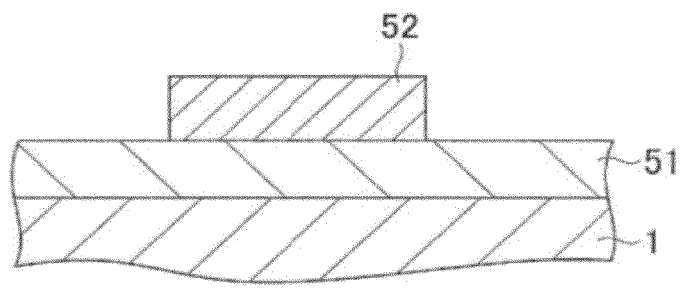
FIGS. 11A and 11B show a related art diagram used to illustrate the shape of a wiring layer 21 formed using a subtractive process.
Figure 11B:
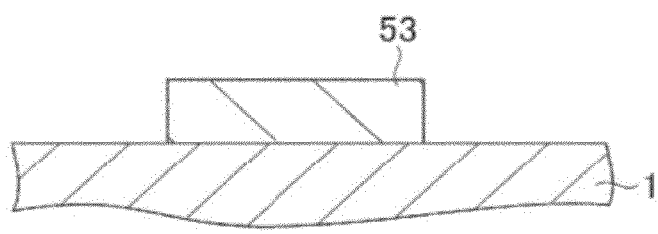

In addition, as shown in FIG. 11A, when using a subtractive process, which is not a method commonly used for forming wiring layers in WLP, photoresist 52 patterned using a photolithographic process is formed on the surface of a metal conductor 51 formed over the entire surface of the substrate. Then, as shown in FIG. 11B, when the metal conductor 51 is patterned using the photoresist 52 as a mask, the side faces of the formed wiring layer 53 become substantially perpendicular to the surface of the substrate 1.

Thus, when a photolithographic process is used, the side faces of the formed wiring layer become substantially vertical and the above-described effects cannot be obtained.

Figure 7C:
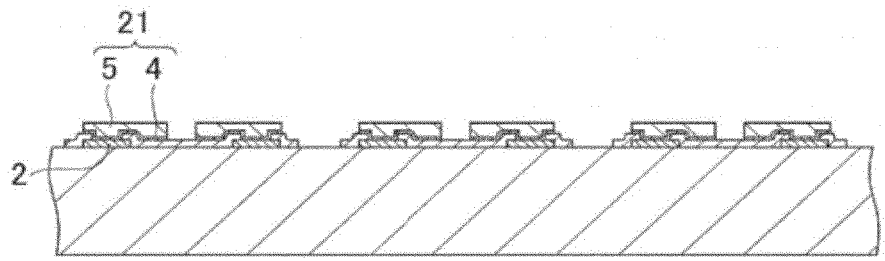

Turning now to the features of the present application, as shown in FIG. 7C, once the barrier metal material 4a and Cu 5a have been deposited in the above-mentioned sequence, the metal mask 100 is stripped from the substrate 1 (lift-off step). This leaves the barrier metal material 4a and Cu 5a inside the openings 101, thereby patterning the first wiring layer 21 comprised of a barrier metal wiring line 4 and a copper wiring line 5 with the help of a lift-off process, without resorting to the use of a photolithographic process. Thus, in the present invention, the wiring layer 21 can be formed directly using ion plating and a lift-off process, without resorting to the use of a photolithographic process. In this Specification, this technique is referred to as "ion printing".

Figure 8A:
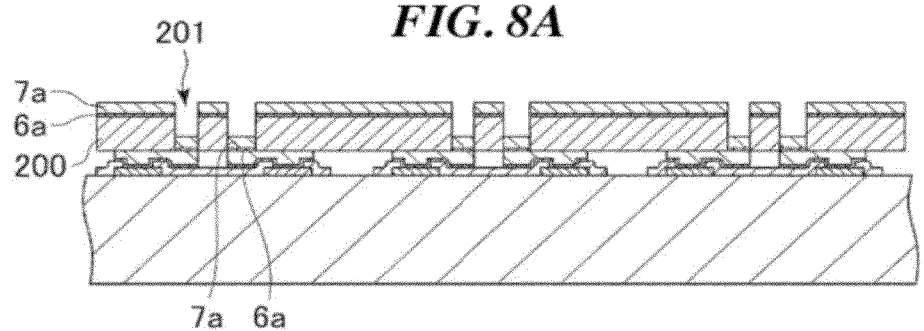
FIGS. 8A to 8C show a flowchart used to illustrate the steps of the manufacturing method of the silicon wafer 10.

Once the first wiring layer 21 has been formed, the second wiring layer 22 is formed thereafter. The method of forming the second wiring layer 22 is identical to the method of forming the first wiring layer 21. As shown in FIG. 8A, a metal mask 200 (second metal mask), which is provided with multiple openings 201 corresponding to the planar shape of the wiring layer 22, is prepared and said metal mask 200 is placed over the surface of the substrate 1 such that the regions, in which the wiring layer 22 is to be formed, are exposed through the openings 201 (masking step). As shown in FIG. 3B, the region, in which the wiring layer 22 is to be formed, is a region comprising the end portion 21b of the first wiring layer 21. The same material as the one used for the metal mask 100 can be utilized as the material of the metal mask 200.

Next, once the metal mask 200 is in place, a barrier metal material 6a and Cu 7a are applied in the above-noted order using an ion plating process (film-forming step). As a result, the barrier metal material 6a and Cu 7a are deposited on the surface of the substrate 1 (the surface of the copper wiring lines 5, to be precise) exposed through the openings 201 of the metal mask 200 as well as on the upper face of the metal mask 200. In this case, as shown in FIG. 9, the upper face 22u of the barrier metal material 6a and Cu 7a formed in the portions exposed through the openings 201 is also oriented nearly parallel to the substrate while the side faces 21s are oriented at a slant to the substrate.

Figure 8B:
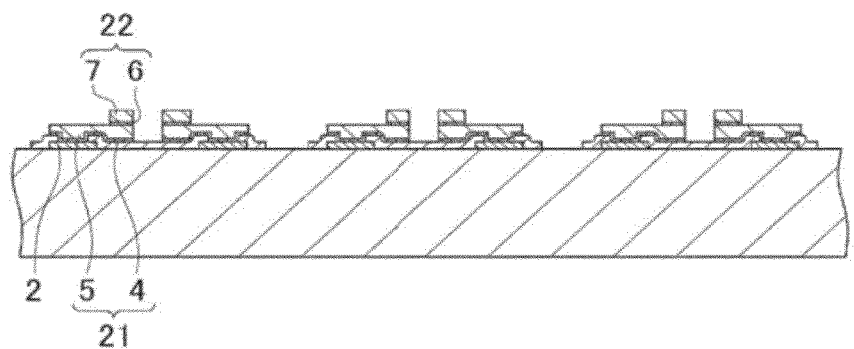

Then, as shown in FIG. 8B, if the metal mask 200 is stripped from the substrate 1 (lift-off step), a second wiring layer 22 comprised of a barrier metal wiring line 6 and a copper wiring line 7 is formed without resorting to the use of a photolithographic process.

Figure 8C:
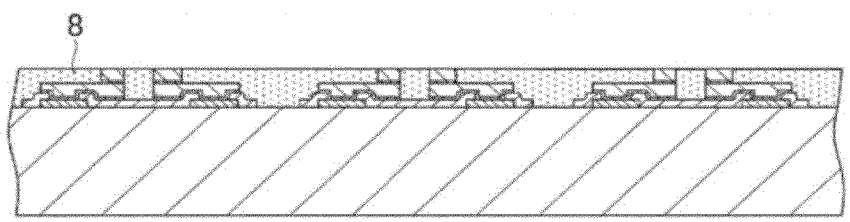

Next, as shown in FIG. 8C, a flowable insulating material is selectively provided to the surface of the substrate 1, with the exception of the portion on which the solder ball 9 is to be formed, and solidified by curing (protective insulating film formation step). It is preferable to use screen printing for the selective provision of the insulating material. When the insulating material is selectively provided, the entire surface of the wiring layer 21 and the side faces 22s of the wiring layer 22 are covered by the protective insulating film 8. Prior to the provision of the insulating material, the wiring layer 22 extends from the substrate the most. As a result, if the insulating material is selectively supplied so as to avoid the wiring layer 22, the insulating material is stopped by the side faces of the wiring layer 22 and the entire upper face of the wiring layer 22 is not covered by the insulating material. However, the upper face of wiring layer 22 is not supposed to be completely free of the insulating material and, as shown in the enlarged view of FIG. 5, the flange portion 22a of the wiring layer 22 is covered under the action of surface tension. The effects obtained with this structure are as already explained.

Figure 12:
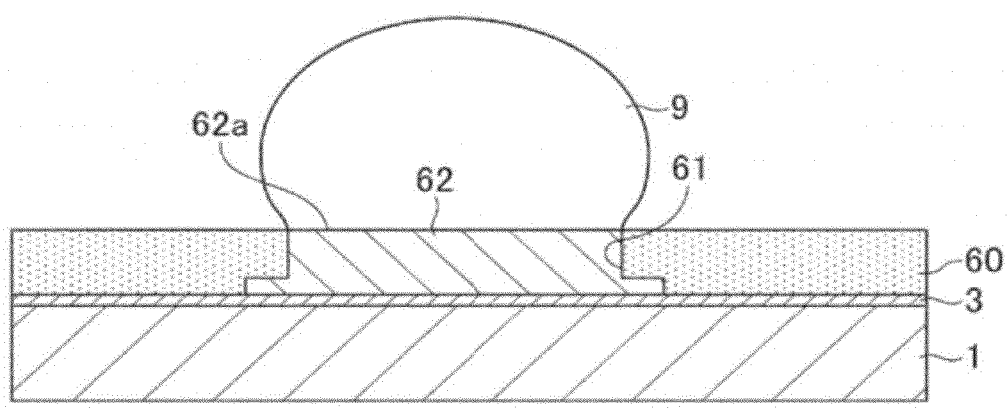
FIG. 12 shows a related art diagram used to illustrate the shape of a wiring layer 22 formed using an additive process.

By contrast, as shown in FIG. 12, when using a plating process (an additive process), i.e. the method commonly used for forming wiring layers in WLP, a wiring layer 62 serving as a post electrode is selectively formed inside an opening 61 in photoresist 60 patterned using a photolithographic process. In this case, the wiring layer 62 is formed after the protective insulating film 60 and, as a result, the flange portion 62a of the wiring layer 62 is not covered by the protective insulating film 60.

Figure 13:
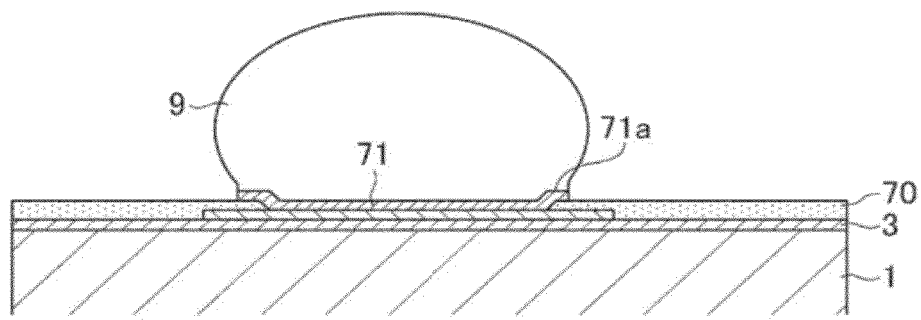
FIG. 13 shows a related art diagram used to illustrate the shape of a wiring layer 22 formed using a subtractive process.

In addition, as shown in FIG. 13, when using a subtractive process, a metal conductor formed over the entire surface of the protective insulating film 70 is subjected to patterning. In this case, the wiring layer 71 is also formed after the protective insulating film 70 and, as a result, the flange portion 71a of the wiring layer 71 is not covered by the protective insulating film 70.

Thus, when a photolithographic process is used, the flange portions 62a, 71a of the wiring layers 61, 71 are not covered by the protective insulating films 60, 70, which makes it impossible to obtain the above-described effects.

Turning now to the features of the present application, if solder is provided to the exposed portions of the wiring layer and melted, solder balls 9 are formed as shown in FIG. 1 (electrode forming step). The above completes a series of consecutive WLP steps. After that, dicing the substrate 1 along the scribe lines allows for it to be singulated into individual semiconductor chips (cutting step). It should be noted that the substrate 1 may be diced after forming the protective insulating film 8 and before forming the solder balls 9.

As explained above, in accordance with the method of manufacturing the silicon wafer 10 according to this embodiment, ion printing is used twice to form the wiring layers 21, 22 directly, without resorting to the use of photolithography steps (a series of consecutive steps including the application of resist coating, exposure, development, and resist stripping). Accordingly, the number of steps is reduced to ⅓-¼ of the number required when using common conventional methods. Furthermore, along with permitting expensive mass production of the metal mask 100, this allows for the cleaned metal mask and etched metallic material to be recycled and used again if the deposited metal is removed by etching. In the experience of the present inventors, no quality degradation in the formed wiring layers 21, 22 has been noted even after reusing them about 5 times. This makes it possible to provide a silicon wafer 10 that offers both high productivity and low cost.

It should be noted that the copper wiring lines 5, 7 contained in the wiring layers 21, 22 are a source of stress due to their considerable film thickness (respectively 5 μm and 10 μm in the above-described examples). However, as described above, the edges of the wiring layers 21, 22 make an acute angle theta of 55° (55 degree) or less, which alleviates stress in the edge portions. In order to further alleviate the stress, it is desirable to exercise control over film-forming conditions so as to reduce strain by lowering the temperature of the substrate 1 during ion plating and bringing the deposited atoms into a low energy state.

More specifically, it is desirable to set the deposited atom energy during ion plating to a value in the range of 5 eV to 100 eV. This is due to the fact that interfacial fractures occur when the deposited atom energy becomes too high. By contrast, setting the deposited atom energy to a value in the above-described range activates secondary migration, as a result of which the deposited metal forms an aggregate of columnar-shaped crystals extending in the growth direction.

Figure 14:
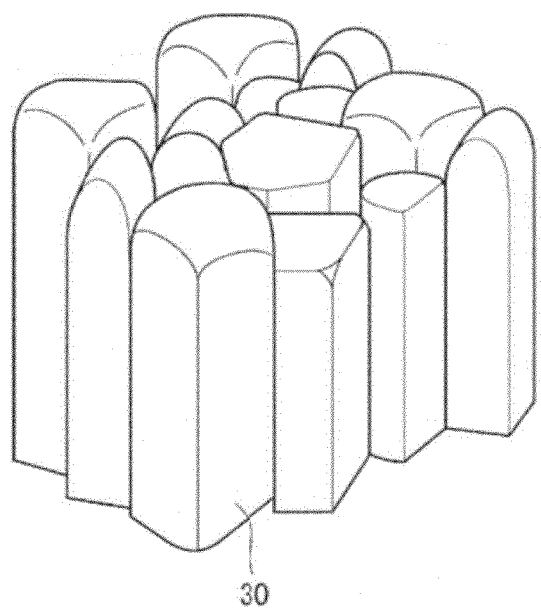
FIG. 14 shows a diagram illustrating a Cu cross-section formed using an ion plating process.

FIG. 14 is a diagram illustrating the cross section of the Cu formed by ion plating.

As shown in FIG. 14, when Cu is formed using an ion plating process, the Cu forms an aggregate of columnar grains 30 extending in the growth direction. Typically, the columnar grains 30 are crystals of the metallic material (Cu) constituting the wiring layer and, in this case, the boundary portion between two adjacent grains 30 is the interface between the crystals. In addition, at least some of these columnar grains 30 may have crystal orientations different from one another. The direction of growth of the columnar grains 30 is a direction different from the direction of the surface of the substrate 1 and is typically substantially perpendicular to the surface of the substrate. Consequently, the wiring layers 21, 22 formed using an ion plating process are typically comprised of an aggregate of columnar crystals extending substantially perpendicularly to the surface of the substrate 1. Accordingly, finely divided grains are formed in the planar direction, thereby ensuring a reduction in deposition strain and producing high bond strength at the interfaces.

FIGS. 15A to 15F are diagrams used to illustrate the mechanism of growth of an aggregate of columnar grains 30.

Figure 15A:
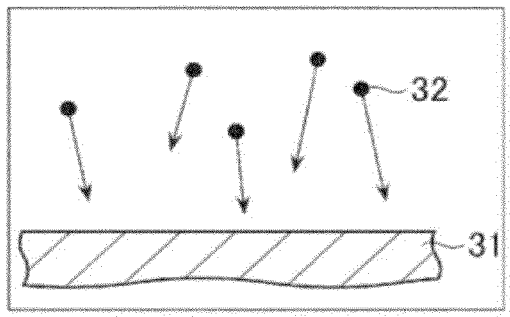
FIGS. 15A to 15F show a diagram used to illustrate the mechanism of growth of an aggregate of columnar grains 30.
Figure 15D:
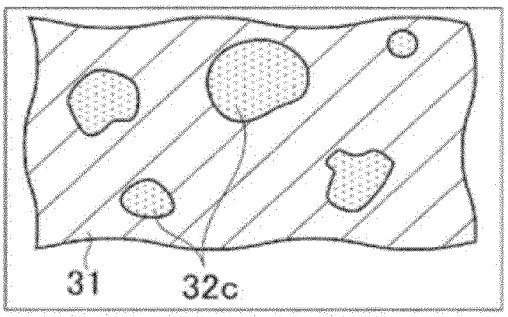
Figure 15B:
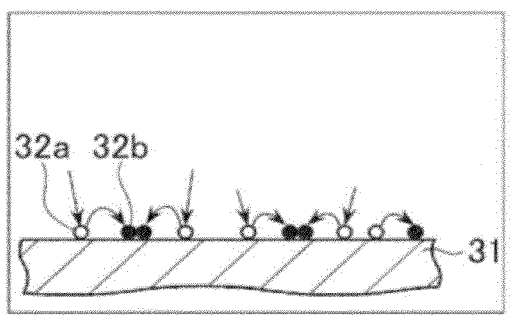
Figure 15E:
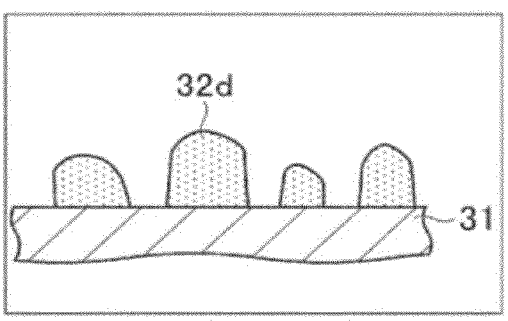
Figure 15C:
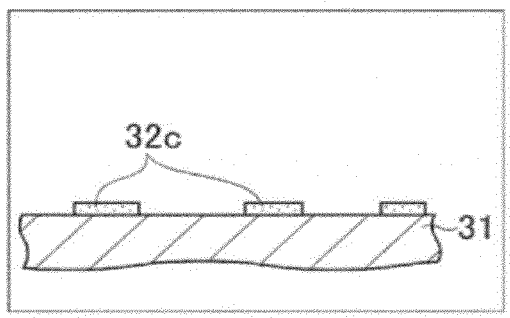
Figure 15F:
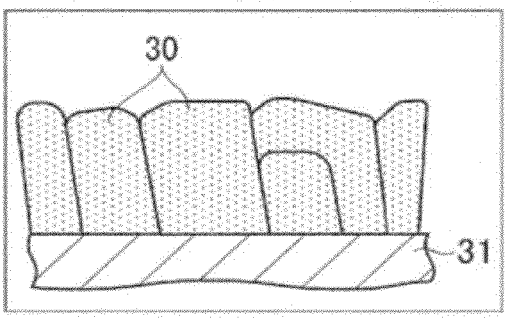

At first, species 32 ionized in a vacuum move towards a substrate 31 under the action of Coulomb's forces and adhere to the substrate 31 (FIG. 15A). During secondary migration, the species 32a adhered to the substrate 31 move across the surface of the substrate 31 and clusters of species 32b displaced as a result coalesce together (FIG. 15B). As this is repeated, nuclei 32c of the species are formed on the surface of the substrate 31 (FIG. 15C). FIG. 15D is a diagram of the nuclei 32c of the species viewed in the planar direction. As ion plating progresses, the nuclei 32c grow in the planar direction and height direction, thereby producing insular grains 32d (FIG. 15E). As ion plating progresses, the insular grains 32d undergo further growth and, once the surface of the substrate 31 becomes seamlessly covered by the insular grains 32d, the growth proceeds in the height direction, producing columnar grains 30 (FIG. 15F). Because the aggregate of columnar grains 30 grows based on such a mechanism, the height of the columnar grains 30 in the locations where the insular grains 32d were formed earlier becomes taller and the height of the columnar grains 30 in other locations becomes somewhat smaller. Accordingly, there is a slight variation in the respective height of the columnar grains 30 above the substrate 31, as a result of which fine surface irregularities appear on the surface of the wiring layers 21, 22.

Although commercially available ion plating equipment can be used as the ion plating apparatus, controlling the energy of the deposited metal ions allows for film-forming conditions to be obtained that are unlikely to produce strain while at the same time ensuring adhesion. The ion source effects evaporation using an electron beam process, thereby causing evaporated metal atoms to flow into an Ar plasma generated in a high-frequency coil and ionizing them. The ionized metal atoms are attracted by Coulomb's forces and deposited on a wafer disposed on the negative electrode.

The deposition energy affects the voltage and mean free path of the ions. If the effective ion surface area is designated as sigma2, then the mean free path lambda [m] is determined by the Ar gas temperature T [K] and gas pressure P [Pa] and can be represented by the following equation.

$$\lambda = 3.11 \times 10^{-24} T/P\sigma^2 [m] \qquad (1)$$

In addition, if the ion mass is designated as m [g], then the accelerated velocity v can be represented by the following equation.

$$v = \sqrt{(qE/m)\lambda} [m/s] \qquad (2)$$

Therefore, the ion acceleration energy U can be represented by the following equation.

$$U = (1/2)mv^2 \qquad (3)$$

Naturally, since the mean free path lambda is Boltzmann-distributed, the spread varies between 0 and 1000 times or more. However, the nature of the deposited layer varies depending on the mean free path.

Figure 59:
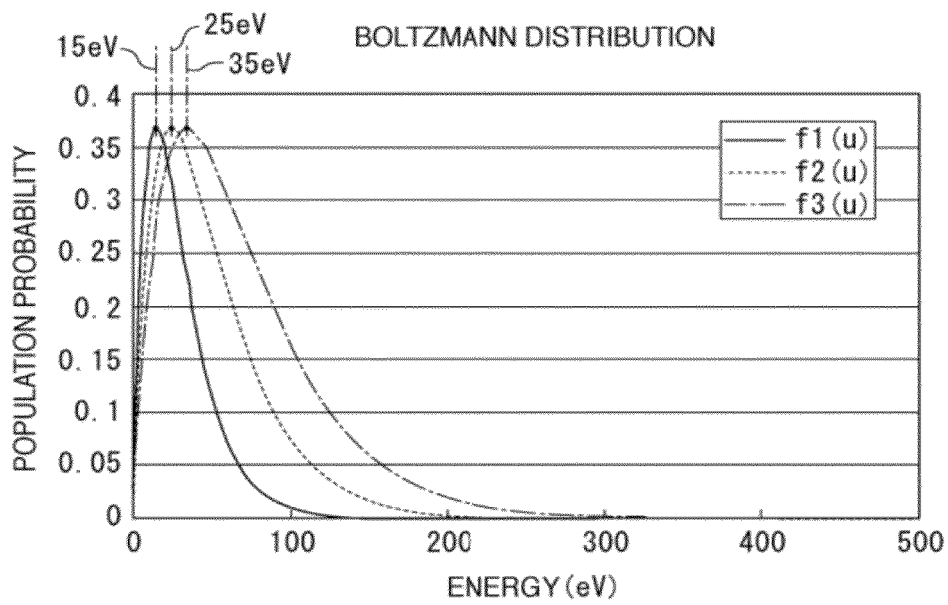
FIG. 59 shows a graph illustrating the energy distribution of the metal ions deposited during ion plating in this embodiment.
Figure 60:
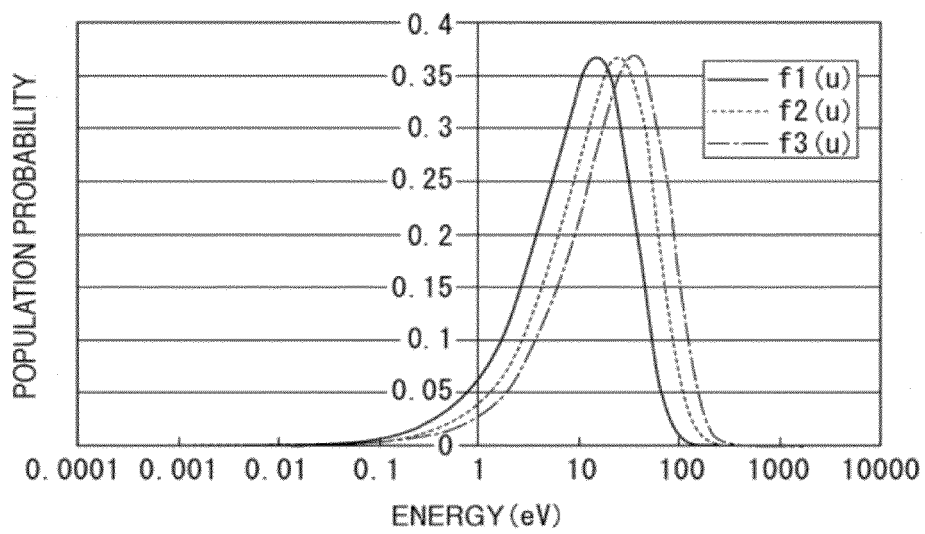
FIG. 60 shows a graph providing a logarithmic representation of FIG. 59.

As is apparent from the equation above, the ion acceleration energy U is of the same order as the mean free path lambda and is Boltzmann-distributed. FIG. 59 is a graph illustrating the energy distribution of the metal ions deposited during ion plating in this embodiment. FIG. 60 is a graph providing a logarithmic representation of FIG. 59. Referring now to FIG. 60, which provides a clear illustration of the energy distribution, the ion plating of the present embodiment imparts a deposition energy of 0.01 eV to 250 eV, with its principal portion being at 25±10 eV.

As used herein, the term "principal portion" refers to the peak of the Boltzmann-distributed deposition energy. As shown in FIG. 59, in the present embodiment, the peak of the deposition energy is 25±10 eV, in other words, in the range of from 15 eV to 35 eV. FIG. 59 illustrates three energy distributions f1(u), f2(u), and f3(u), whose respective peaks are at 15 eV, 25 eV, and 35 eV.

The reason why the deposition energy range (upper and lower bounds) centered on the peak was set to 0.01 eV to 250 eV is described below. Per se, Boltzmann-distributed deposition energy does not have an upper or lower bound. However, as a matter of general principle, rarely used energy values with a population probability of 5% (value: 0.05) or less shown along the vertical axis of FIG. 60 were discarded in order to differentiate the deposition energy of this embodiment from that of ordinary ion plating. Doing so produces an energy range of 0.8-250 eV. In the present embodiment, however, the lower bound was set to a smaller value and the deposition energy range was set to 0.01-250 eV. This is due to the fact that molecules and atoms with low deposition energies readily collide while in flight, resulting in energy reduction.

Figure 61:
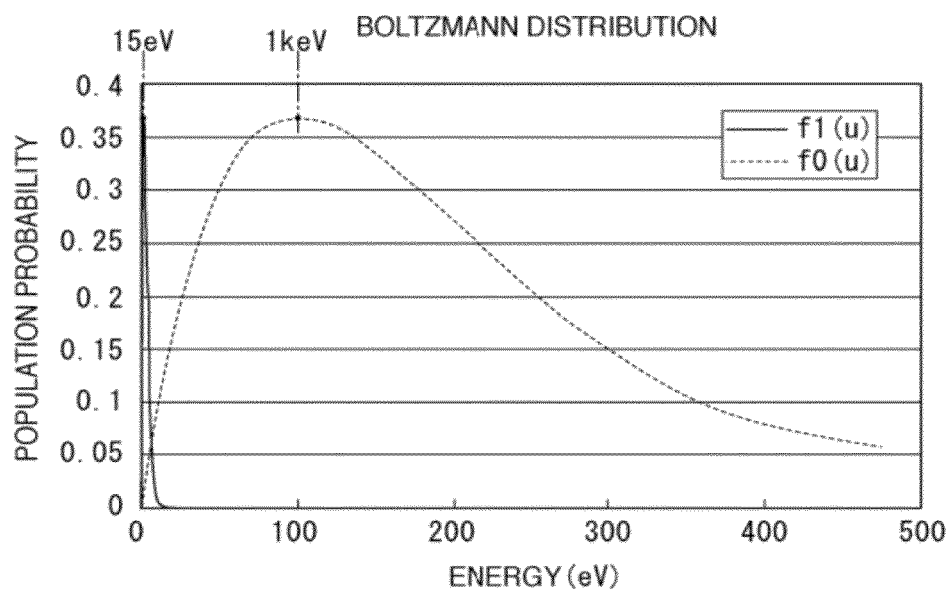
FIG. 61 shows a graph providing a comparison between deposition energy distributions during ordinary ion plating and ion plating used in this embodiment.
Figure 62:
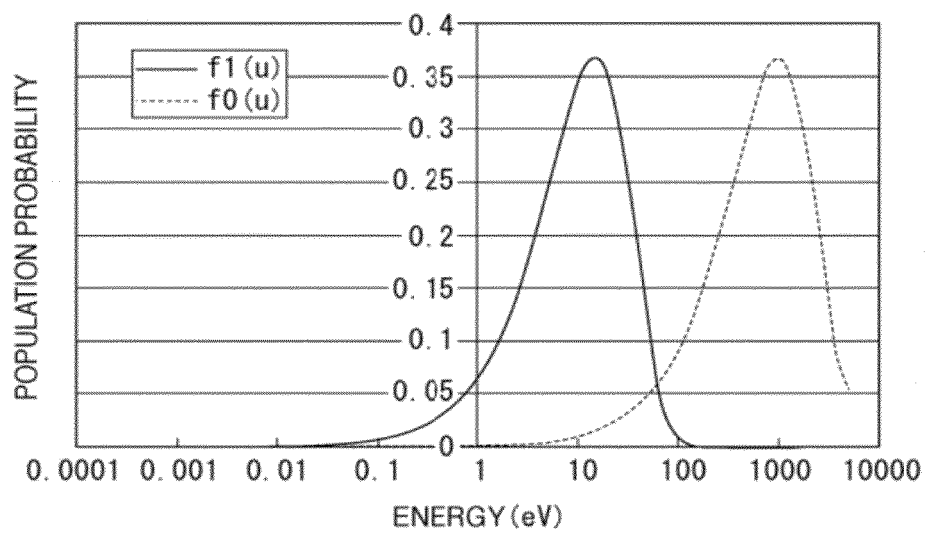
FIG. 62 shows a graph providing a logarithmic representation of FIG. 61.

FIG. 61 is a graph providing a comparison between the deposition energy distributions of ordinary ion plating and the ion plating used in this embodiment. FIG. 62 is a graph providing a logarithmic representation of FIG. 61. The ion plating process of this embodiment is characterized in that the peak of its deposition energy (the 15 eV peak of the representative energy distribution f1(u) illustrated in FIG. 62) is considerably lower than the peak of the deposition energy of ordinary ion plating (the 1 KeV peak of the energy distribution f0(u) of FIG. 62), i.e. there is a difference of two orders of magnitude.

While there is a clear difference between the peaks, due to the fact that these are Boltzmann-distributions which, as already mentioned, have no upper or lower bounds, the deposition energy distribution curves of ion plating used in this embodiment and ordinary ion plating overlap in the tail portion (the portion below 0.05=5%), which is rarely used. Accordingly, in case of ordinary ion plating, as a matter of general principle, we discard energy values with population probabilities of 5% or less in the same manner as in this embodiment. As a result, the deposition energy range of 0.01 to 250 eV of this embodiment does not overlap with the deposition energy range of ordinary ion plating. Consequently, the two can be clearly differentiated.

It should be noted that, as already mentioned, it is desirable to further limit the energy range of the deposited atoms during ion plating and set the above-described range of 0.01-250 eV to a range of 5-100 eV.

The structure illustrated in FIG. 5 and FIG. 6, in which the angles of the edge portions 21e and 22e of the wiring layers 21 and 22 do not exceed 55° (55 degree), as well as the structure illustrated in FIG. 14, in which Cu forms an aggregate of columnar grains 30, are structures specific to this embodiment. In other words, wiring layers of such structure are obtained by using a metal mask of a certain thickness and conducting ion plating at deposition energies of 0.01 eV to 250 eV, with the principal portion located at 25±10 eV.

Figure 16:
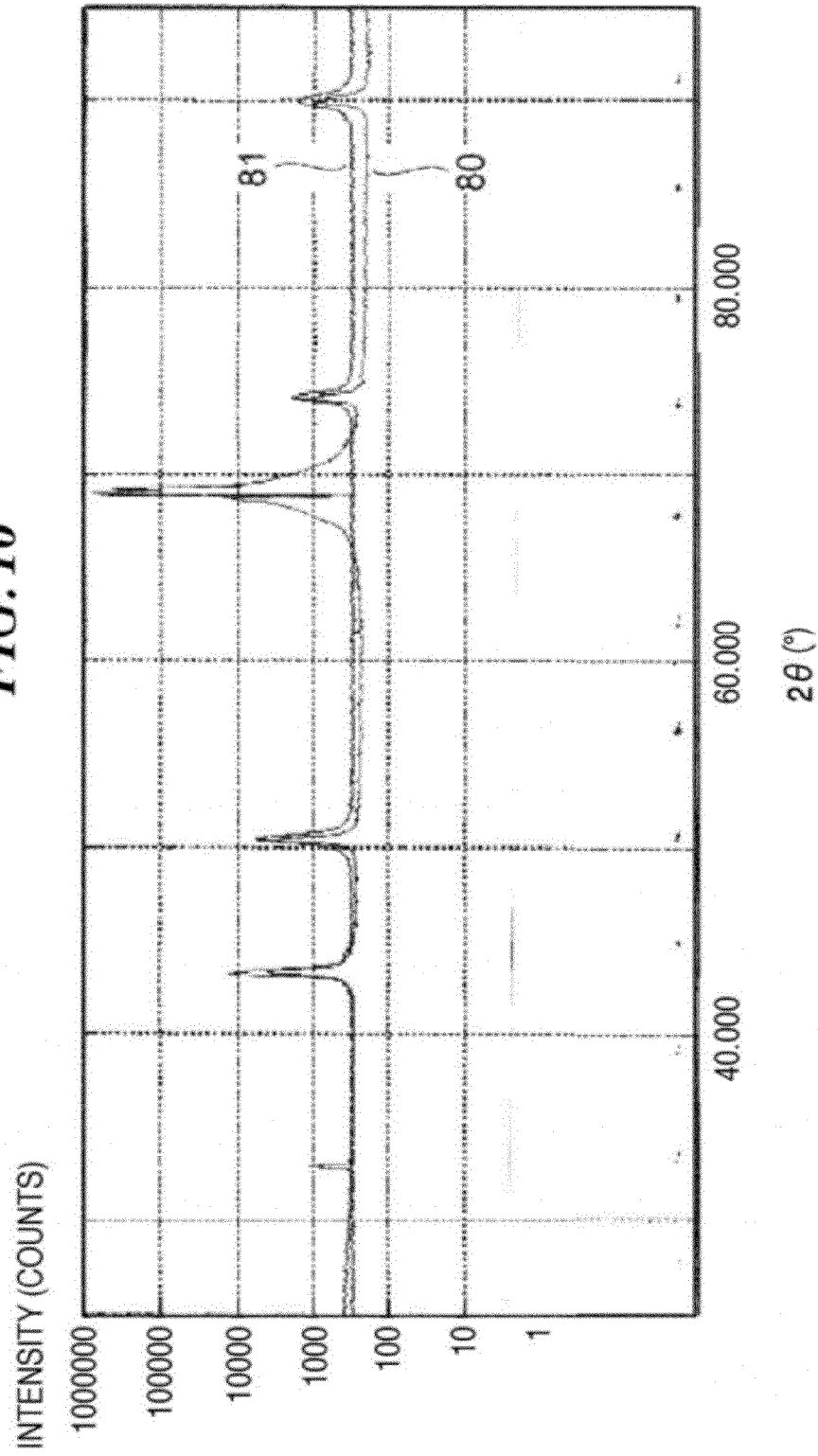
FIG. 16 shows a graph illustrating the results of X-ray diffraction measurements made on a Cu film formed using an ion plating process.

If the average energy value of Cu2+ ion particles in a Boltzmann distribution is 15.5 eV, the distribution is generally within 200 eV (with 0.01% or less discarded). Although this value is about 5 to 10 times higher than the atomic bond energy and provides the energy for post-depositional rearrangement, it is not a value sufficient to perturb the as-deposited state, as a result of which no stress is generated in the deposited film under these conditions. Measurement results, in which an X-ray diffraction peak obtained for a Cu film deposited under these conditions is compared with rolled copper foil, are illustrated in FIG. 16. FIG. 16 compares a Cu film 80 deposited under the above-mentioned case with a standard Cu plate 81. The maximum peak (2theta=69° (69 degree)) and 2theta=33° (33 degree) peak are peaks representing SUS because of being adhered to an SUS plate and thus have to be excluded from consideration. While the reference Cu plate 81 exhibits higher intensity on the whole, the presence of matching peak values in the same locations confirms that the resultant Cu crystals are free of strain.

As should be apparent from the foregoing description, thick Cu wiring lines with a low level of strain can be formed without resorting to the use of a photolithographic process.

FIGS. 63A to 63D show experimental results illustrating the relationship between the deposition energy of the deposited metal (Cu) during ion plating and the structure of the deposited Cu crystals. The same drawing provides cross-sections obtained by cutting crystals with an FIB (Focused Ion Beam). The bias voltage and Cu ion energy are varied in four different ways. In FIG. 63A, the values are 10V for bias and 1.825 eV+α for Cu ion energy (Condition 1); in FIG. 63B, 55V for bias and 10.038 eV+α for Cu ion energy (Condition 2); in FIG. 63C, 200V for bias and 36.503 eV+α for Cu ion energy (Condition 3); and in FIG. 63D, 300V for bias and 54.754 eV+α (Condition 4) for Cu ion energy. The notation "+α" added to the respective deposition energies reflects the fact that the kinetic energy (1-5 eV) of ion beam heating applied to the raw material substrate should be added to these deposition energy values.

Condition 1-Condition 4 are all within the deposition energy range recommended in the present invention, i.e. from 0.01 eV to 250 eV. Consequently, most of the Cu forms columnar crystals, producing excellent results after the secondary migration depicted in FIGS. 15A to 15F. The differences between the different modes of growth of the columnar crystals under Conditions 1-4 are discussed below.

As can be seen, among the four conditions, the finest, neatest columnar crystals are produced over the entire surface under Condition 2 illustrated in FIG. 63B, i.e. at a deposition energy of 10.038 eV+α=11-15 eV. The deposition energy obtained under Condition 2 is the closest value to 25±10 eV, which is particularly recommended in the present invention as the principal portion of the above-described range of 0.01 eV to 250 eV.

Under Condition 1, which is illustrated in FIG. 63A, i.e. at a low deposition energy of 1.825 eV+α=2.8-6.8 eV, there are regions of coarse crystals, as shown in region A1. This is believed to be due to insufficient secondary migration described in FIGS. 15A to 15F and to the fact that columnar crystals growing in an unstable manner are subject to corrosion by the columnar crystals growing nearby. Consequently, they are not columnar-shaped and spread sidewise, producing the above-mentioned coarse crystals. In addition, as can be seen in the three other regions A2, A3 and A4, such corrosion occurs even mid-way through columnar crystals. When the energy is set lower than in the case of Condition 1, such coarsening becomes conspicuous, and if the energy is set even lower, the crystals become nearly amorphous.

Under Condition 3, which is illustrated in FIG. 63C, i.e. at a high deposition energy of 36.503 eV+α=37-41 eV, there is a tendency to produce fine columnar crystals at the start of deposition (layer underneath Line L1). However, above and around the middle of line L1, disorder in already formed crystals occurs during inter-species collisions and the continuity of the columnar crystals tends to be impeded by secondary and tertiary migration, with the crystals growing and becoming gradually coarser.

Under Condition 4, which is illustrated in FIG. 63D, i.e. at an even higher deposition energy of 54.754 eV+α=55-60 eV, the same coarsened growth manifests itself in the layer above the line L2 as in the case of Condition 3, and, at the same time, there is a lack of continuity in the columnar crystals along with an increase in disorder. The reason for this can be determined based on the fact that there are many locations of branching due to disorder in the previously formed crystals. Furthermore, while this is not reflected in the results of the present experiments, it is surmised that if the deposition energy is set to a level of 100 eV, the resultant crystals are not likely to be columnar-shaped and granular crystals may be generated.

To sum up the comparison between Conditions 1-4 above, starting from the most ideal case of columnar crystal growth, the quality of growth can be ranked in the following order: Condition 2>Condition 3>Condition 1>Condition 4. Generally speaking, the most excellent columnar crystals are produced starting from ion plating performed at values that are closest to the deposition energy of 25±10 eV, which is particularly recommended in the present invention.

Also, it is believed that if testing is performed across a broader range, i.e. at deposition energies lower than those of Condition 1 and energies higher than those of Condition 4, then the differences in the growth of crystals will become more apparent.

In the case of ultrafine columnar crystals (about 50 nm in diameter) with atomic arrays of about 500-800 atoms, there are numerous grain boundaries, which reduces deposition strain in view of the magnitude of grain boundary displacement potential such that stable layers with low levels of residual stress are formed even if the thickness of the deposited layers is increased.

The deposited metal formed by ion plating is deposited at energies that are several times higher than the regular metal bond energy, which results in high interfacial bond strength and low strain. Accordingly, these are the best film-forming conditions for columnar crystals.

FIGS. 64A to 64C provides experimental results illustrating the cross-sectional shape of the wiring layer 21 depicted in FIG. 5 and FIG. 6. FIG. 64A illustrates the crystalline structure of the deposited wiring layer 21. FIG. 64B is a diagram that schematically illustrates the relative positions of the wiring layer 21 and the metal mask 100 during the deposition of the wiring layer 21. FIG. 64C, which is provided for comparison with FIG. 64A, is a diagram illustrating experimental results obtained when the wiring layer 42 is formed using the plating process shown in FIG. 10. In FIG. 64A, a wiring layer (Cu) is deposited by ion plating with the help of a metal mask and the deposition energy is 18.25 eV (bias: 100V).

In FIG. 64A, the energy is low due to the effects produced by the metal mask 100, whose relative position is schematically illustrated in FIG. 64B. Despite the presence of region A5, where the columnar crystals are less than perfect, a wiring layer 21 is formed, in which the edge portion has an angle of 55° (55 degree) or less.

On the other hand; when the wiring layer was formed using the plating process illustrated in FIG. 64C as a comparative example, due to its shape, the edge portion A6 was oriented at nearly 90° (90 degree) relative to the substrate 1, as a result of which the stress of edge portion A6 it was not alleviated, the adhesion between the wiring layer 42 and the protective insulating film could not be improved, and the reliability of the package could not be enhanced.

In accordance with at least one embodiment, the photolithography step is made redundant due to the fact that the wiring layer is formed directly on the substrate using a combination of an ion plating process employing a metal mask and a lift-off process (ion printing). Furthermore, it is possible to greatly reduce WLP production costs by using bonding wires to effect connections between the wiring layer (redistribution wiring lines) and the internal terminal electrode of the chips laminated on the circuit substrate or wiring lines on the insulating substrate, on which the circuit substrate is mounted.

In accordance with at least one embodiment, the angle of the edge portion of the wiring layer formed by ion printing is 55° (55 degree) or less, which alleviates stress in the edge portion and improves adhesion between the wiring layer and the protective insulating film, thereby increasing the reliability of the package. Furthermore, the wiring layer is comprised of an aggregate of columnar crystals, which reduces deposition strain and increases adhesion between the substrate and the wiring layer.

In accordance with at least one embodiment, there are provided a WLP semiconductor circuit and a method of manufacturing the same, in which photolithography is completely eliminated from the WLP manufacturing step and the number of process steps is reduced to no more than ½ of the prior-art number in order to ensure lower prices and a metal deposition process eliminating stress in the deposition metal is adopted with a view to improve reliability.

In accordance with at least one embodiment, it becomes possible to provide a highly reliable circuit substrate at low cost.

While a preferred embodiment of the inventive circuit substrate has been described above, the present invention, without being limited to the above-described embodiment, permits various modifications that do not depart from the gist of the present invention. As will be readily appreciated, these modifications also fall within the scope of the invention.

Figure 17:
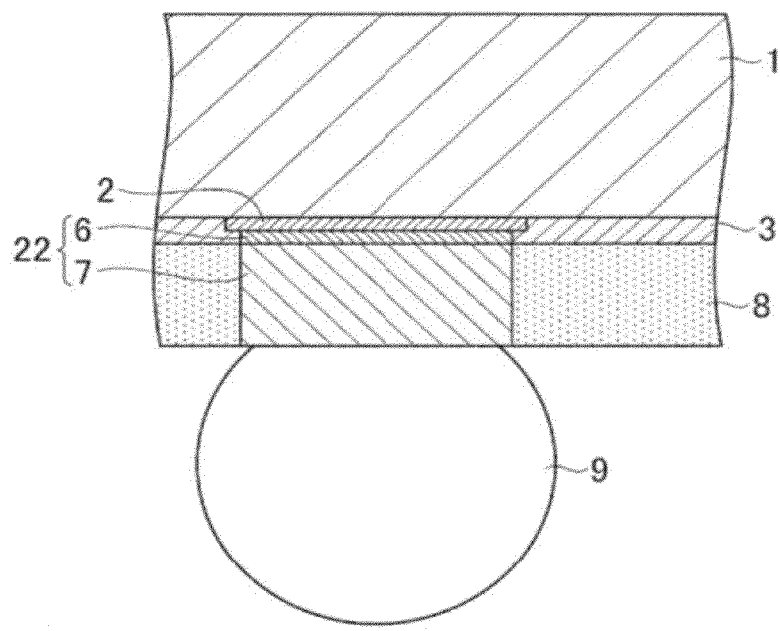
FIG. 17 shows a diagram illustrating a variation of the present invention.
Figure 18:
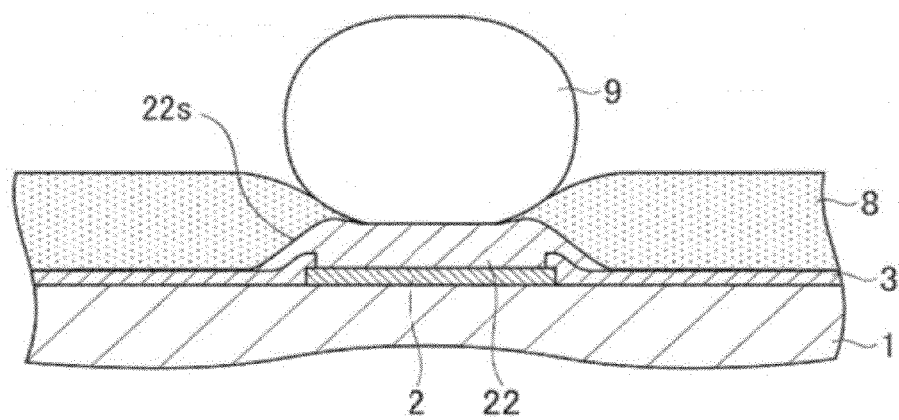
FIG. 18 shows another diagram illustrating a variation of the present invention.

For example, in the present invention, providing the two wiring layers 21, 22 on the substrate is not mandatory and, as shown in the schematic diagram of FIG. 17, the wiring layer 22 may be formed directly on top of the chip pick-up electrode 2. In other words, the wiring layer 21 equipped with a redistribution wiring portion can be omitted. Such a structure is suitable in cases, wherein the electrode pitch of the chip pick-up electrodes 2 is sufficiently wide and there is no need for redistribution. In this case, as shown in FIG. 18, the side faces 22s of the wiring layer 22 are slanted (at 55° (55 degree) or less) and the flange portion 22a located along the outer periphery on the upper face 22u of the wiring layer 22 is covered by the protective insulating film 8.

In addition, while in the above-described embodiment the wiring layers 21, 22 were designed as double-layer structures made up of a barrier metal wiring line and a copper wiring line, the present invention is not limited thereto. Accordingly, the barrier metal wiring line may be omitted and a wiring line consisting essentially of other metallic materials can be used instead of the copper wiring line, in which copper is used as the main ingredient. Al, Ti, Cr, and Ni can be suggested as the main ingredients of other preferred metallic materials (main metals) other than Cu. The main ingredient preferably constitutes 50 percent or more. The secondary components of the other materials (secondary metals) constitute 10 percent or less. In particular, while Al is a metallic material that does not lend itself to the plating techniques employed in ordinary WLP, deposition is possible regardless of the type of metal if an ion plating process is used. In addition, when an Al wiring line is used instead of a copper wiring line, the barrier metal wiring line is unnecessary because the high activity of Al itself. The metallic character of Al is such that it readily undergoes plastic deformation and allows for stress to be readily alleviated, which has the advantage of avoiding stress even when deposited in a thick layer. Furthermore, a wiring line containing a multi-constituent alloy comprising multiple metallic materials may be used instead of the copper wiring line. While certain types of multi-constituent alloys are difficult to form using plating techniques, the ion plating process allows for metals of any type to be combined at any given ratio. Using an ion plating process with multi-constituent alloys can further reduce production costs.

In addition, while in the above-described embodiment multiple wiring layers including barrier metal wiring lines (first metallic conductors) and copper wiring lines (second metallic conductors) are formed in a continuous manner (in a series of successive steps comprising a single masking step, multiple successive film-forming steps, and a single lift-off step corresponding to the single masking step) using the same metal mask, the present invention is not limited thereto. Thus, after forming barrier metal wiring lines using a metal mask, the metal mask may stripped and copper wiring lines may be formed using another metal mask.

Furthermore, the object of the present invention is not limited to silicon wafers and the invention can be applied to various circuit substrates.

Furthermore, the circuit substrate claimed in this application is not limited to silicon wafers and can be an electronic device, i.e. a final product produced by encapsulating silicon wafers and semiconductor chips (a semiconductor device, in which a single semiconductor chip or multiple semiconductor chips are encapsulated by molding and the like; a card containing a single or multiple semiconductor devices; a card containing a single or multiple semiconductor chips; a motherboard operating as a system contained in electronic devices such as computers, mobile communication devices, and the like). In such a case, the external terminal electrodes of the circuit substrate serve as the external terminal electrodes of the final product. This does not in any way contradict the embodiment as disclosed so far (masking, during which a metal mask is placed, without resorting to the use of photolithography steps, over a substrate manufactured using photolithography steps; film deposition, during which an ion plating process is used to form metallic conductors; lift-off, during which the metal mask is stripped away; and electrode formation, during which the external terminal electrodes are formed).

It will be noted that the embodiment, as disclosed so far, does not rule out laying bonding wires during the back-end-of-line steps and does not contain any restrictions on the inclusion of bonding wires in the circuit substrate or the final product. Manufacturing the wiring layers 21, 22 from Al metal is advantageous for installing bonding wires. This is due to advantages such as rendering the barrier metal wiring line unnecessary and being free from stress even when deposited in thick layers (it readily undergoes plastic deformation and allows for stress to be readily eliminated). Accordingly, bonding wires or TAB (tape automated bonding) may be included among the external terminal electrodes instead of the solder balls 9 used in the embodiment.

Figure 58:
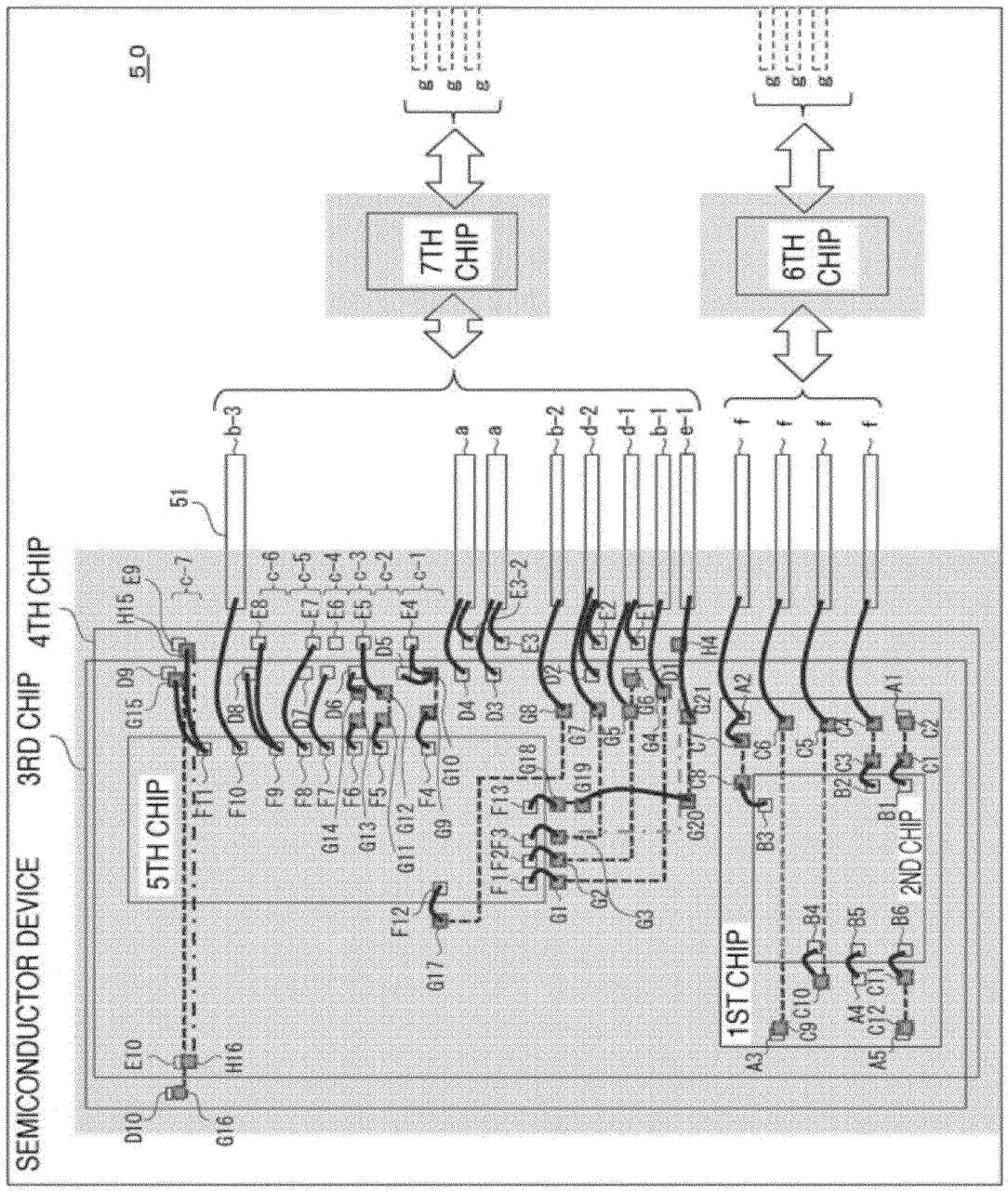
FIG. 58 shows a cross-sectional view illustrating a sixth semiconductor device according to the present invention.

Chapter 2 will be described next. It describes the structure of the first semiconductor device, sixth semiconductor device, and electronic system according to the present embodiment, as well as a method of manufacturing the same. The structure and method of manufacturing the first semiconductor device and electronic system related to this circuit substrate are described with reference to FIGS. 19-12. FIG. 58 depicts the sixth semiconductor device related to the circuit substrate.

Figure 19:
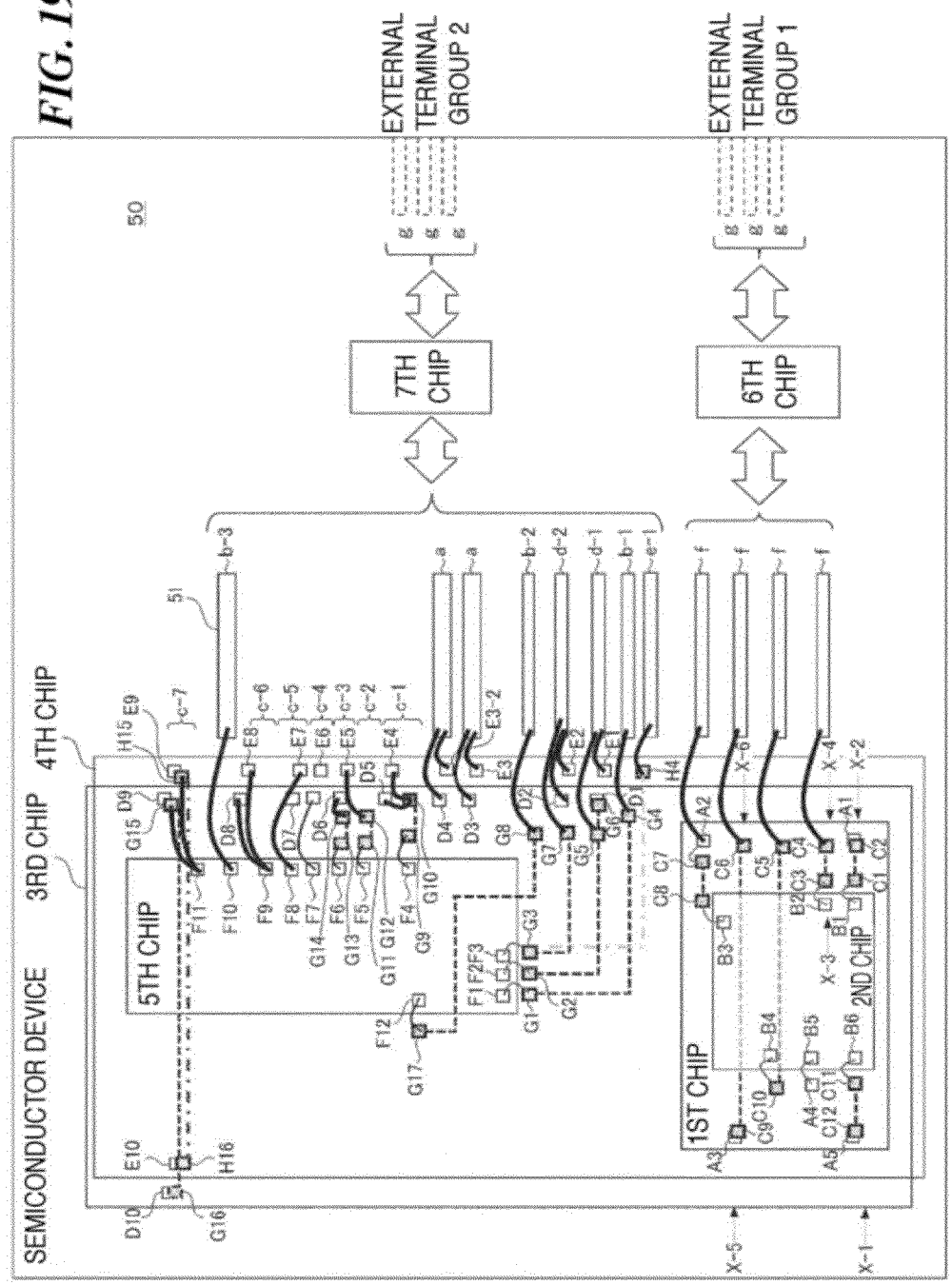
FIG. 19 shows a view from above illustrating an exemplary semiconductor device according to the present invention.

FIG. 19 is a view from above of a schematic structural diagram illustrating the structure of the first semiconductor device (containing multiple chips) according to a preferred embodiment of the present invention. It should be noted that in the description of Chapter 2 the first semiconductor device may be referred to simply as "the semiconductor device".

As shown in FIG. 19, the semiconductor device according to this embodiment has multiple semiconductor chips operating as multiple functional elements (chips 1-7) mounted on an insulating substrate 50 (fourth substrate). The insulating substrate 50 is manufactured using a well-known material and manufacturing process. The insulating substrate contains multiple wiring lines, with each one them having multiple wiring layers 51 (insulating substrate wiring lines) formed therein. The wiring layers 51 are manufactured using a well-known material and manufacturing process. The wiring layers 51 have a thickness of 10-20 μm. The semiconductor device has external terminal groups 1, 2 placed in communication with the exterior. The structure of the external terminal groups is identical to that of the wiring layers 51. The external terminal groups 1, 2 do not have to be formed on the upper face (the surface of the side, on which chips 1-7 are mounted) of the insulating substrate 50 and may be formed on the back surface or side faces of the insulating substrate 50, as well as on the surface of a combination thereof. In FIG. 19, the external terminal groups 1, 2 are indicated by short-dash lines, which means that the external terminal groups 1, 2 are formed on the back surface of the insulating substrate 50. The same applies to FIGS. 32, 33, 35, and 37.

Figure 20:
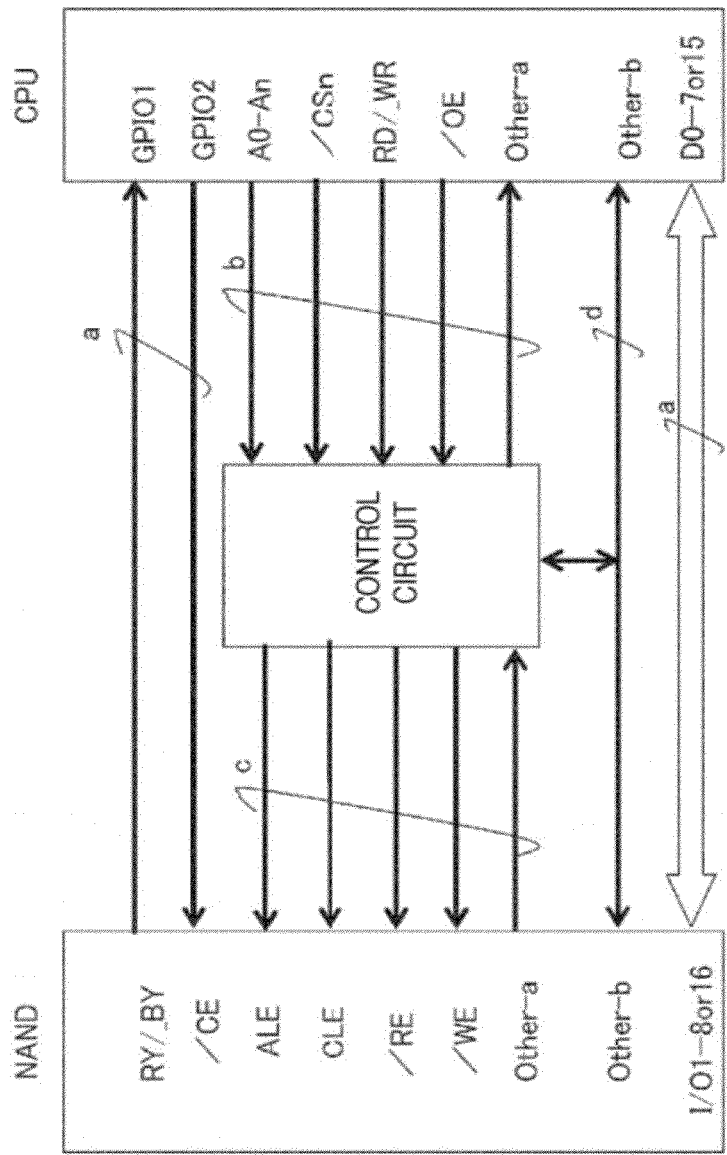
FIG. 20 shows a diagram illustrating an example of interconnections between a CPU, a NAND flash memory, and a controller exercising control over the NAND flash memory contained in the semiconductor device and electronic system according to the present invention.
Figure 21:
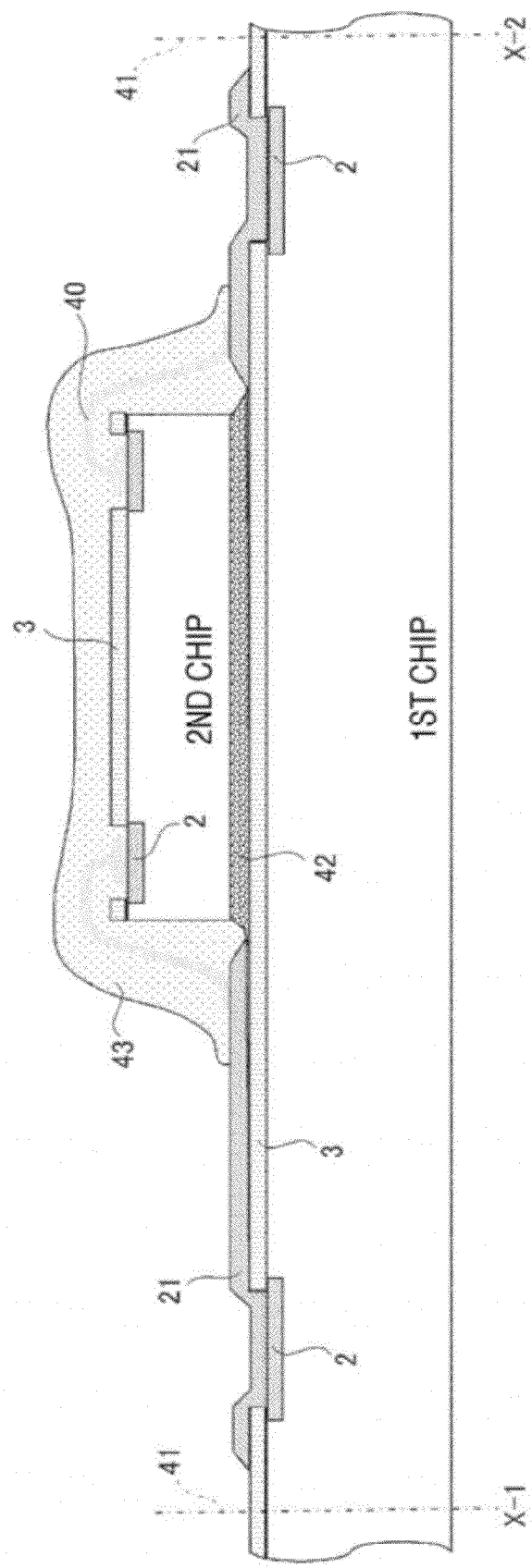
FIG. 21 shows a diagram illustrating a first cross-sectional structure associated with the first and second chips contained in the semiconductor device and electronic system according to the present invention.
Figure 22:
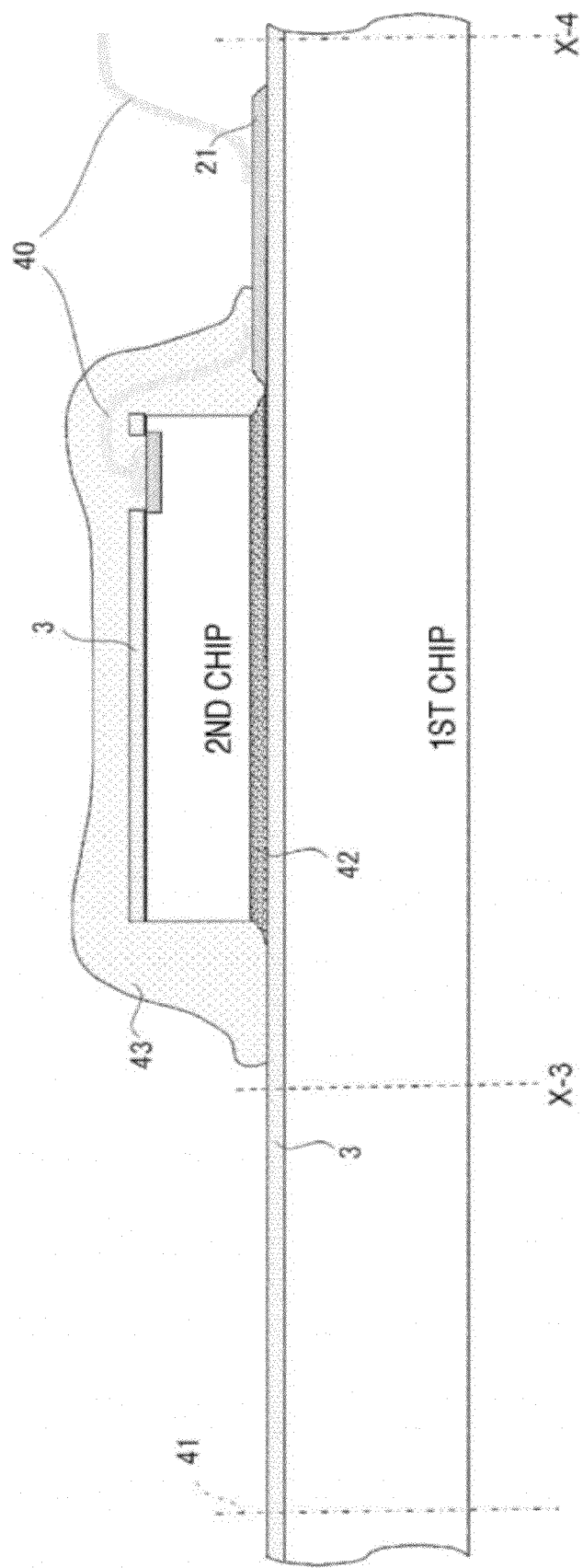
FIG. 22 shows a diagram illustrating a second cross-sectional structure associated with the first and second chips contained in the semiconductor device and electronic system according to the present invention.
Figure 23:
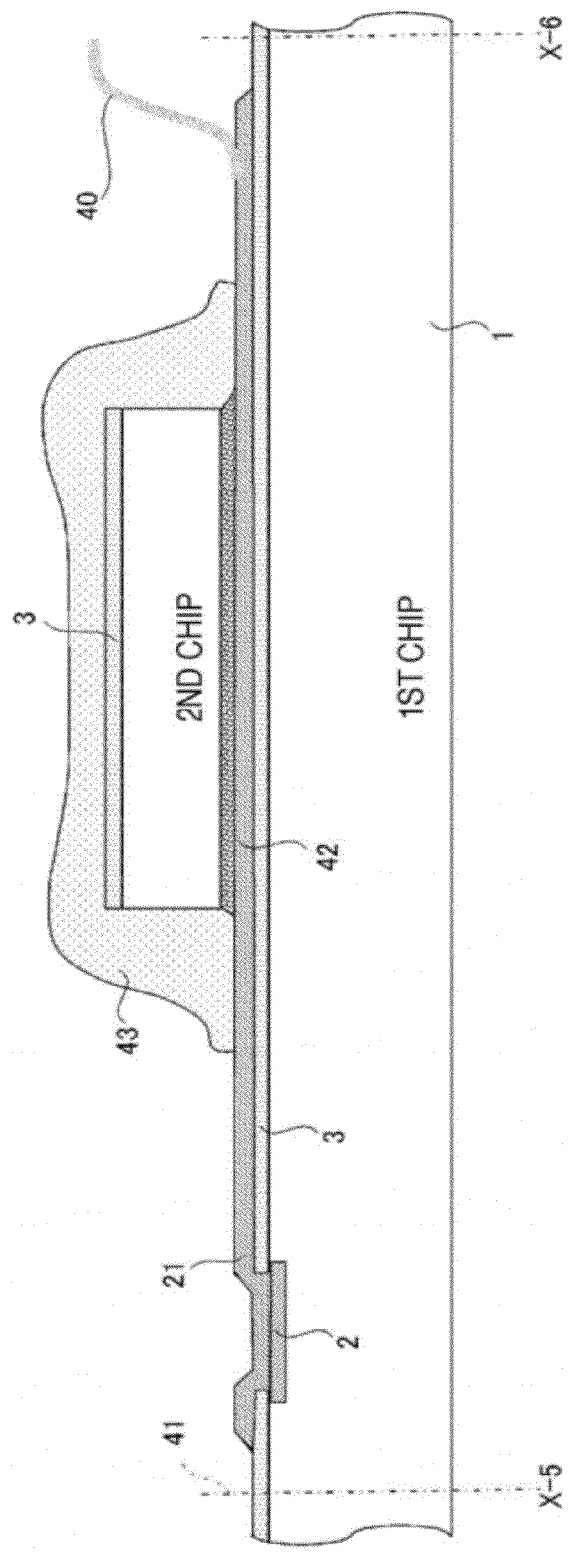
FIG. 23 shows a diagram illustrating a third cross-sectional structure associated with the first and second chips contained in the semiconductor device and electronic system according to the present invention.

The semiconductor device according to this embodiment has a first system comprised of a first, second, and sixth chips, and a second system comprised of a third, fourth, fifth, and seventh chips. The first chip (first substrate) and second chip (second substrate) are laminated. The third, fourth and fifth chips are laminated. The first chip, third chip (first substrate) and fourth chip (fifth substrate) are the above-described circuit substrates. The third chip and the fourth chip are semiconductor chips provided with identical functionality. The sixth chip (third substrate) is respectively in communication with the first and second chips and, through the medium of the external terminal group 1, with the exterior of the semiconductor device. The seventh chip (third substrate) is respectively in communication with chips 3-5 and, through the medium of external terminal group 2, with the exterior of the semiconductor device. The electrical interconnect configuration of the second system, which is comprised of the third, fourth, fifth, and seventh chips, is illustrated in FIG. 20. The electrical interconnect configuration of the first system, which is comprised of the first, second, and sixth chips, is not shown, but is similar to the one illustrated for the second system. Accordingly, this exemplary semiconductor device has two systems.

As shown in FIG. 20, the second system according to this embodiment is an example illustrating a state of connection to a control circuit chip (fifth chip) used for converting command signals from a CPU (processor: seventh chip) into operation signals of a NAND flash memories (third and fourth chips). The respective symbols as listed in Table 1. It should be noted that "Other-a, -b" are undisclosed special signals (not shown).

TABLE 1

| | |
|---|---|
| /CE | Chip Enable |
| /WE | Write Enable |
| /RE | Read Enable |
| CLE | Command Latch Enable |
| ALE | Address Latch Enable |
| /WP | Write Protect |
| RY/_BY | Ready/Busy Output |
| I/O | Command Address Data input/output |

The CPU comprises control pins, such as a general-purpose I/O (GPIO) control signal pin, address-specifying pins A0-An, a read/write pin RD/_WR, and the like. However, in order for the NAND flash memory to sequentially execute reading and writing operations, they have to be executed in a step different from the CPU instructions, which requires a control circuit (fifth chip). For memory access purposes, first of all, a predetermined command is issued, followed by issuing memory addresses required for the cycle. These can be used to execute the reading and writing of the required data. The control circuit appropriately operates the NAND flash memory, executing the NAND memory tasks based on commands from the CPU. As shown here, there are connecting wiring lines "a" running between the CPU and NAND flash memory; connecting wiring lines "b" running between the CPU and control circuit; connecting wiring lines "c" running between the control circuit and NAND flash memory, as well as connecting wiring lines "d" shared by all three units, i.e. the CPU, control circuit, and NAND flash memory.

Going back to FIG. 19, the connecting wiring lines "a", connecting wiring lines "b", and connecting wiring line "d" are illustrated as multiple wiring layers 51 (a, b-1 through b-3, d-1, d-2, and e-1). The connecting wiring lines "c" (c-1 through c-7) are shown as the above-described wiring layers 21 or as bonding wires, or as a combination thereof. It should be noted that in the figure these wiring lines are represented by a smaller number of lines. Therefore, the number of the chip pick-up electrodes (internal terminal electrodes) 2 contained in the respective corresponding chips is shown smaller than the actual number of the electrodes. In FIG. 19, the multiple internal terminal electrodes 2 are shown as D1-D10, E1-E10, and F1-F12 shown as white boxes. It should be noted that the wiring layer 21 includes a first end portion 21a, a second end portion 21b, and a redistribution wiring portion 21c. In FIG. 19, the first end portions 21a and second end portions 21b are indicated with symbols G and H shown in gray boxes, and the redistribution wiring portions 21c are shown with a dotted or dashed line. The redistribution wiring portion 21c connects the first end portion 21a and the second end portion 21b, two first end portions 21a, or two second end portions 21b. The patterns of the wiring layers 21 formed on the respective surfaces of the third chips and fourth chip are the same. As far as the bonding wires are concerned, bonding wires connecting internal terminal electrodes 2, or those connecting the internal terminal electrodes 2 to the first end portions 21a and second end portions 21b are indicated either with thin lines or thick lines.

The connections between the first chip and second chip, as well as the connections between them and the wiring layers 51 will now be described in detail. The first chip has multiple chip pick-up electrodes (internal terminal electrodes) 2. They are indicated by symbols A1 through A5 shown as white boxes. A first end portion 21a (second node), a second end portion 21b (first node), as well as redistribution wiring lines comprising a redistribution wiring portion 21c (first or second wiring lines) are formed on the surface of the first chip. The second chip has multiple chip pick-up electrodes (internal terminal electrodes) 2. They are indicated by symbols B1 through B6 shown as white boxes. In the same manner as in FIG. 2, the pick-up electrode (internal terminal electrode) 2 (A1) is connected to the first end portion 21a (C2). For convenience of illustration, the white and gray boxes are shown with a slight shift. In a first structural form, the pick-up electrode (internal terminal electrode) 2 (B1) is connected to the second end portion 21b (C1; the first node) by a bonding wire (first bonding wire). In the drawings below, solid-line symbols drawn with curved lines show bonding wires. It should be noted that there are thin solid lines and thick solid lines and their meaning is described below. Pick-up electrode (internal terminal electrode) 2 (A1) is connected to the first end portion 21a (C2; second node). Pick-up electrode (internal terminal electrode) 2 (A5) is connected to the first end portion 21a (C12). Pick-up electrode (internal terminal electrode) 2 (B6) is connected to the second end portion 21b (C11). The above is illustrated by a cross-sectional view taken along lines X-1~X-2 in FIG. 21. The bonding wires 40 are formed using well-known materials, construction (with a round, circular cross-section), and techniques. Bonding agent 42 is provided between the first and second chips. An insulating film 43 protects the bonding wires 40. This is a protective film required for the subsequent step, in which the first wafer comprised of first chips is diced along the scribe lines 41. The protective insulating film 8, is not shown. The redistribution wiring lines, which are formed using the above-described ion plating and a metal mask, followed by the lift-off of the metal mask, have a singular structure. They comprise an edge portion viewed from a direction perpendicular to the surface of the first chip, with the angle of the cross-section of the wiring layer serving as a redistribution wiring line taken perpendicularly to the surface of the first chip in the edge portion contacting the first chip being 55° (55 degree) or less. For example, this is illustrated by the shape of the end of the wiring layer 21 facing the scribe line 41. Furthermore, the wiring layer 21 is comprised of an aggregate of columnar grains extending in a direction different from the direction of the surface of the first chip. It should be noted that the wiring layer 21 is preferably consisting essentially of metal whose main ingredient is aluminum (Al), with small amounts of secondary metals such as Si, Ti, Cu, and the like incorporated therein to enhance the strength of bonding to the passivation film while increasing resistance to electro-migration caused by high currents and corrosion resistance. The loading range of the secondary metals is set such that the metallic properties of Al are ensured. In particular, while Al is a metallic material that does not lend itself to the plating techniques employed in ordinary WLP, deposition is possible regardless of the type of metal if an ion plating process is used. In addition, as an example, the thickness of the wiring layer 21 may be 0.5-2 micrometers, or 0.2-10 micrometers as described above. The bonding agent may be, for instance, a (paste-like) die-bonding agent made up of an epoxy or silicone resin containing a metal powder and the like. It should be noted that, as used herein, the term "main ingredient" refers to the material with the highest proportion by weight, preferably one with a weight ratio of not less than 50%.

Going back to FIG. 19, in a second structural form, the pick-up electrode (internal terminal electrode) 2 (B2) is connected to the second end portion 21b (C3) by a bonding wire (second bonding wire). The first wiring layer 51 (insulating substrate wiring line; f) is connected to the second end portion 21b (C4) by a bonding wire (third bonding wire). The above is illustrated by a cross-sectional view taken along lines X-3~X-4 in FIG. 22.

In a third structural form, pick-up electrode (internal terminal electrode) 2 (A3) is connected to the first end portion 21a (C9). The second wiring layer 51 (insulating substrate wiring line; f) is connected to the second end portion 21b (C6). The above is illustrated by a cross-sectional view taken along lines X-5~X-6 in FIG. 23. Disposed between the first and second chips, the wiring layer 21 is connected to the first end portion 21a (C9) and the second end portion 21b (C6). The above is illustrated by a cross-sectional view taken along lines X-5~X-6 in FIG. 23.

In a fourth structural form, the third wiring layer 51 (insulating substrate wiring line; f) is connected to pick-up electrode (internal terminal electrode) 2 (B3) via pick-up electrode (internal terminal electrode) 2 (A2), second end portion 21b (C7), and second end portion 21b (C8).

In a fifth structural form, the fourth wiring layer 51 (insulating substrate wiring line; f) is connected to the second end portion 21b (C5). Pick-up electrode (internal terminal electrode) 2 (B4) is connected to the second end portion 21b (C5) via second end portion 21b (C10). This is a case of practical application of the second and third structural form.

The connections between the third chip, fourth chip, and fifth chip, as well as the connections between them and the wiring layers 51 will now be described in detail. Although these connections are basically similar to the connections between the first and second chips, the detailed descriptions below will refer to the portions that were not disclosed in the description above.

In a sixth structural form, the fifth wiring layer 51 (insulating substrate, wiring line; d-1) is connected to the second end portion 21b (G5) and pick-up electrode (internal terminal electrode) 2 (E1). Pick-up electrode (internal terminal electrode) 2 (D1) is connected to the second end portion 21b (G5) via first end portion 21a (G6). Pick-up electrode (internal terminal electrode) 2 (F2) is connected to the second end portion 21b (G5) via second end portion 21b (G2). It should be noted that despite the fact that the fourth chip, in the same manner as in the third chip, has a wiring layer 21 and two second end portions 21b (G2, G5), they are not used. The pick-up electrode (internal terminal electrode) 2 (E1) that the fourth chip has is essentially connected to the second end portion 21b (G6; not shown) of the fourth chip.

In a seventh structural form, the sixth wiring layer 51 (insulating substrate wiring line; d-2) is connected to the second end portion 21b (G7), pick-up electrode (internal terminal electrode) 2 (D2) and pick-up electrode (internal terminal electrode) 2 (E2). Pick-up electrode (internal terminal electrode) 2 (F3) is connected to the second end portion 21b (G7) via second end portion 21b (G3). Although the fourth chip, in the same manner as the third chip, has a wiring layer 21 and two second end portions 21b (G2 (H3), G7 (H7)), they are not used. The same applies hereinbelow.

In an eighth structural form, two pick-up electrodes (internal terminal electrodes) 2 (D5, E4) are connected to pick-up electrode (internal terminal electrode) 2 (F4) via second end portion 21b (G10) and second end portion 21b (G9). This is shown with connecting wiring line c (c-1).

In a ninth structural form, two pick-up electrodes (internal terminal electrodes) 2 (F5, E5) are connected via second end portion 21b (G11) and second end portion 21b (G12). This is shown with connecting wiring line c (c-2). F5 and G11 are connected by a bonding wire (fifth bonding wire). E5 and D5 are connected by a bonding wire (sixth bonding wire).

In a tenth structural form, two pick-up electrodes (internal terminal electrodes) 2 (F6, D6) are connected via second end portion 21b (G13) and second end portion 21b (G14). This is shown with connecting wiring line c (c-3).

In an eleventh structural form, two pick-up electrodes (internal terminal electrodes) 2 (E10, D10) are connected to pick-up electrode (internal terminal electrode) 2 (F11) via the corresponding first end portions 21a (H16, G16) and first end portions 21a (H15, G15). Two pick-up electrodes (internal terminal electrodes) 2 (E9, D9) are connected to pick-up electrode (internal terminal electrode) 2 (F11) via the corresponding first end portions 21a (H15, G15). This is shown with connecting wiring line c (c-7). Two first end portions 21a (H15, H16) are connected by a redistribution wiring portion 21c (dashed line) formed on the surface of the fourth chip. This redistribution wiring portion 21c (dashed line) is disposed between the third and fourth chip. Two first end portions 21a (G15, G16) are connected by a redistribution wiring portion 21c (dotted line) formed on the surface of the third chip. This redistribution wiring portion 21c (dotted line) is disposed between the third and fifth chip. In a twelfth structural form, the wiring layer 51 (insulating substrate wiring line; a) is connected to pick-up electrode (internal terminal electrode) 2 (E3) by a bonding wire (seventh bonding wire). In addition, the wiring layer 51 (insulating substrate wiring line; a) is connected to pick-up electrode (internal terminal electrode) 2 (D3) by a bonding wire. The wiring layer 51 (insulating substrate wiring line; b-3) is connected to pick-up electrode (internal terminal electrode) 2 (F10) by a bonding wire (fourth bonding wire).

Figure 24:
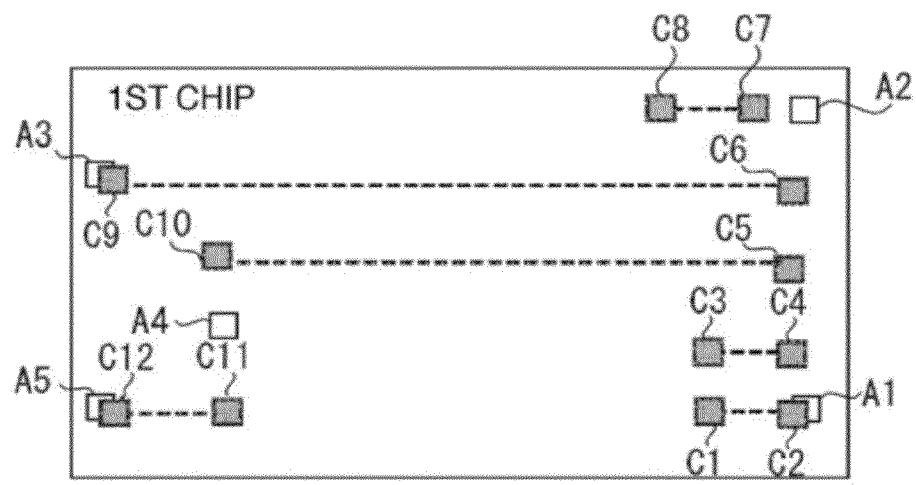
FIG. 24 shows a view from above illustrating redistribution wiring lines on a first chip according to the present invention.
Figure 25:
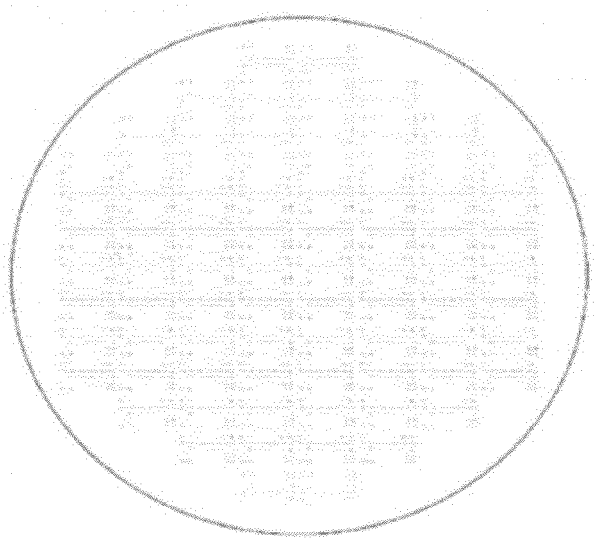
FIG. 25 shows a view from above illustrating redistribution wiring lines on a first wafer comprised of multiple first chips according to the present invention.

The first chip is described in FIG. 24 and FIG. 25 in detail. It should be noted that FIG. 24 is a top view of redistribution wiring lines including a first end portion 21a, a second end portion 21b, and a redistribution wiring portion 21c formed on the surface of the first chip. FIG. 25 is the top view of a wafer comprised of multiple first chips (first wafer) having redistribution wiring lines formed thereon. Their structure and manufacturing method characteristics are as described above. Accordingly, the single first chip illustrated in FIG. 24 is an enlarged drawing of a single first chip located on the first wafer.

Figure 26:
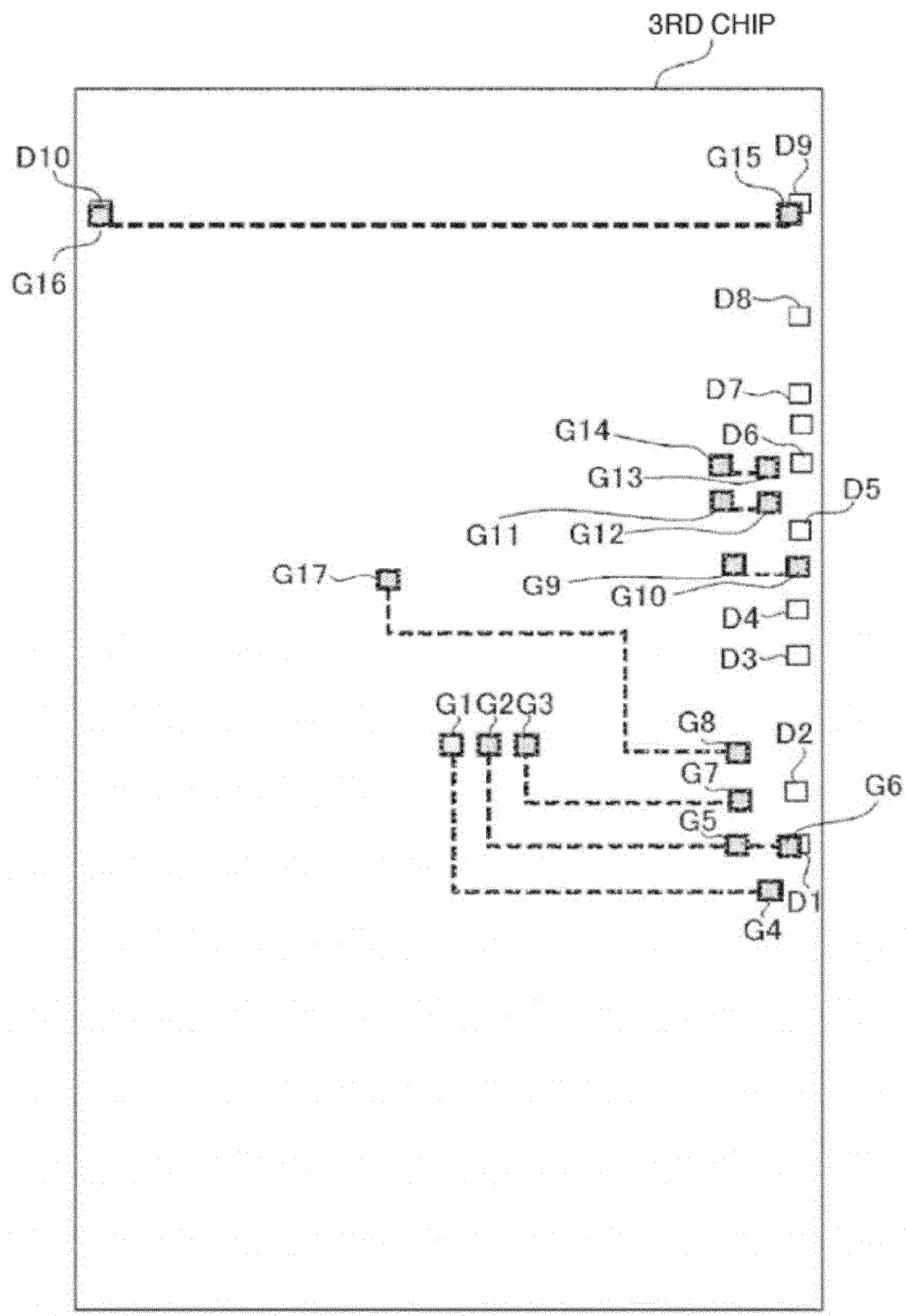
FIG. 26 shows a view from above illustrating redistribution wiring lines on a third chip according to the present invention.
Figure 27:
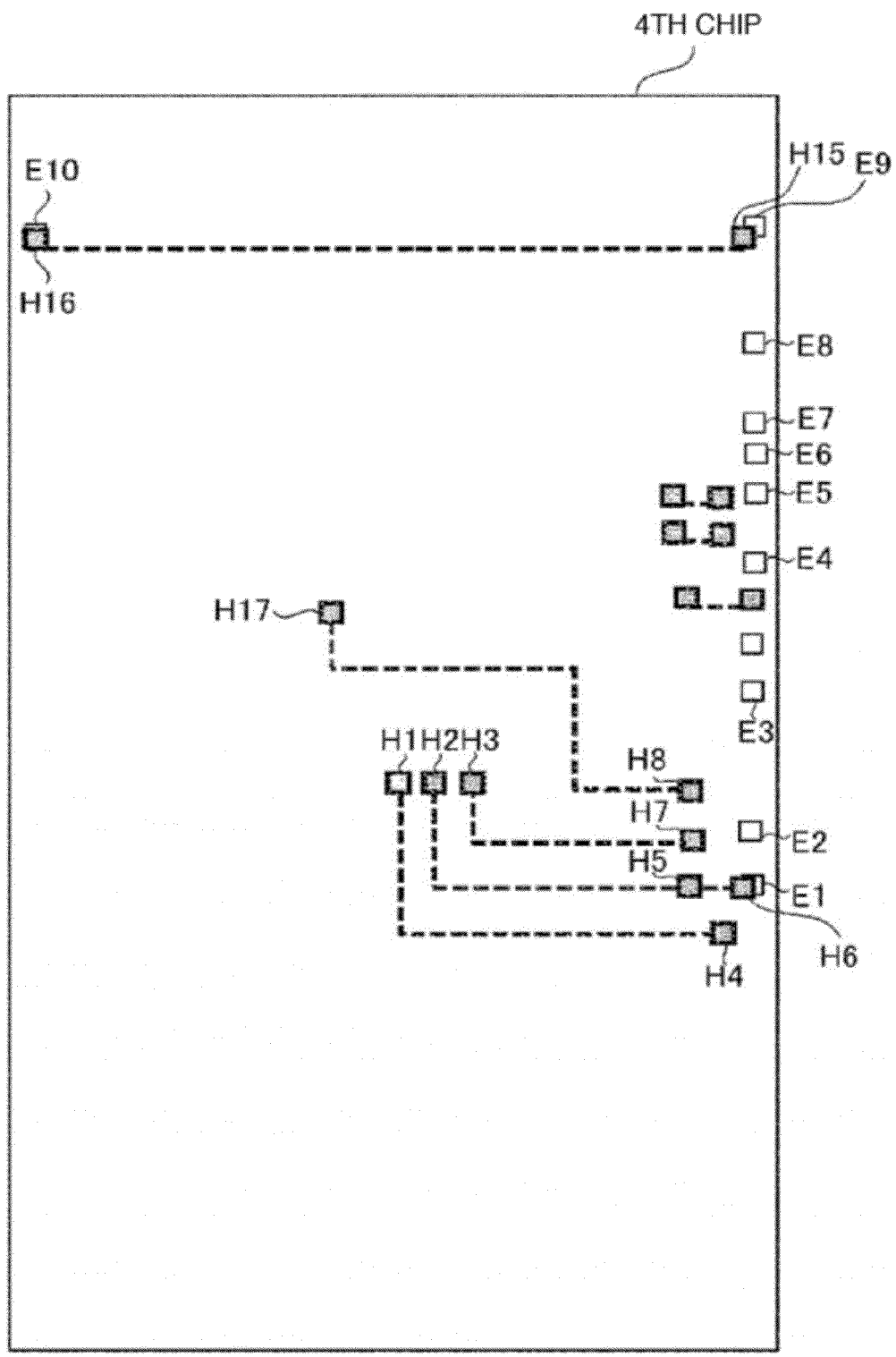
FIG. 27 shows a view from above illustrating redistribution wiring lines on a fourth chip according to the present invention.

The third and fourth chips are described in FIG. 26 and FIG. 27 in detail. It should be noted that FIG. 26 and FIG. 27 are top views of redistribution wiring lines including first end portions 21a, second end portions 21b, and redistribution wiring portions 21c formed, respectively, on the surface of the third and fourth chip. Since this embodiment makes use of chips of identical functionality, their redistribution wiring lines have identical layout patterns and only the reference numerals are different. The third chip (fourth chip) illustrated in FIG. 26 is a wafer (second wafer) comprised of multiple third chips having redistribution wiring lines formed thereon in the same manner as on the first wafer (FIG. 25) and is an enlarged view of a single third chip. FIG. 27 is similar. During the dicing step, the chips diced from a single second wafer may be defined as the third and fourth chips.

Figure 28:
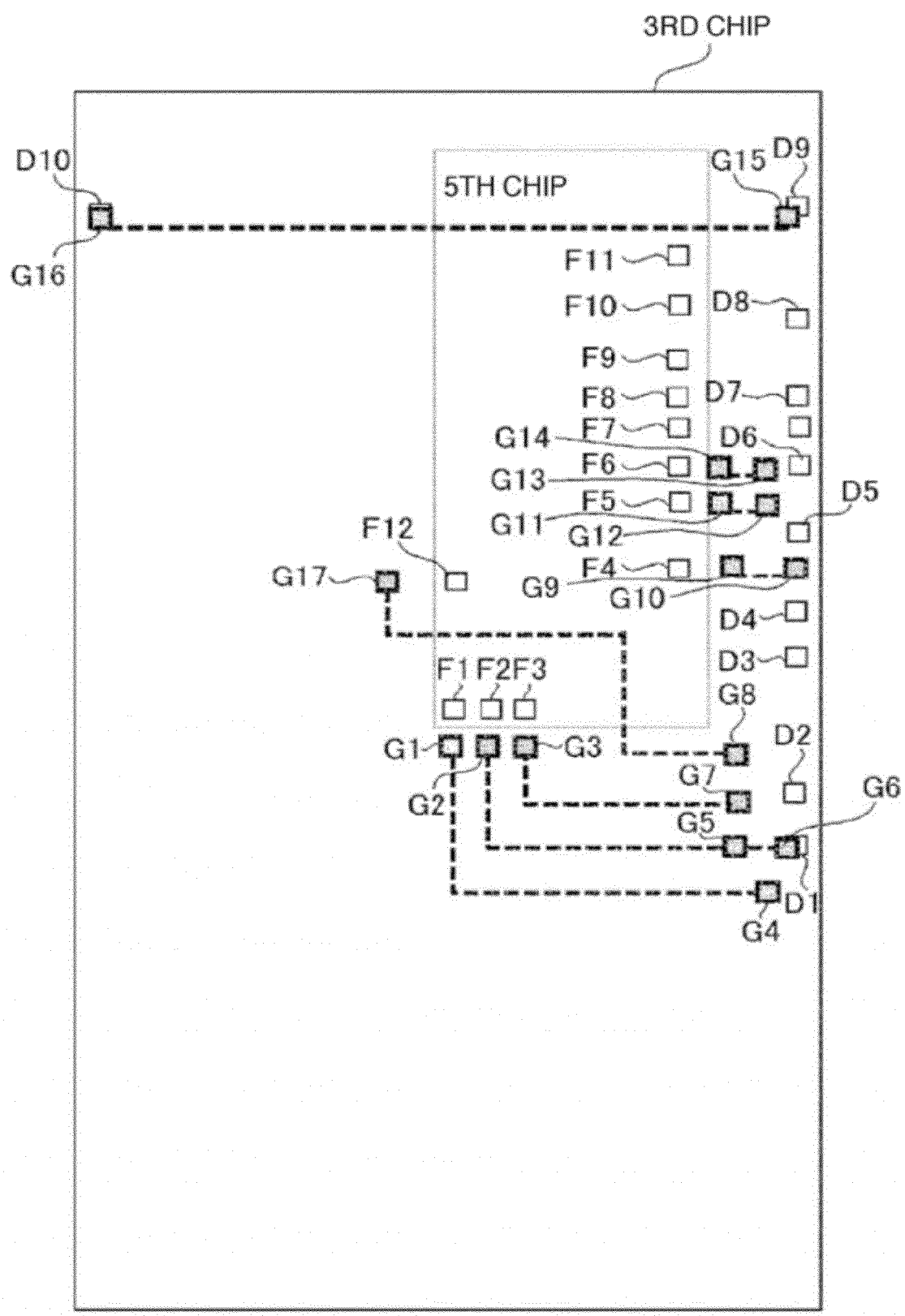
FIG. 28 shows a view from above illustrating a configuration, in which a fifth chip is laminated on redistribution wiring lines located on a second wafer comprised of multiple third chips according to a first manufacturing method of the present invention.
Figure 29:
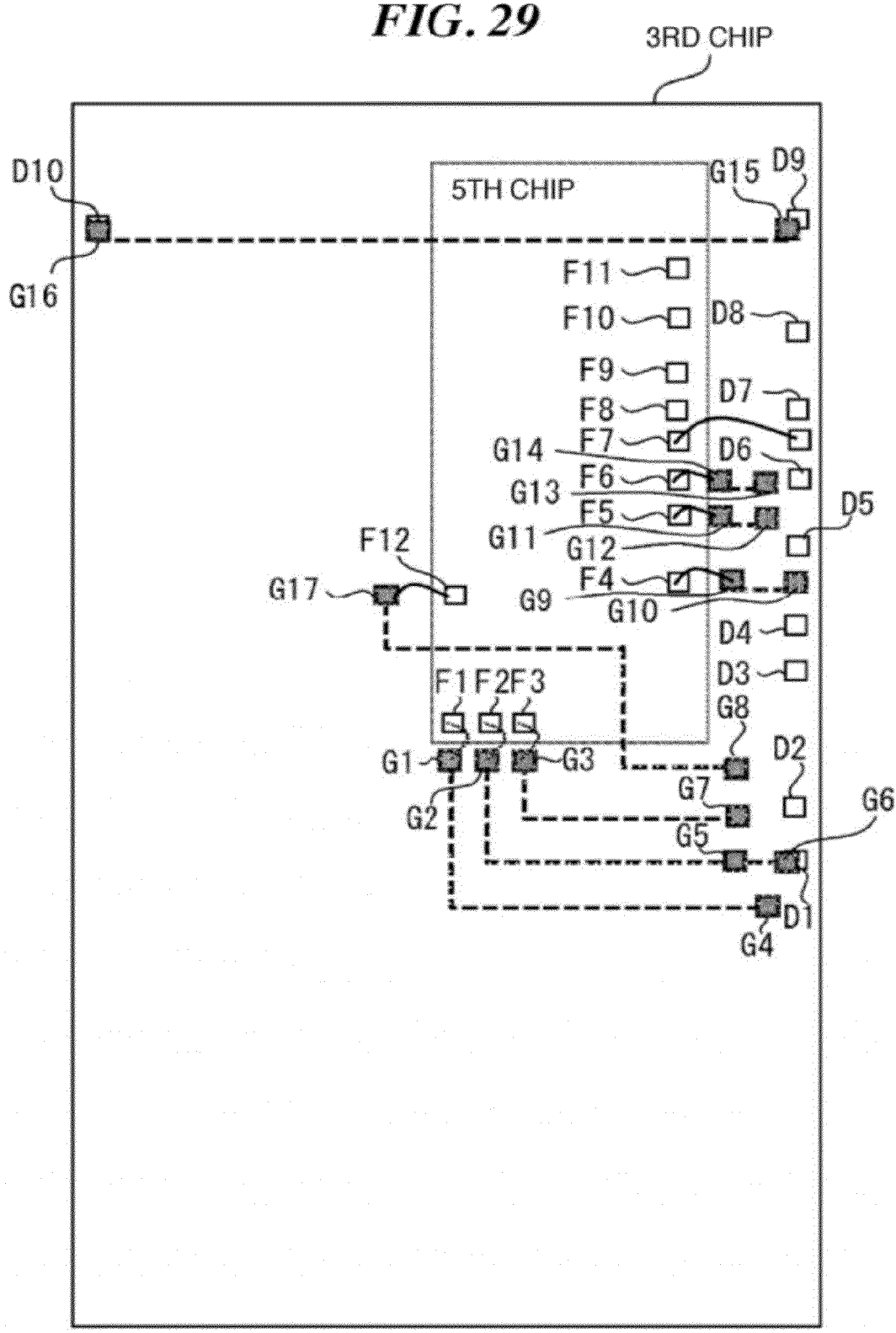
FIG. 29 shows a view from above illustrating a configuration, in which a bonding wire is laid between the third and fifth chip of FIG. 28.
Figure 30:
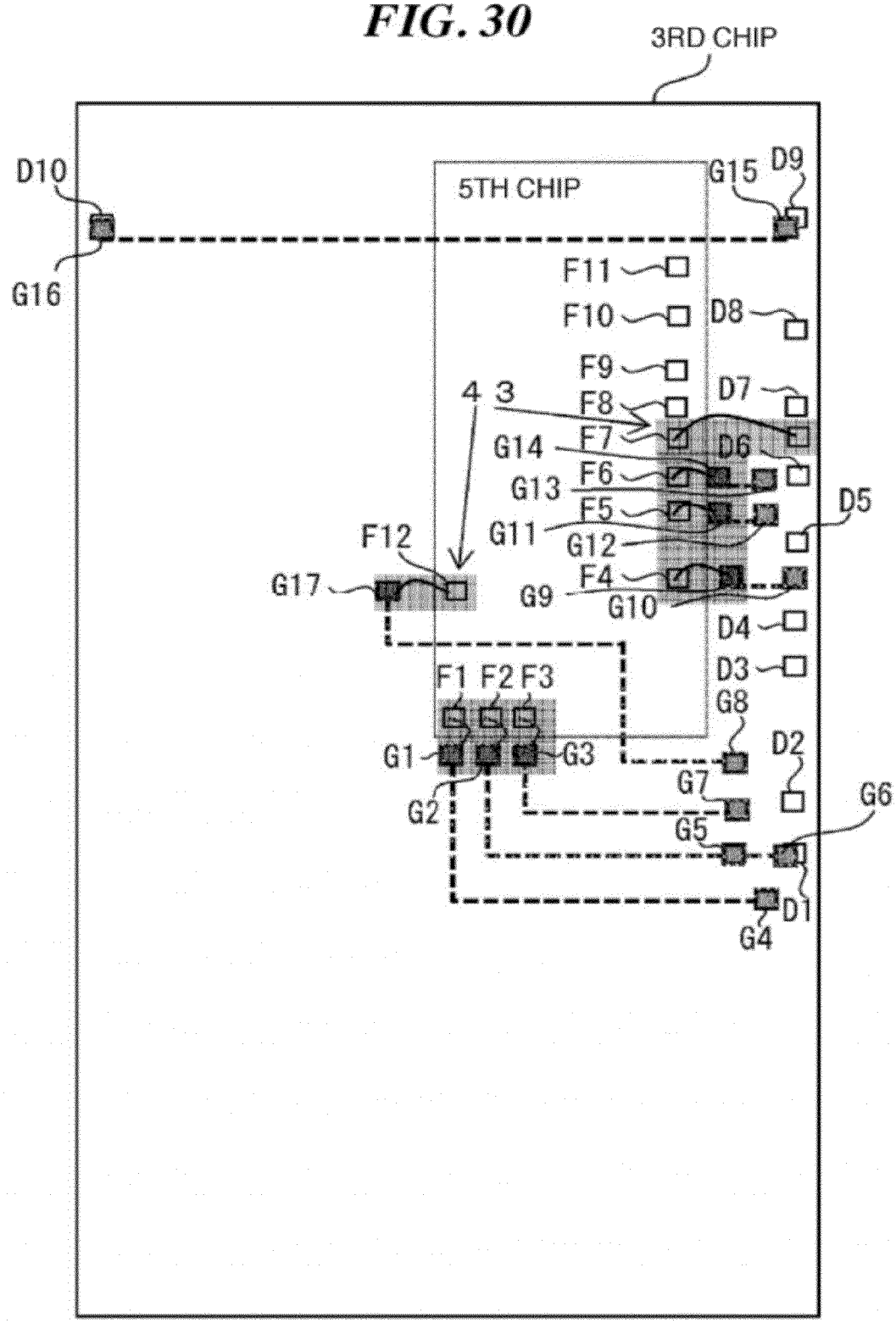
FIG. 30 shows a view from above illustrating a protective insulating film in the region of the bonding wire of FIG. 29.

The third and fifth chips according to the first manufacturing method are described in FIG. 28, FIG. 29, and FIG. 30 in detail. FIG. 28 is a top view illustrating the fifth chip formed in a laminate configuration on the third chip with the help of a bonding agent. To be precise, the fifth chip is laminated through the medium of a bonding agent on redistribution wiring lines formed on the surface of the third chip. It should be noted that in FIG. 28, FIG. 29, and FIG. 30, the third chip is an enlarged drawing of a single third chip located on the second wafer. FIG. 29 is a top view, in which the third chip and fifth chip are connected by bonding wires. Bond wiring is used in 8 locations. In the description of this embodiment, single nouns are used as names for the bonding wires. In addition, the bonding wires are sometimes referred to as wire-bonding. FIG. 30 is a top view, in which the eight bonding wires are protected by insulating films (shaded areas). This prevents damage to the bonding wires during the step, in which the second wafer is diced, or during the testing step. Subsequently, the second wafer obtained by laminating multiple fifth chips is diced, yielding a single individual laminated chip.

Figure 31:
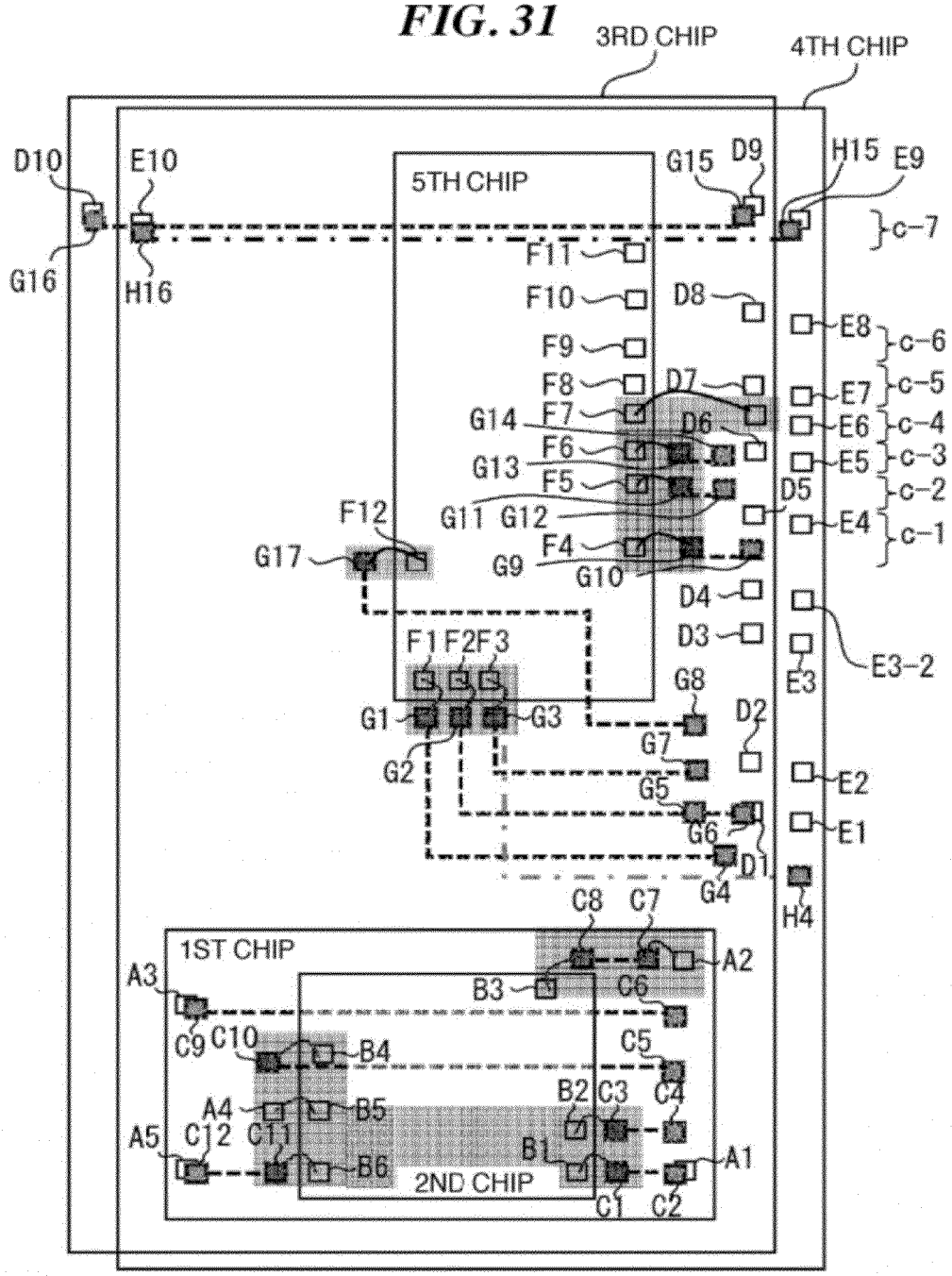
FIG. 31 shows a view from above illustrating laminated chips 1 through 5 of FIG. 30.

Chips 1 through 5 are described in FIG. 31 in detail. The third chip is laminated on the fourth chip. The first chip and fifth chip are laminated on the third chip. The second chip is laminated on the first chip. To be precise, a single first individual chip, which is produced by wire bonding the third chip and fifth chip with bonding wires and then stacking them in a laminate configuration, is laminated on the fourth chip. A single second individual chip, which is produced by wire bonding the first chip and second chip with bonding wires and then stacking them in a laminate configuration, is laminated on the third chip. It should be noted that the fourth chip is an individual chip obtained by dicing the second wafer, which has formed on its surface redistribution wiring lines including a first end portion 21a, a second end portion 21b, and a redistribution wiring portion 21c. Furthermore, the third and fourth chips are laminated during the subsequent steps. The third chip is laminated on the fourth chip such that the pick-up electrode (internal terminal electrode) 2, first end portions 21a, and second end portions 21b of at least some of the fourth chips are exposed. The significance of the exposure comprises in the fact that it is used for connections to at least some of the pick-up electrode (internal terminal electrode) 2, first end portions 21a, and second end portions 21b of other chips and the insulating substrate wiring lines 51.

Figure 32:
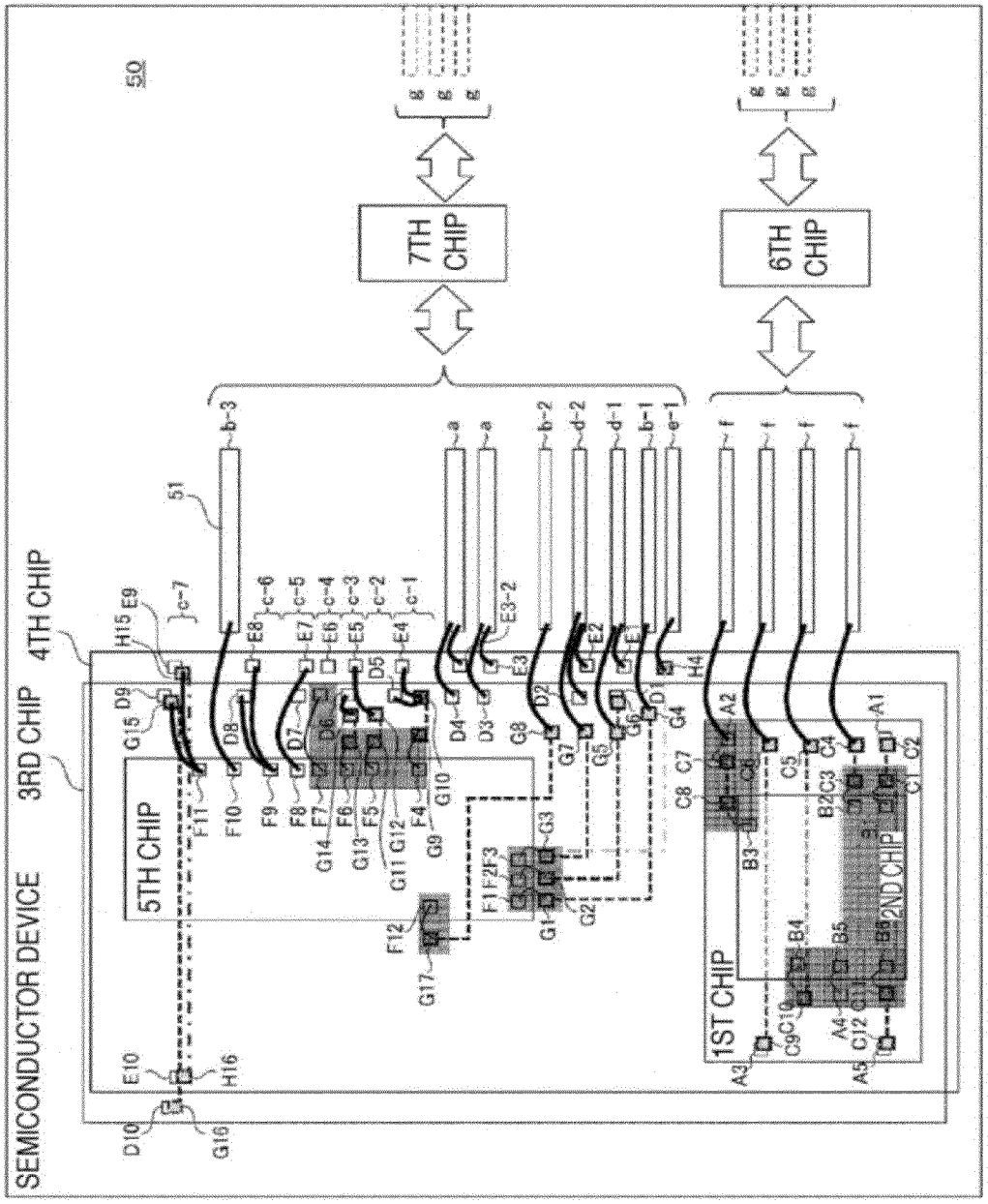
FIG. 32 shows a view from above illustrating bonding wires between the chips 1 through 5 laminated on the insulating substrate 50 and the wiring lines 51 on the insulating substrate.
Figure 33:
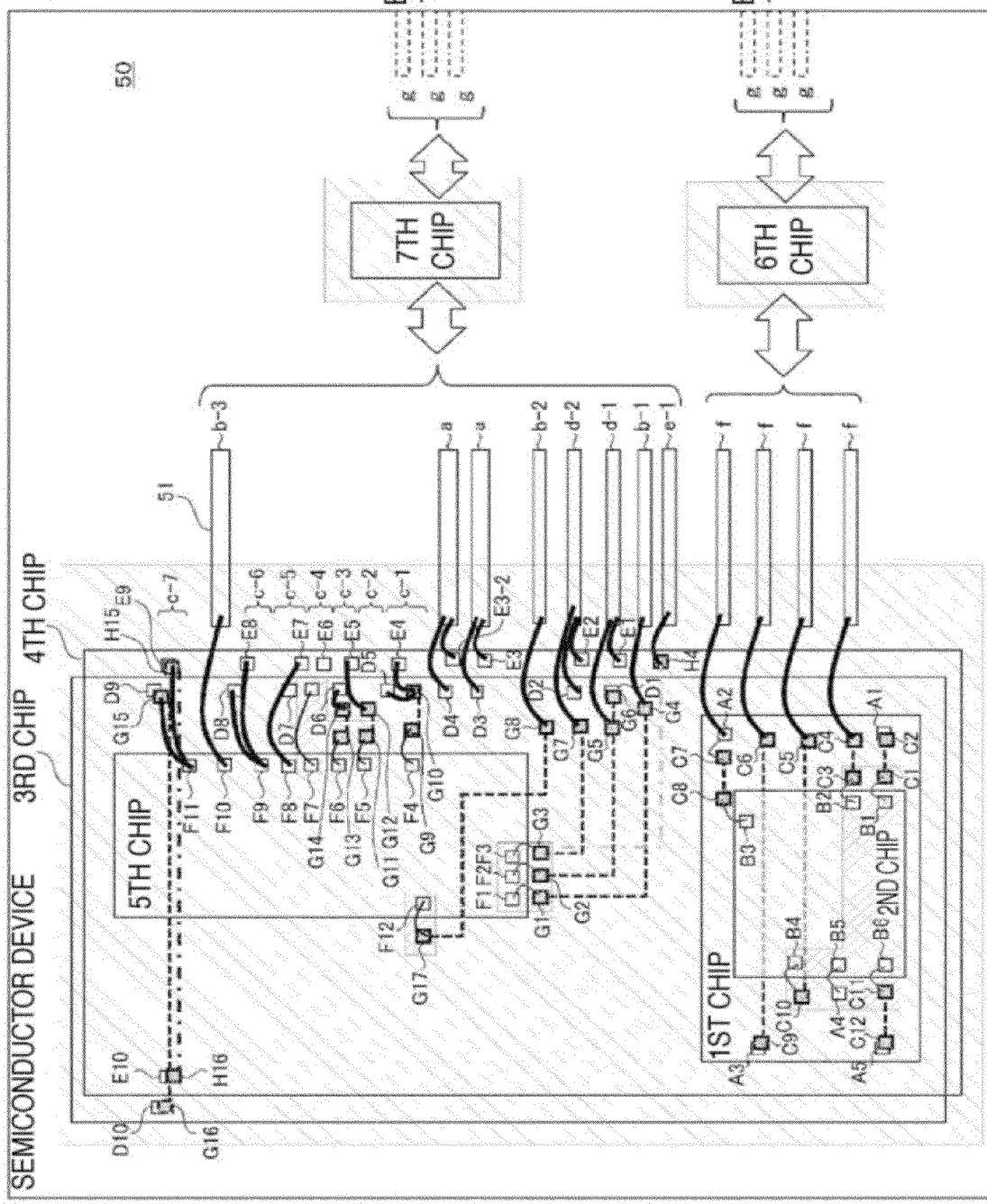
FIG. 33 shows a view from above illustrating a protective film in the region where chips 1 through 7 are disposed on the insulating substrate 50.

The semiconductor device will be described in detail with reference to FIG. 32 and FIG. 33. In FIG. 32, the fourth chip (laminated chips 1 through 5, to be precise) is mounted on the insulating substrate 50. The respective chips or multiple redistribution wiring lines related to the respective chips are connected to the multiple insulating substrate wiring lines 51 by the multiple bonding wires (thick solid lines). The fourth chip or redistribution wiring lines related to the fourth chip are connected to the third and fifth chip by the multiple bonding wires (thick solid lines). In FIG. 33, chips 1 through 7 are respectively protected by insulating films (shaded areas).

Figure 34:
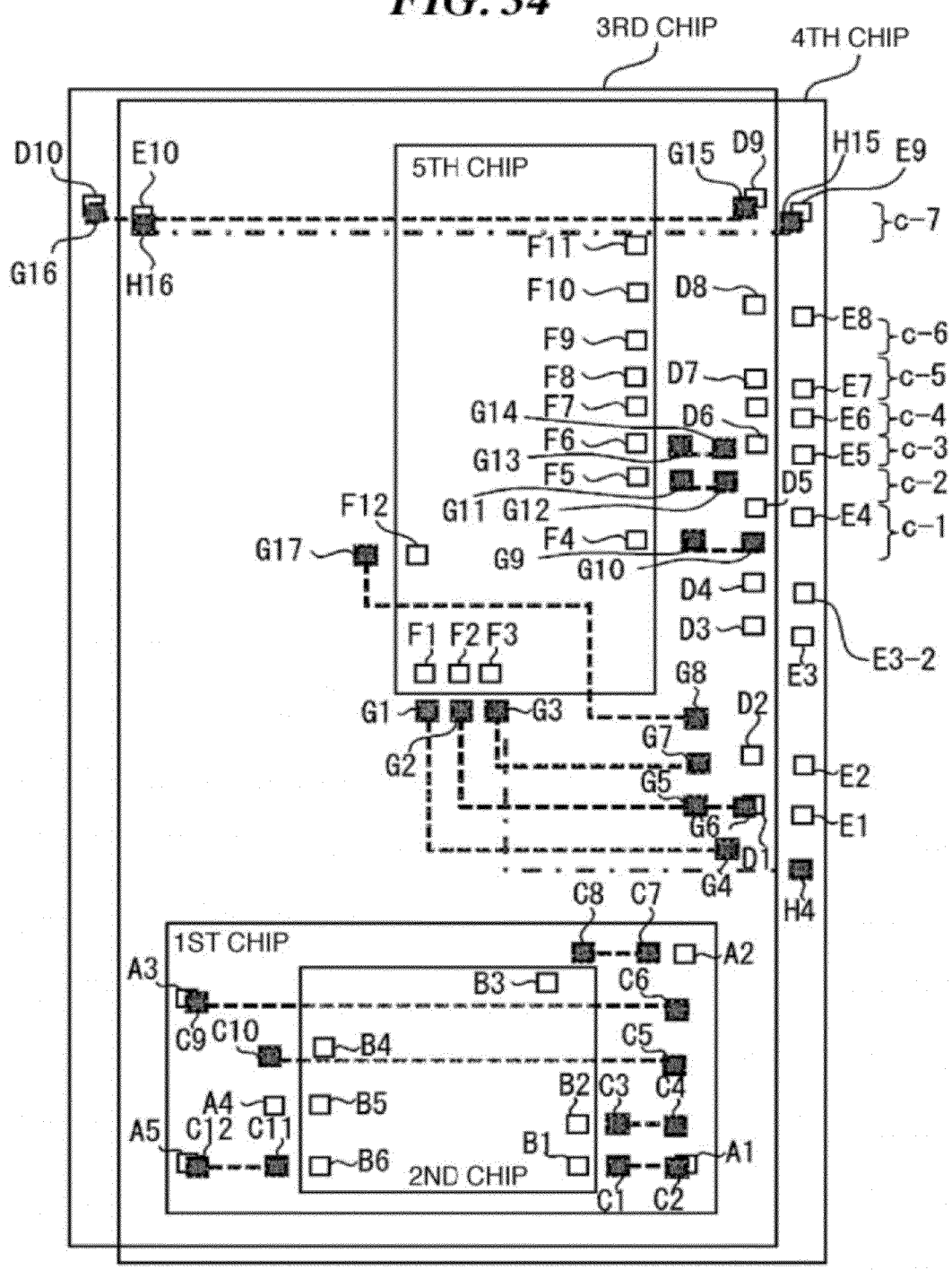
FIG. 34 shows a view from above illustrating a configuration, in which multiple chips 1 through 5 are laminated in accordance with a second manufacturing method of the present invention.
Figure 35:
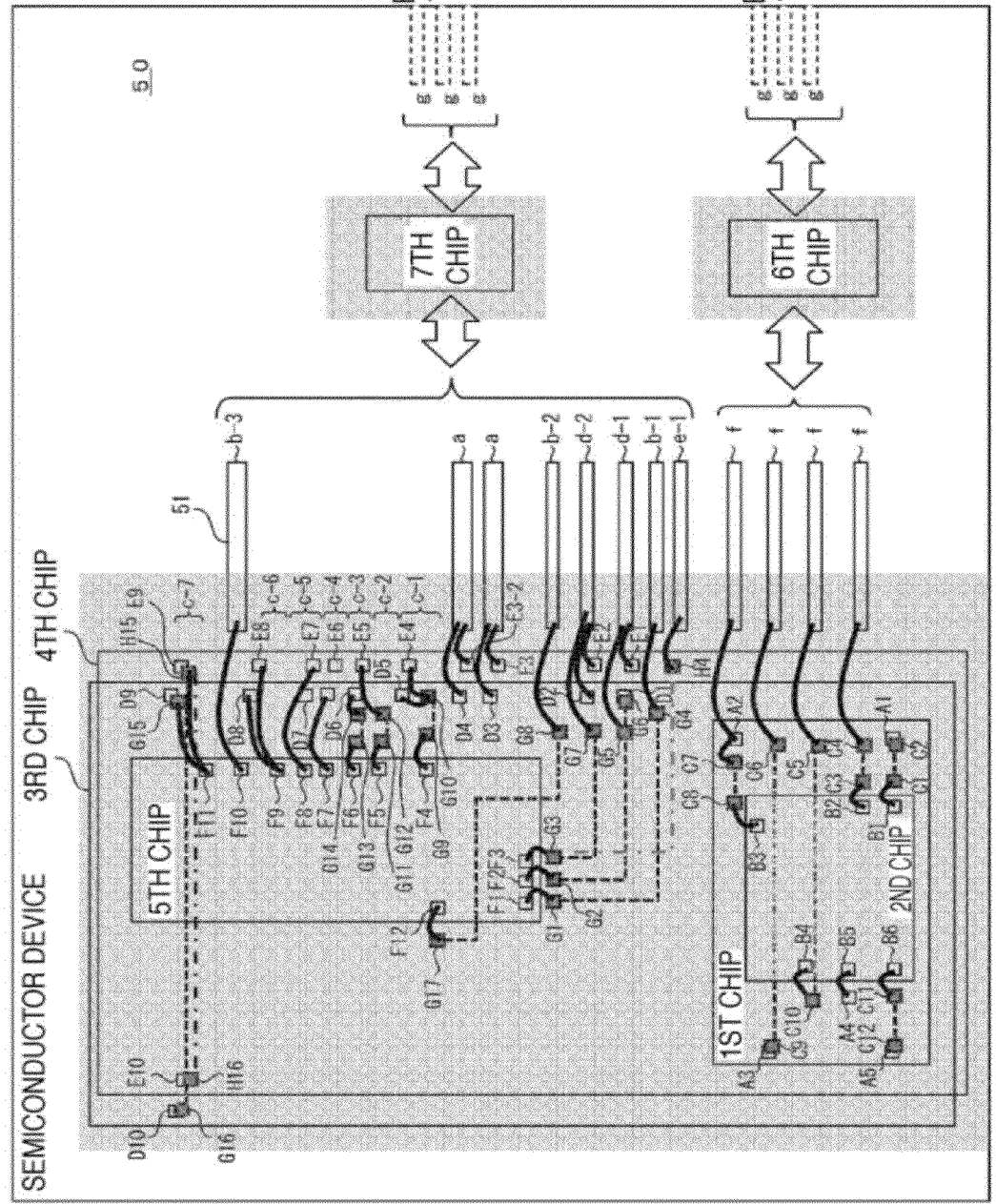
FIG. 35 shows a view from above illustrating a semiconductor device in accordance with the second manufacturing method of the present invention.

Chips 1 through 5 according to the second manufacturing method are described in FIG. 34 and FIG. 35 in detail. In FIG. 34, chips 1 through 5 diced from the respective wafers are stacked in a laminate configuration. Naturally, redistribution wiring lines are formed on the respective surfaces of the first, third, and fourth chips. While the first manufacturing method involves laminating different chips in a wafer state including redistribution wiring lines, laying bonding wires, and then performing dicing, in the second manufacturing method, first of all, wafers including redistribution wiring lines are diced and then the respective different chips are laminated.

In FIG. 35 (semiconductor device), the fourth chip (laminated chips 1 through 5, to be precise) is mounted on the insulating substrate 50 and connected to the multiple insulating substrate wiring lines 51 by multiple bonding wires. Chips 1 through 5 are respectively connected by multiple bonding wires. It should be noted that all the bonding wires are thick solid lines. This is due to the fact that all the bonding wires are laid in a single step. Chips 1 through 7 are respectively protected by insulating films (shaded areas).

Figure 36:
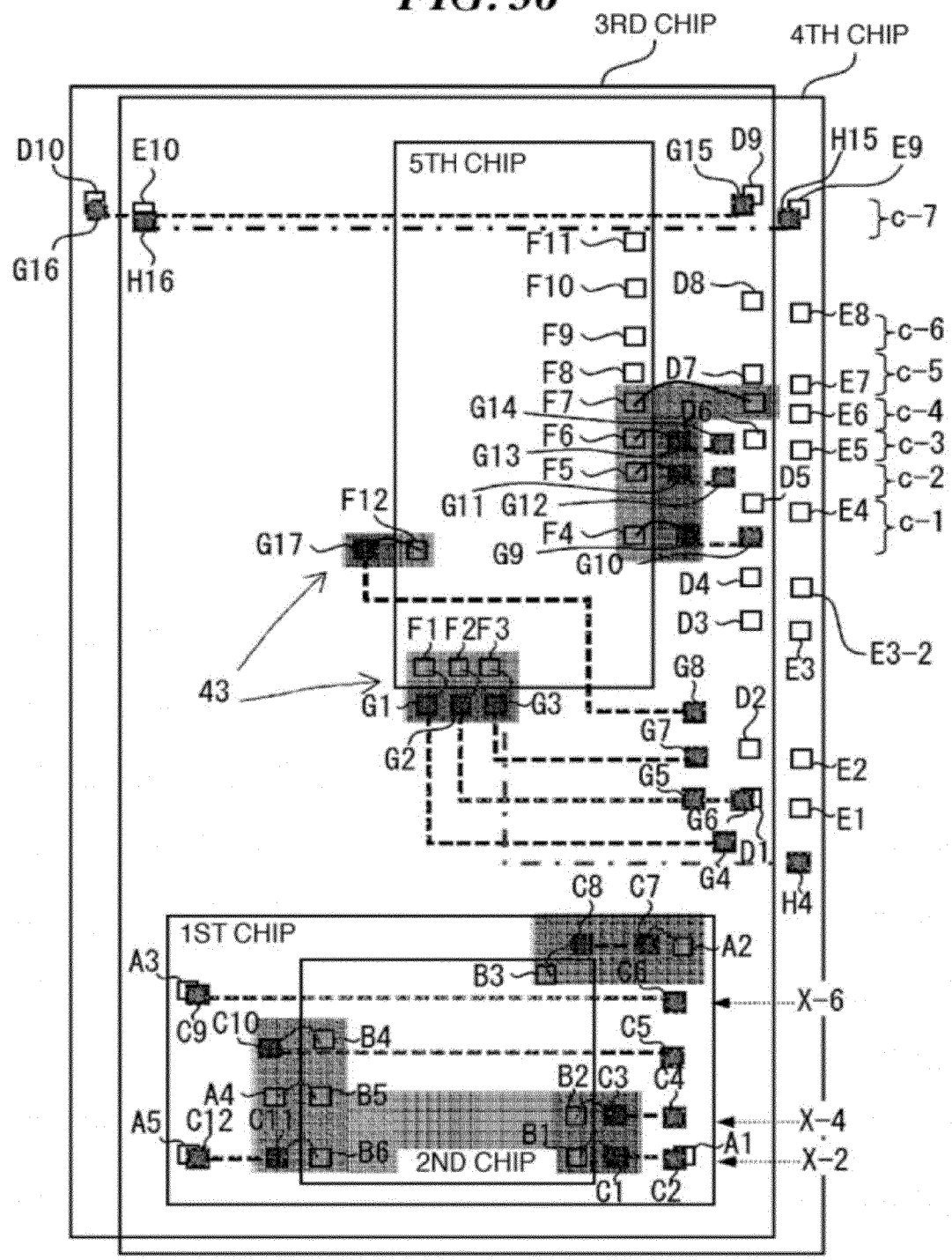
FIG. 36 shows a view from above illustrating chips 1 though 5 laminated in accordance with a third manufacturing method of the present invention.

Chips 1 through 5 according to the third manufacturing method are described in FIG. 36 in detail. In FIG. 36, chips 1 through 5 diced from the respective wafers are first stacked in a laminate configuration. Naturally, redistribution wiring lines are formed on the respective surfaces of the first, third, and fourth chips. Chips 1 and 2 are connected to each other by bonding wires (thin solid lines). Furthermore, chips 3 and 5 are connected to each other by bonding wires (thin solid lines). Those bonding wires are protected by insulating films (shaded areas). While the second manufacturing method involves mounting the fourth chip (laminated chips 1 through 5, to be precise) on the insulating substrate 50 and connecting it to multiple insulating substrate wiring lines 51 using multiple using bonding wires, in the third manufacturing method, some bonding wires are laid and provided with a protective film before mounting the fourth chip (laminated chips 1 through 5, to be precise) on the insulating substrate 50. After laying some of the bonding wires and testing the fourth chip (laminated chips 1 through 5, to be precise) in this state, only compliant units are mounted on the insulating substrate 50.

Figure 37:
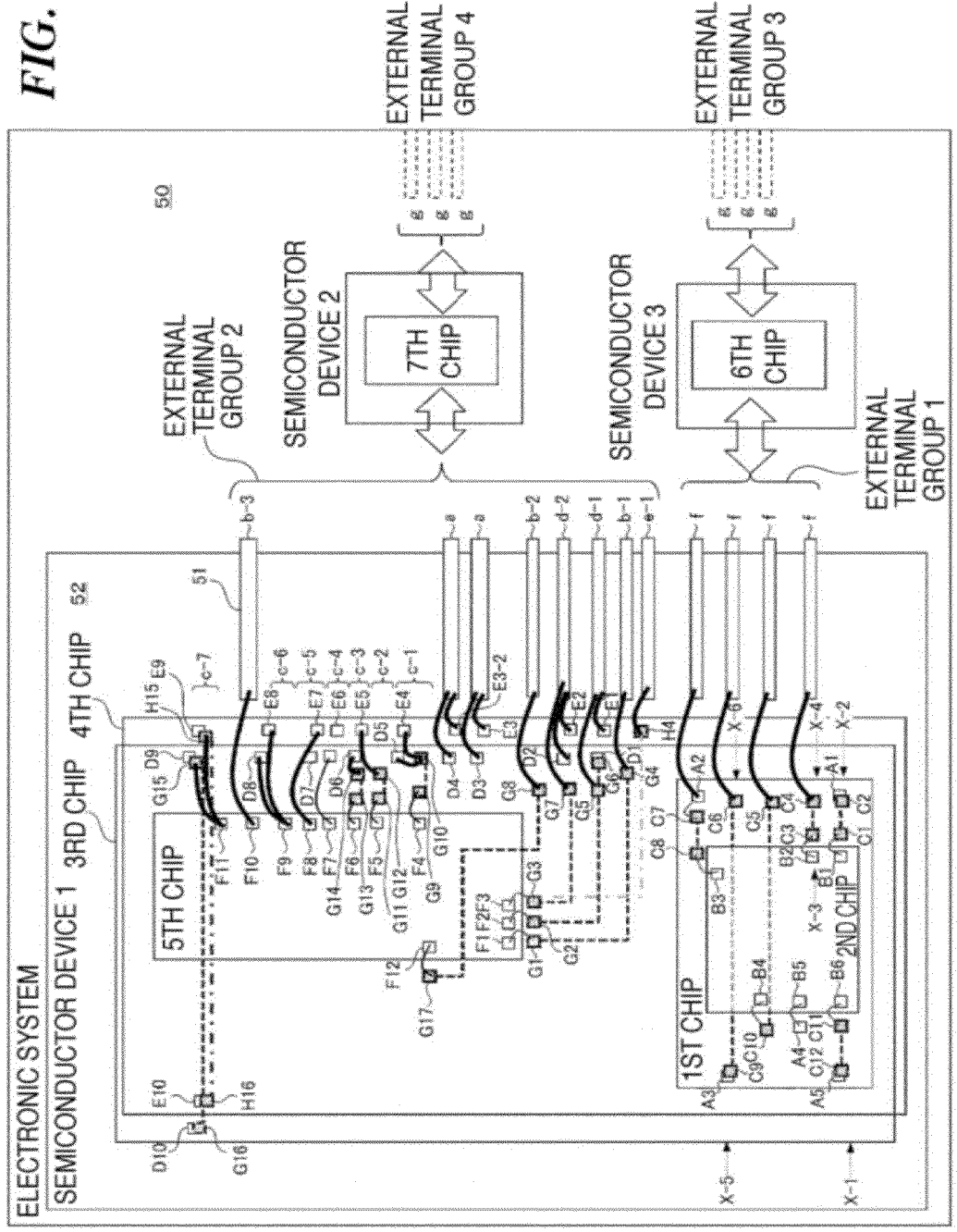
FIG. 37 shows a cross-sectional view illustrating an example of the semiconductor device and electronic system according to the present invention.

FIG. 37 is a view from above of a schematic structural diagram illustrating the structure of an electronic system and multiple semiconductor devices (containing multiple chips) according to a preferred embodiment of the present invention. The electronic system includes three semiconductor devices (semiconductor devices 1, 2, and 3, respectively). Semiconductor device 1 communicates with semiconductor devices 2, 3 through the medium of external terminal groups 1, 2 provided on the insulating substrate 52. Semiconductor devices 2, 3 communicate with the exterior through the medium of external terminal groups 3, 4 provided on the insulating substrate 50. A portion of the external terminal groups 1, 2 may be provided on the back surface or on the side faces of the insulating substrate 52, or on a combination of these surfaces. While the semiconductor device illustrated in FIG. 19 is provided to the customer as a single component, the semiconductor device 1 illustrated in FIG. 37 is provided to the customer as a single system. For example, the customer manufactures a single system from semiconductor devices 1, 2, 3 acquired from different suppliers, and the system is provided to the end user as a final product in the form of an electronic component. Semiconductor device 2 and semiconductor device 3 can utilize the same features of the present application as semiconductor device 1. Accordingly, the electronic system also includes the features of the present application.

Figure 38:
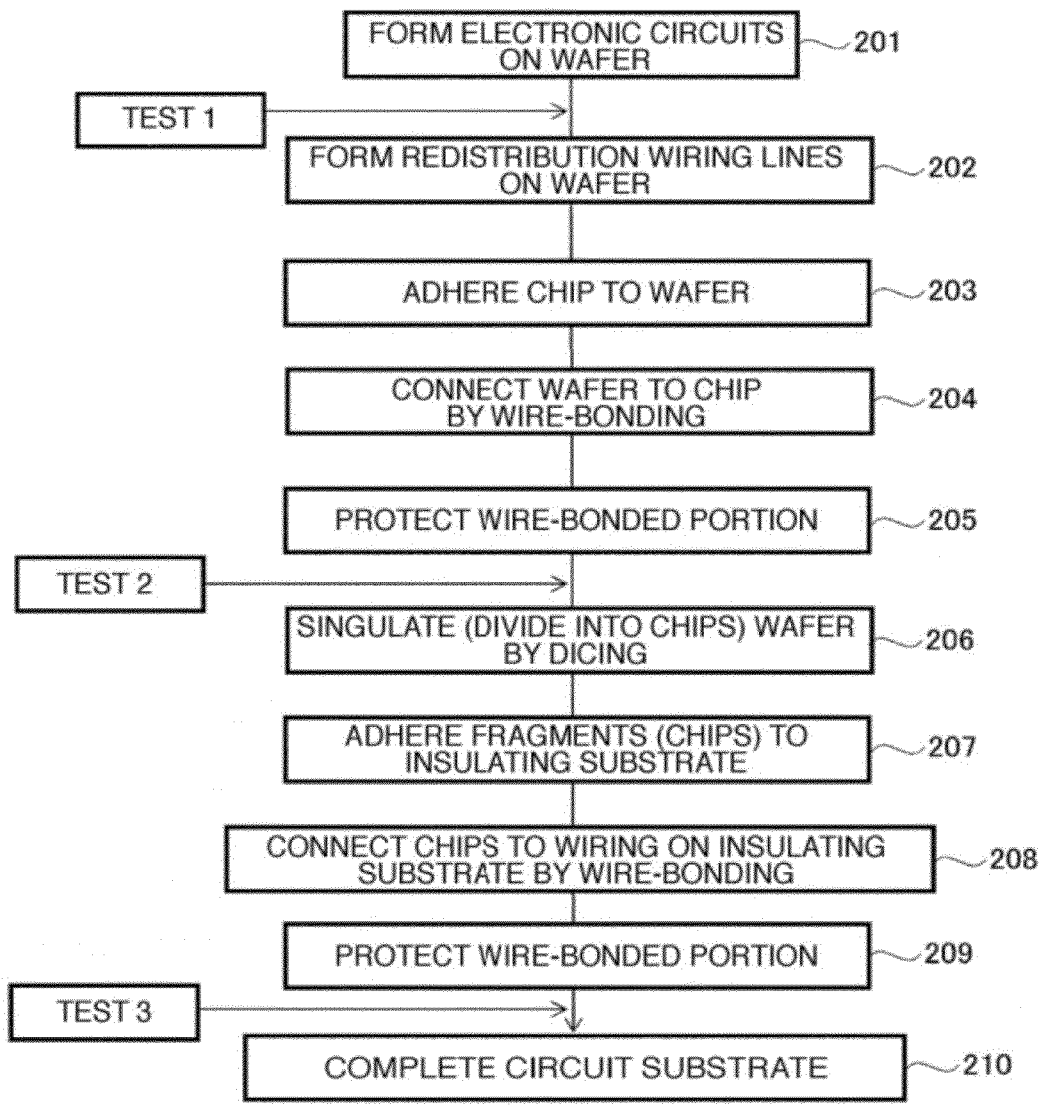
FIG. 38 shows a cross-sectional view illustrating the manufacturing flow of the semiconductor device and electronic system according to the present invention.
Figure 39:
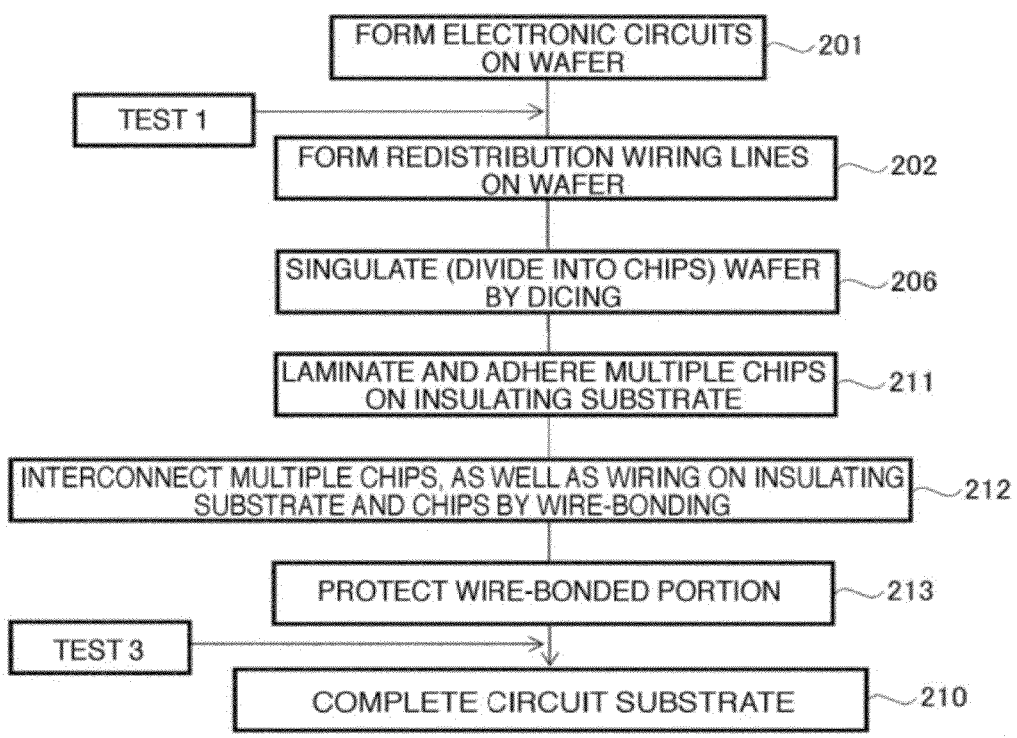
FIG. 39 shows a cross-sectional view illustrating the manufacturing flow of the semiconductor device and electronic system of FIG. 34.
Figure 40:
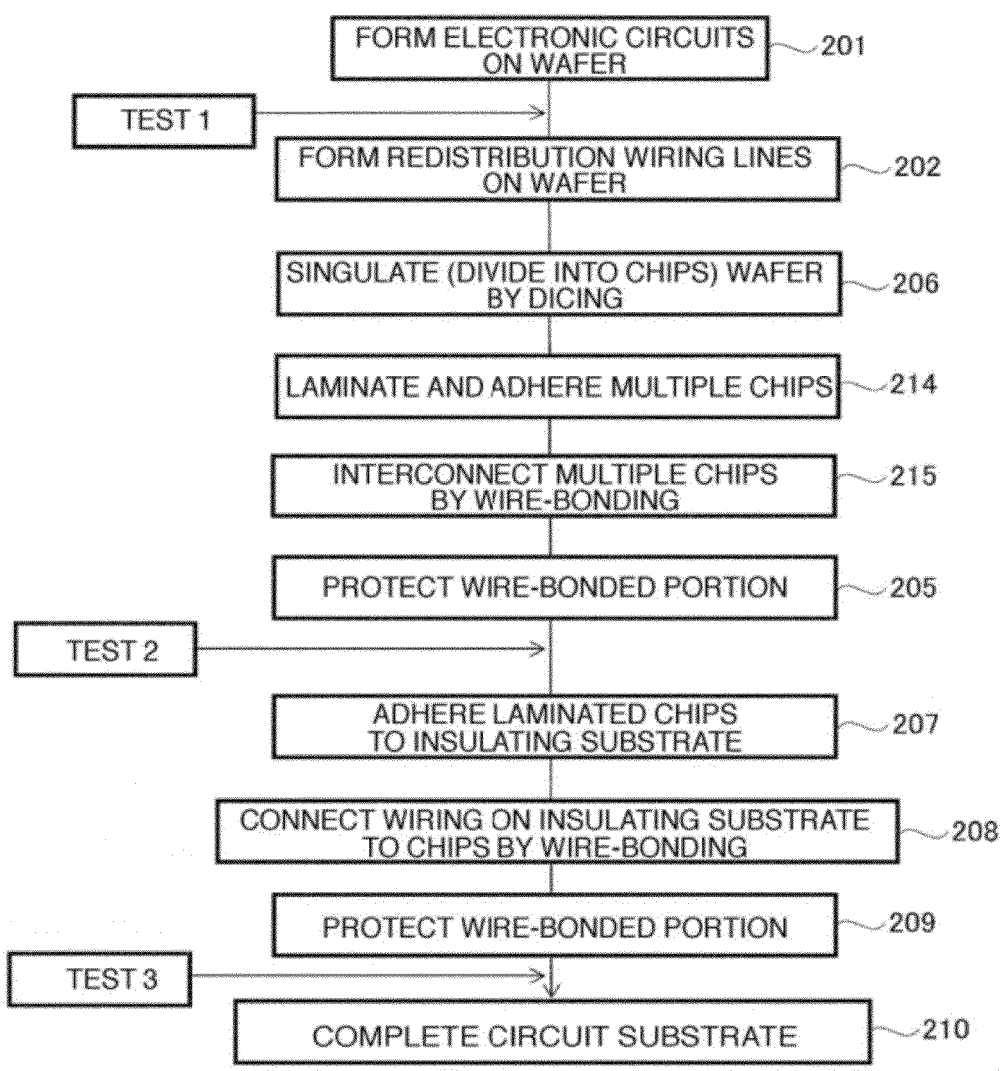
FIG. 40 shows a cross-sectional view illustrating the manufacturing flow of the semiconductor device and electronic system of FIG. 36.

The method of manufacturing the semiconductor device and electronic system according to this embodiment will be described next. FIG. 38 depicts the first manufacturing method, FIG. 39 the second manufacturing method, and FIG. 40 the third manufacturing method. Manufacturing methods 1 through 3 share FIG. 24 through 27.

The first manufacturing method (FIG. 38) corresponds to FIGS. 28-33. In Step 201, an electronic circuit is formed on a wafer. In this step, it is formed using a photolithographic process (resist coating, exposure, development, resist stripping) as described above. It is sometimes acquired from different vendors. In Step 202, the redistribution wiring lines and the like are formed on the above-described wafer characteristic of the present application. In Step 203, various chips are laminated using a bonding material, etc., on the wafer (circuit substrate) that has the redistribution wiring lines formed thereon. After forming epoxy or silicone resin that'contains added metal powder serving as a (paste-like) die-bonding agent on the wafer by a printing process, various chips are mounted thereon and the resin is cured. In Step 204 (first bonding wire step), the laminated chips and the wafer are connected using bonding wires (wire-bonded). In Step 205 (first bonding wire-protecting film formation step), the bonding wire region is covered with a protective film. The protective film is produced by potting with an organic coating agent and curing it. In Step 206, the wafer is diced, thereby separating it into multiple laminated chips. In Step 207, they are connected to the insulating substrate 50 of the semiconductor device using a bonding agent, etc. The bonding agent may be, for instance, a (paste-like) die-bonding agent made up of an epoxy or silicone resin containing added metal powder and the like. In Step 208 (second bonding wire step), the laminated chips and the wiring 51 on the insulating substrate are connected using bonding wires. In Step 209 (second bonding wire-protecting film formation step), at least the bonding wire region is covered with a protective film. The protective film is produced by potting with an organic coating agent and curing it. The region comprising the laminated chips is preferably covered with a protective film. In Step 210, a visual inspection etc. is performed and the fabrication of the semiconductor device (semiconductor circuit) is completed. It should be noted that there are two bonding wire steps and there are two insulating films covering the bonding wires. In the process of testing, it is preferable to use three testing steps. In the first testing step (Test 1), the electronic circuit formed on the wafer is subjected to testing. The first testing step may be performed subsequent to Step 202. Alternatively, a test is performed after Step 201 and, furthermore, another test is performed after Step 202. This makes it possible to distinguish whether or not there are defects in the redistribution wiring lines formed in Step 202. In the second testing step (Test 2), the multiple laminated electronic circuits are subjected to testing. The second testing step may be performed subsequent to Step 204. This is done because the bonding wires may be adjusted (repaired) or redundant bonding wires (not shown) may be provided depending on the test results. In the third testing step (Test 3), the entire semiconductor device is subjected to testing. The third testing step may be performed subsequent to Step 208. This is done because the bonding wires may be adjusted (repaired) or redundant bonding wires (not shown) may be provided depending on the test results. In this series of consecutive steps, the significance of using bonding wires comprises in the fact that even if the coordinates of the pick-up electrode (internal terminal electrode) 2 of chips 1 through 5 change as a result of design modifications and the like, it is possible to implement flexible connections that permit adjustments by changing the length of the bonding wires.

The second manufacturing method (FIG. 39) corresponds to FIGS. 34-35. Only the differences from the first manufacturing method will be described in detail. Step 206 is used after Step 202. Step 211 is used after Step 206. Steps 212 and 213 are used in succession after Step 211. In other words, after Step 202, Steps 203 through 205 are eliminated, and Step 206 is used. In the same manner as in FIG. 34, Step 211 discloses in laminating all the chips on the insulating substrate 50. In Step 212 (third bonding wire step), the wiring 51 on the insulating substrate is connected to all the laminated chips and these chips are interconnected in a single bonding step. In Step 213 (third bonding wire-protecting film formation step), at least the bonding wire region is covered with a protective film. As a result of these multiple steps, the semiconductor device can be implemented using a smaller number of steps than the number of steps used in the first manufacturing method. With regard to the testing steps, it should be noted that in the second manufacturing method their number is reduced to two testing steps. However, in this embodiment, a test may be performed after Step 201 and, furthermore, another test may be performed after Step 202. This makes it possible to distinguish whether or not there are defects in the redistribution wiring lines formed in Step 202. In addition, forming all the bonding wires in Step 212 not to be mandatory and the process of bonding wire formation may be divided into multiple steps. For example, first of all, it may be possible to form the bonding wires used to interconnect the chips, and, after that, in another step, it may be possible to form the bonding wires used for connecting the wiring lines 51 on the insulating substrate to the chips.

The third manufacturing method (FIG. 40) corresponds to FIG. 36. Only the differences from the first manufacturing method will be described in detail. Step 206 is used after Step 202. Steps 214 and 215 are used in succession after Step 206. In other words, the process of Step 206, which involves dicing the wafer, is moved to an earlier step than in the first manufacturing method. As a result, a bonder commensurate with the size of the chip, which is cheaper and smaller than the expensive and large bonders commensurate with the size of the wafer, can be use as a bonder for bonding wires. It should be noted that Step 214 involves laminating multiple chips diced from respective wafers. Step 215 discloses in connecting the chips using bonding wires. Furthermore, the first testing step (Test 1) may be carried out after Step 206.

The respective manufacturing methods 1-3 have different advantages. Semiconductor device manufacturers are not supposed to manufacture all of the chips 1 through 7. Furthermore, the redistribution wiring lines may sometimes be fabricated by different manufacturers. Manufacturing methods 1 through 3 provide various manufacturing methods handled by these multiple manufacturers. For example, Tests 1 through 3 may help clarify the delivery responsibilities of the various manufacturers.

While a preferred embodiment of the inventive first semiconductor device and electronic system has been described above, the present invention, without being limited to the above-described embodiment, permits various modifications that do not depart from the gist of the present invention. As will be readily appreciated, these modifications also fall within the scope of the invention.

For example, in the same manner as in FIG. 2 and FIG. 3B, the second end portion 21b may include the wiring layer 22 (second wiring layer). The manufacturing conditions of the bonding wires changing into the solder balls 9 may sometimes be relaxed. If the second end portion 21b is double-layered (first and second wiring layers), the mechanical stress produced by the bonder during bonding can be alleviated. In other words, a certain leeway can be introduced into the pressure settings used by the bonder during wiring.

In addition, in the sixth and seventh chip, the choice of the structure used for connecting to the wiring layers 51 is not essential. If this is the structure of FIG. 2, in this structure connection to the insulating substrate 50 is effected in a flip-chip fashion. In addition', if this is a structure obtained by eliminating the solder balls 9 and wiring lines 6, 7 from FIG. 2, it can be included in the manufacturing process (bonding step, wire-bonding step) of the semiconductor device of the present application.

The power supply lines supplying from the insulating substrate 50 to chips 1 through 7 can be employed by applying the characteristics of the redistribution wiring lines disclosed herein on a mutatis mutandis basis.

In addition, naturally, the semiconductor device may be constituted by a first system only, which is comprised of the first, second, and sixth chips, as well as by a second system comprised of the third, fourth, fifth, and seventh chips, or a second system comprised of the third, fifth, and seventh chips. The appearance, shape, and functionality of the semiconductor device are not essential. Accordingly, while the first system was exemplified by a system based on a NAND flash memory, the memory is not limited to non-volatile memory and may be a volatile memory, or a combination thereof, and, moreover, has no limitations in terms of memory functionality.

In addition, the semiconductor device may possess functionality whereby the first system and second system would perform mutually related data processing. For example, various constructions are contemplated, e.g. one, in which connection to the first and second chip is effected using bonding wires through the medium of redistribution wiring lines formed on the surface of the third chip, or one, in which redistribution wiring lines formed on the surface of the first chip are connected to redistribution wiring lines formed on the surface of the third chip and the third, fourth, and fifth chip using bonding wires, etc.

For example, the sixth semiconductor device is illustrated in FIG. 58. In a thirteenth structural form, the pick-up electrode (internal terminal electrode) 2 (F13) is connected to the second end portion 21b (G18) by a bonding wire 1. The second end portion 21b (G18) is connected to the second end portion 21b (G19) through the redistribution wiring portion 21c. The second end portion 21b (G19) is connected to the second end portion 21b (G20) by the bonding wire 2. The second end portion 21b (G20) is connected to the second end portion 21b (G21) through the redistribution wiring portion 21c. The second end portion 21b (G21) is connected to the insulating substrate wiring line 51 (e-1) by the bonding wire 3. The insulating substrate wiring line 51 (e-1) can be replaced by a lead portion of a lead frame, which is discussed below. The bonding wire 2 is a jumper wire connecting redistribution wiring layers. The pick-up electrode (internal terminal electrode) 2 (F13) may be a pick-up electrode (internal terminal electrode) 2 of the third chip. In such a case, the second end portion 21b (G18) is replaced with the first end portion 21a (G18). Jumper wires can be incorporated into any of the above-described structural forms 1-12.

Figure 41:
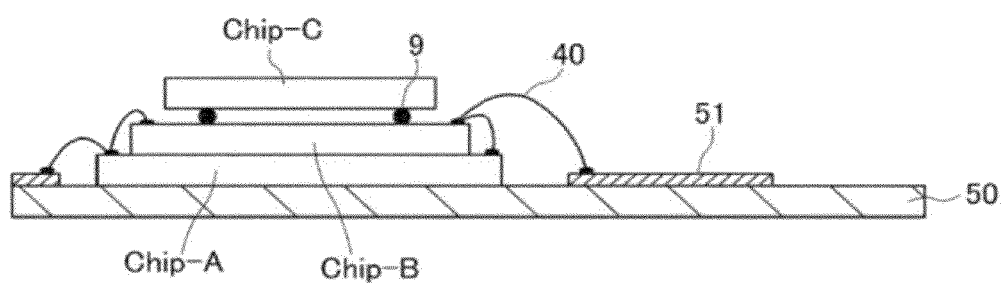
FIG. 41 shows a schematic view illustrating an example, in which some electrical connections between the chips are implemented using flip-chip bonding.

In addition, while in the above-described embodiments all the electrical connections between the chips are implemented using bonding wires, the present invention is not limited thereto and some of the electrical connections between the chips may be implemented using flip-chip connections. An example, in which some electrical connections between the chips are implemented using flip-chip connections, is illustrated in FIG. 41. In the example illustrated in FIG. 41, the chip Chip-B is mounted on the chip Chip-A and, furthermore, the chip Chip-C is mounted on the chip Chip-B. Among the above, the chip Chip-A and the chip Chip-B are mounted in a face-up orientation, in which the top portion is the primary surface, and the chip Chip-C is mounted in a face-down orientation, in which the bottom portion is the primary surface. In addition, the chip Chip-A and wiring lines 51, the chip Chip-B and wiring lines 51, and the chip Chip-A and the chip Chip-B are electrically connected by bonding wires 40. On the other hand, the chip Chip-B and the chip Chip-C are electrically connected using flip-chip connections utilizing solder balls 9. The present invention can also include the following configuration. At least one of the chips Chip-B and Chip-C has the redistribution wiring layer characteristic of the present application formed on the surface of the chip. The structure of the chip Chip-C is illustrated in FIG. 2. The structure of the chip Chip-B includes, for instance, a wiring line 42 provided on the surface of the first chip illustrated in FIG. 23. The solder balls 9 are connected to the wiring line 42. When used in at least one of the chips, the features of the present application allow for a substantial cost reduction to be implemented.

Figure 42:
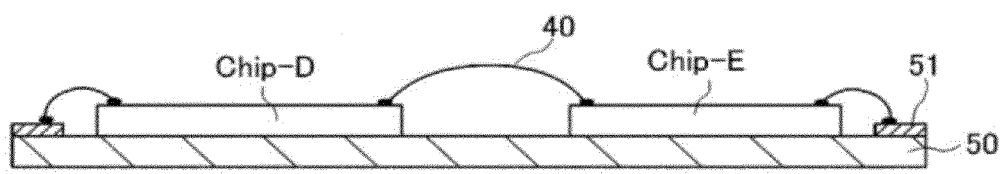
FIG. 42 shows a schematic view used to illustrate connections between multiple non-laminated chips.

Furthermore, while the above-described embodiments described connections between multiple laminated chips, the embodiments that have been disclosed is applicable even to connections between multiple chips that are not laminated. For example, as shown in FIG. 42, with the chip Chip-D and Chip-E mounted on the upper face of the insulating substrate 50, the chip Chip-D and wiring lines 51, the chip Chip-E and wiring lines 51, as well as the chip Chip-D and the chip Chip-E can be electrically interconnected using bonding wires 40. The present invention can also include the following configuration. At least one of the chips Chip-D and Chip-E has a redistribution wiring layer characteristic of the present application formed on the surface of the chip. The bonding wires 40 are connected to the redistribution wiring lines, of the chip Chip-D or the chip Chip-E. For example, the bonding wires 40 connect the redistribution wiring layer formed on the surface of the chip Chip-D to the redistribution wiring layer formed on the surface of the chip Chip-E. The redistribution wiring layer formed on the surface of the chip Chip-D is connected to the chip pick-up electrode (internal terminal electrode) of the chip Chip-E. The bonding wire 40 may interconnect multiple redistribution wiring layers formed on the surface of the chip Chip-D.

Furthermore, while the above-described embodiment provided an example, in which multiple semiconductor chips were mounted on the insulating substrate 50, the substrate, on which the semiconductor chips are mounted, is not limited to the insulating substrate, and may be any electrically conductive substrate, e.g. a lead frame, and the like. The present invention can also include the following configuration.

Chapter 3 will be described next. The following is a description of semiconductor devices 2 through 5 of this embodiment, as well as their manufacturing methods. The structure and method of manufacturing of semiconductor devices 2 through 5 related to this circuit substrate are described with reference to FIGS. 43-57.

Figure 43:
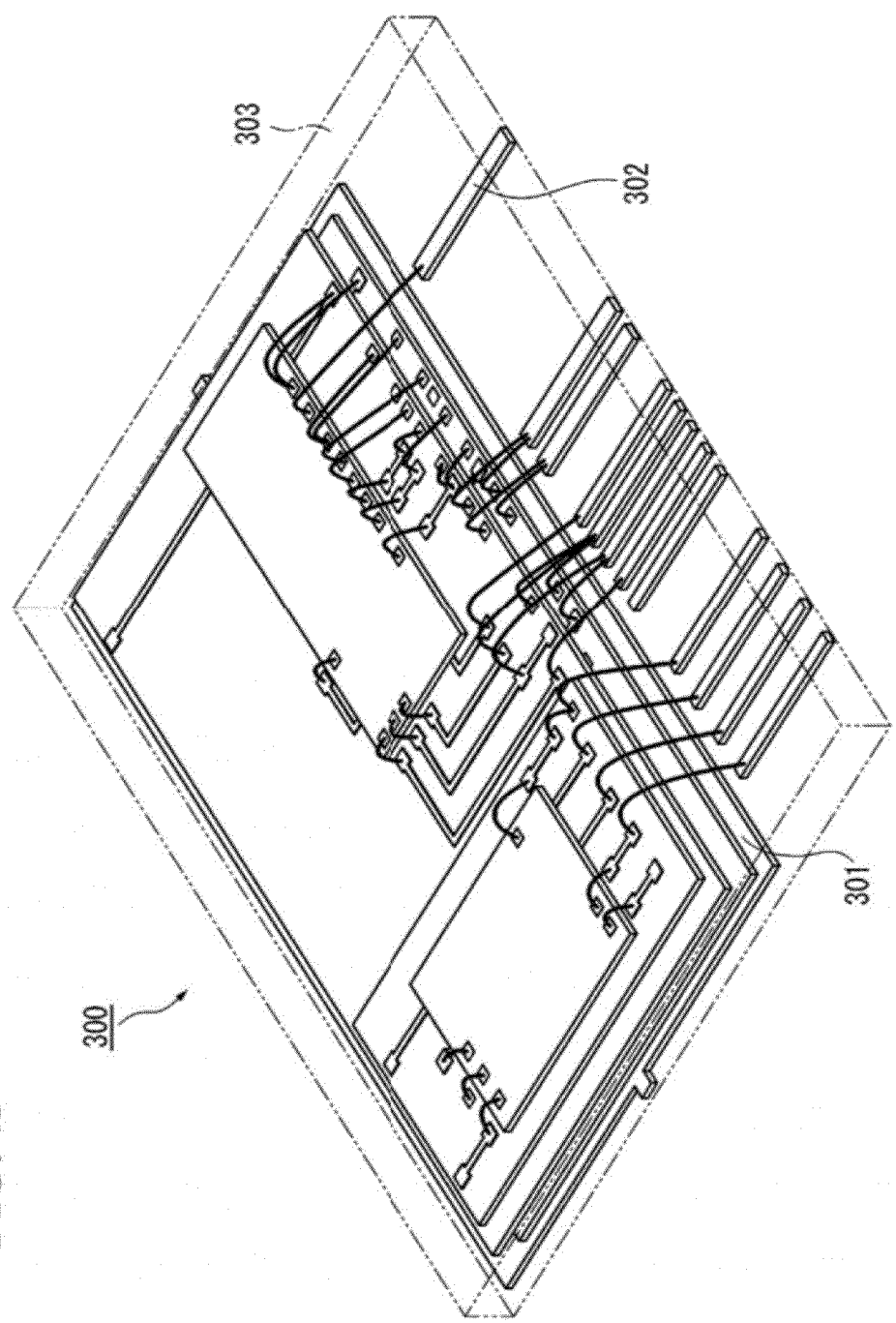
FIG. 43 shows a bird's eye view illustrating a second semiconductor device according to the present invention.

FIG. 43 is a bird's-eye view of a schematic structural diagram that illustrates the structure of the second semiconductor device (containing multiple chips) according to a preferred embodiment of the present invention. It should be noted that in the description of Chapter 3 the second semiconductor device may be referred to simply as "the semiconductor device". The description of the parts identical to the first semiconductor device is omitted in the description of the second semiconductor device, and their reference numerals are omitted as well in order to simplify the drawings.

Figure 54:
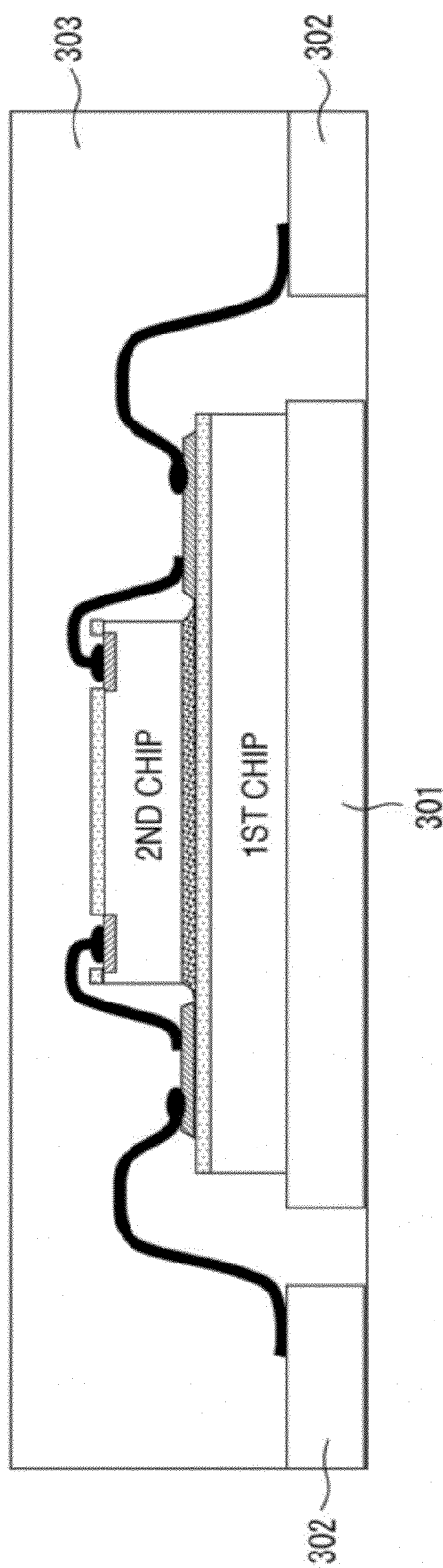
FIG. 54 shows a cross-sectional view illustrating a variation of the second semiconductor device according to the present invention.

As shown in FIG. 43, the semiconductor device 300 according to this embodiment contains semiconductor chips 1 through 5 provided in the above-described semiconductor device 1 and multiple bonding wires associated therewith. The difference from the first semiconductor device is that the sixth and seventh chips, insulating substrates 50, 52 (semiconductor device substrate and system substrate), and multiple insulating substrate wiring lines 51 (a, b, d, e, f, g) are not included. The second semiconductor device has a metallic stage 301 used for mounting chips 1 through 5; multiple metallic leads 302 consisting essentially of the same material as the stage and connected to multiple bonding wires; and encapsulant 303 encapsulating them. It should be noted that, in the same manner as in FIG. 54, the encapsulant 303 does not cover the back surface of the stage (the surface opposed to the primary surface, on which the multiple chips are mounted) or the back surface of the leads (the surface opposed to the primary surface contacted by the bonding wires). A portion of the back surface of the leads (preferably at the edge of the encapsulant opposite the chip edges) is used for the external terminals of the second semiconductor device. When this second semiconductor device is mounted on metallized wiring lines and the like on a system motherboard, a portion of its back surface is used as contact points connected using solder and the like. The length of the nodes of the leads, with which the bonding wires are in contact, and the nodes of the external terminals of the leads is random. It is not necessary for the encapsulant to be located on one side. The stage is not necessary either. It should be noted that FIG. 54, which is a variation of the second semiconductor device, is a cross-sectional view of the portion that has to do with the first and second chips. Although no connections between the internal terminal electrodes (chip pick-up electrodes) of the first chip and the redistribution wiring lines are disclosed in this cross-sectional view, they are similar to FIG. 21, FIG. 23, as Well as the hereinafter described FIG. 55. In FIG. 54, the leads, which serve as the external terminals of the semiconductor device, are on two sides. They may be on four sides. The leads are partially exposed on the bottom and side faces. The stage 301 has its back surface (bottom surface) in contact with the system motherboard and serves as a heat sink. If the bonding agent between the stage 301 and the first chip is electrically conductive, the substrate potential of the first chip can be applied from the motherboard. When electric and thermal connection to the motherboard is not desired, the back surface of the stage 301 may be subjected to insulation treatment.

Figure 44:
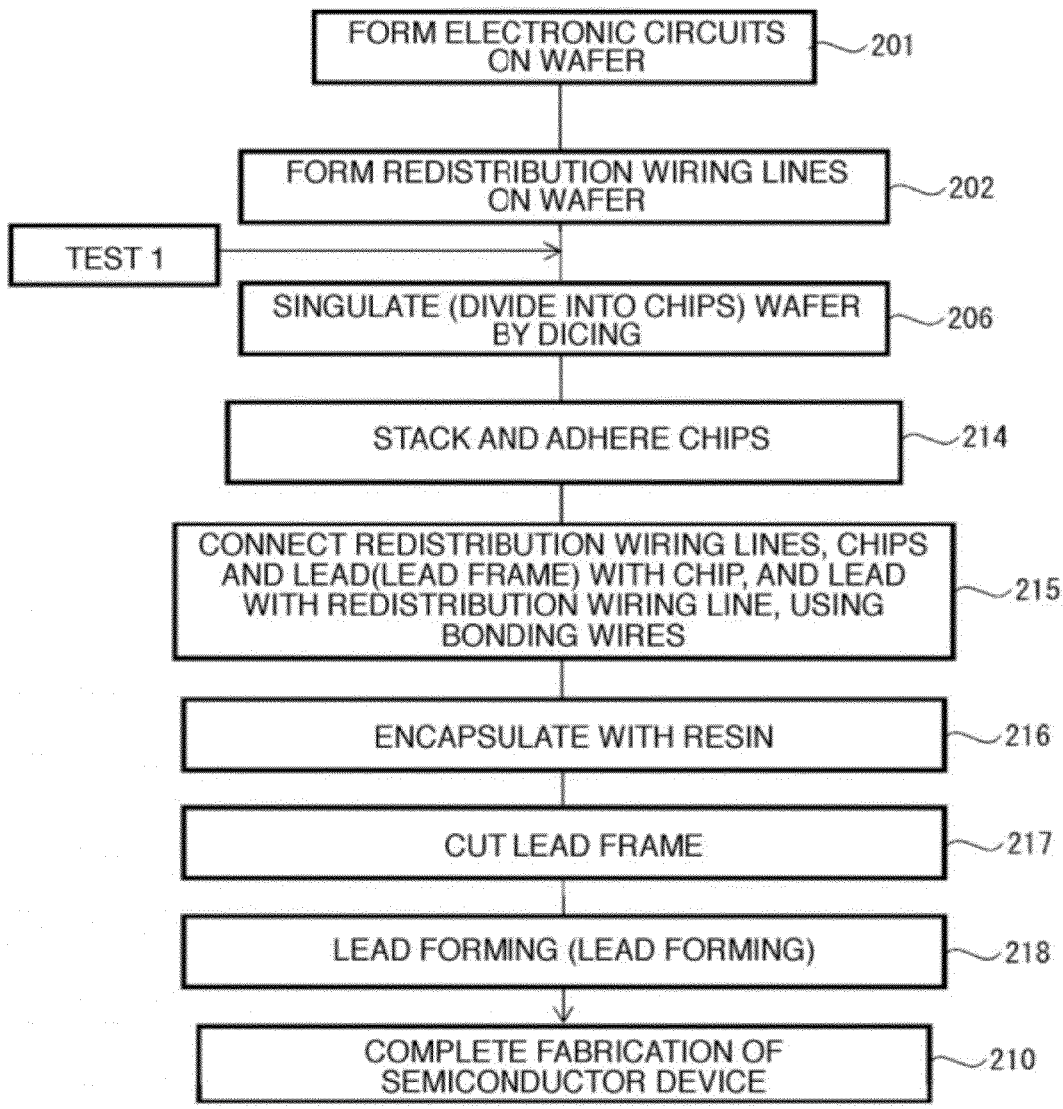
FIG. 44 shows a manufacturing flow (fourth manufacturing method of the present invention) of the semiconductor device of FIG. 43.

The manufacturing flow (fourth manufacturing method) of the second semiconductor device is shown in FIG. 44. The fourth manufacturing method corresponds to FIGS. 47-53. Only the differences from FIG. 39 (the second manufacturing method) will be described in detail. Steps 214 and 218 are used in succession after Step 206. Step 214, which involves stacking/laminating and adhering/bonding multiple chips to a lead frame (stage), corresponds to FIGS. 47-51. Step 215, which involves interconnecting multiple chips, as well as the wiring lines (leads) of the lead frame and the chips using bonding wires, corresponds to FIG. 52. Step 216, which involves encapsulation with resin, corresponds to FIG. 53. Step 217, which involves cutting the lead frame, is not shown. Step 218, which involves lead frame forming (lead forming), corresponds to FIG. 56. The forming process includes in bending leads exposed on the exterior of the encapsulant into a specified shape required by the customer based on manufacturing methods used to populate various systems such as motherboards. It should be noted that Step 218 is omitted for the respective semiconductor devices depicted in FIG. 43, FIG. 54, and FIG. 55.

Figure 47:
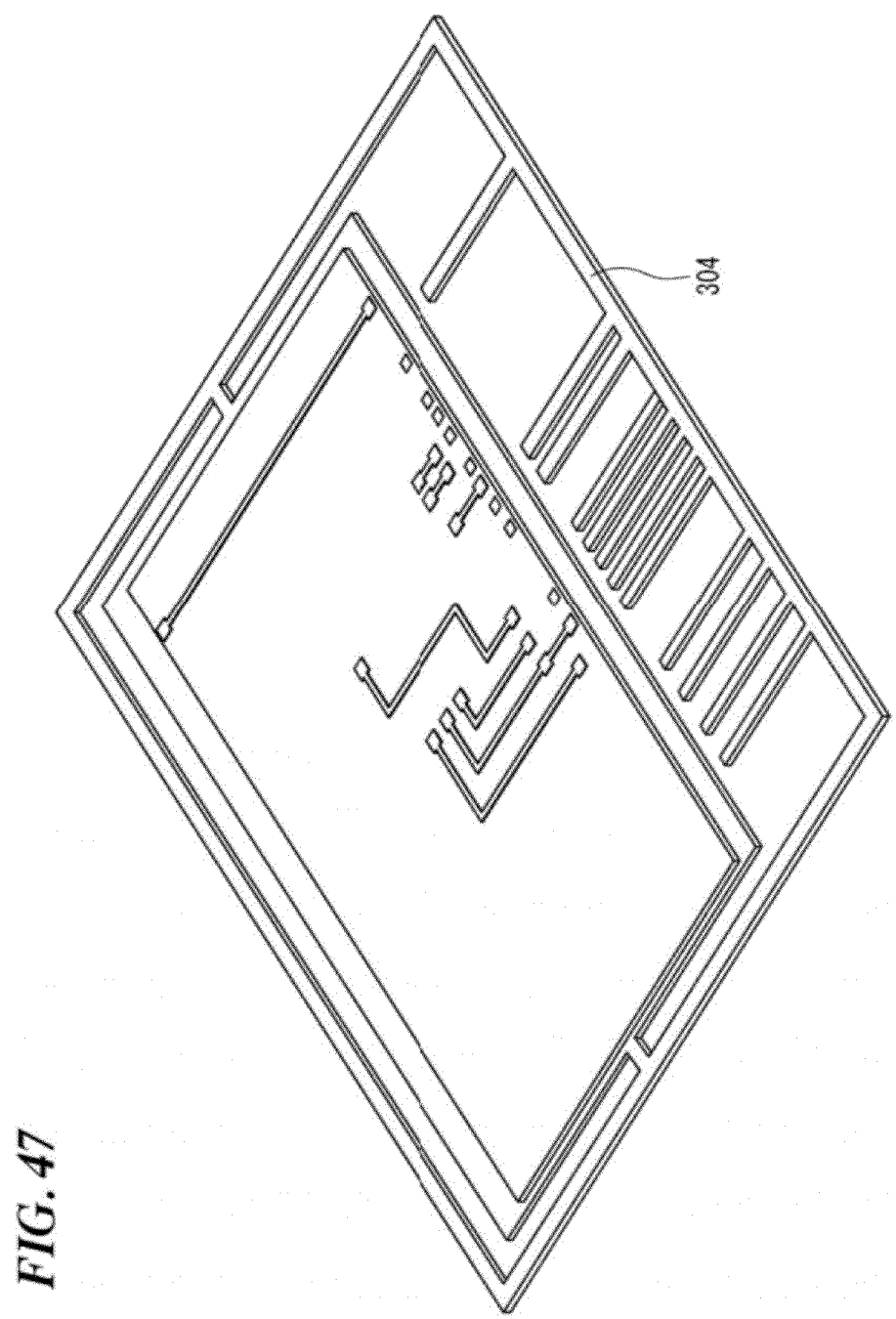
FIG. 47 shows a bird's eye view illustrating the second semiconductor device in the first manufacturing step according to the fourth manufacturing method of the present invention.
Figure 48:
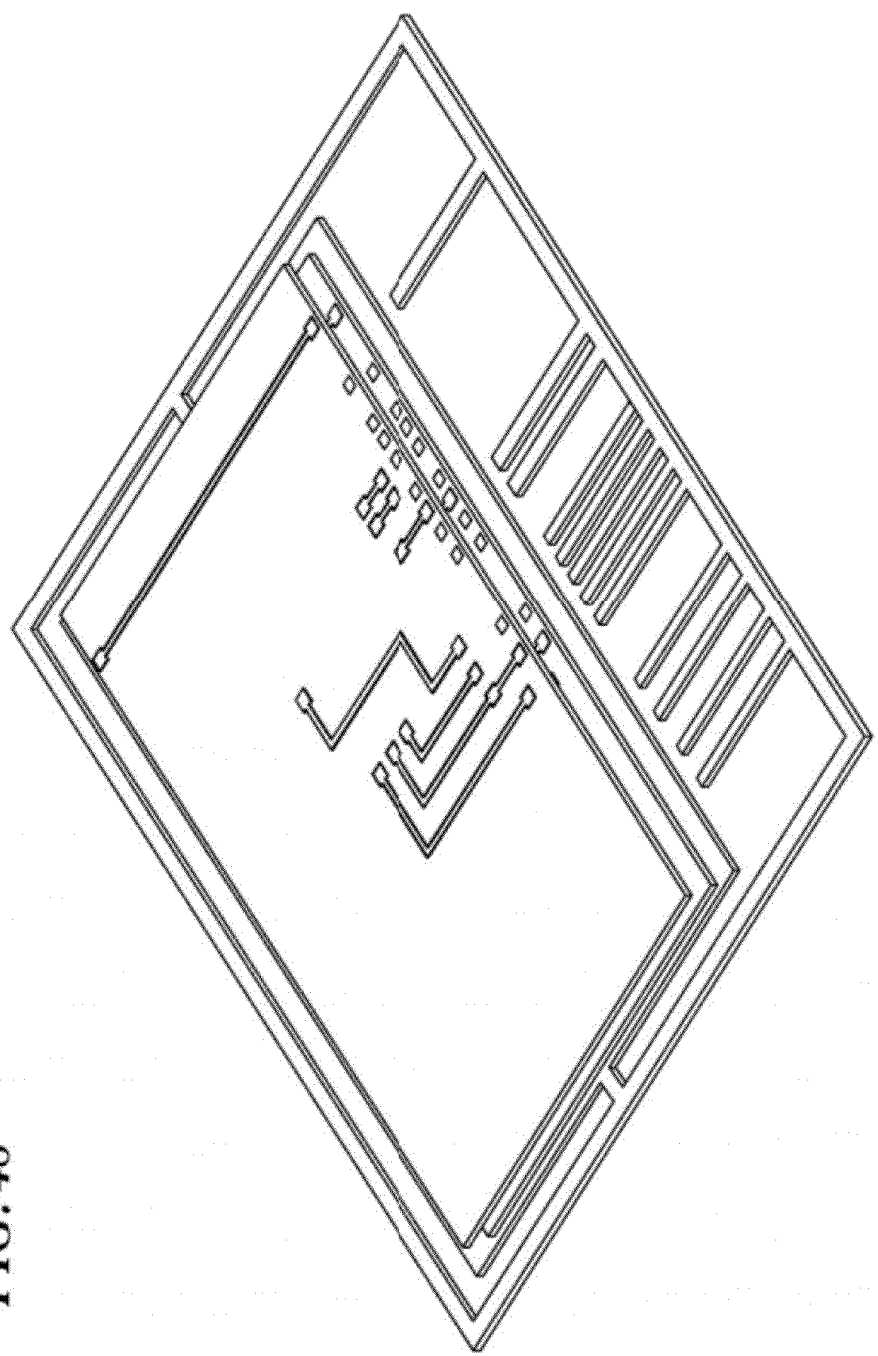
FIG. 48 shows a bird's eye view illustrating the second semiconductor device in the second manufacturing step according to the fourth manufacturing method of the present invention.
Figure 49:
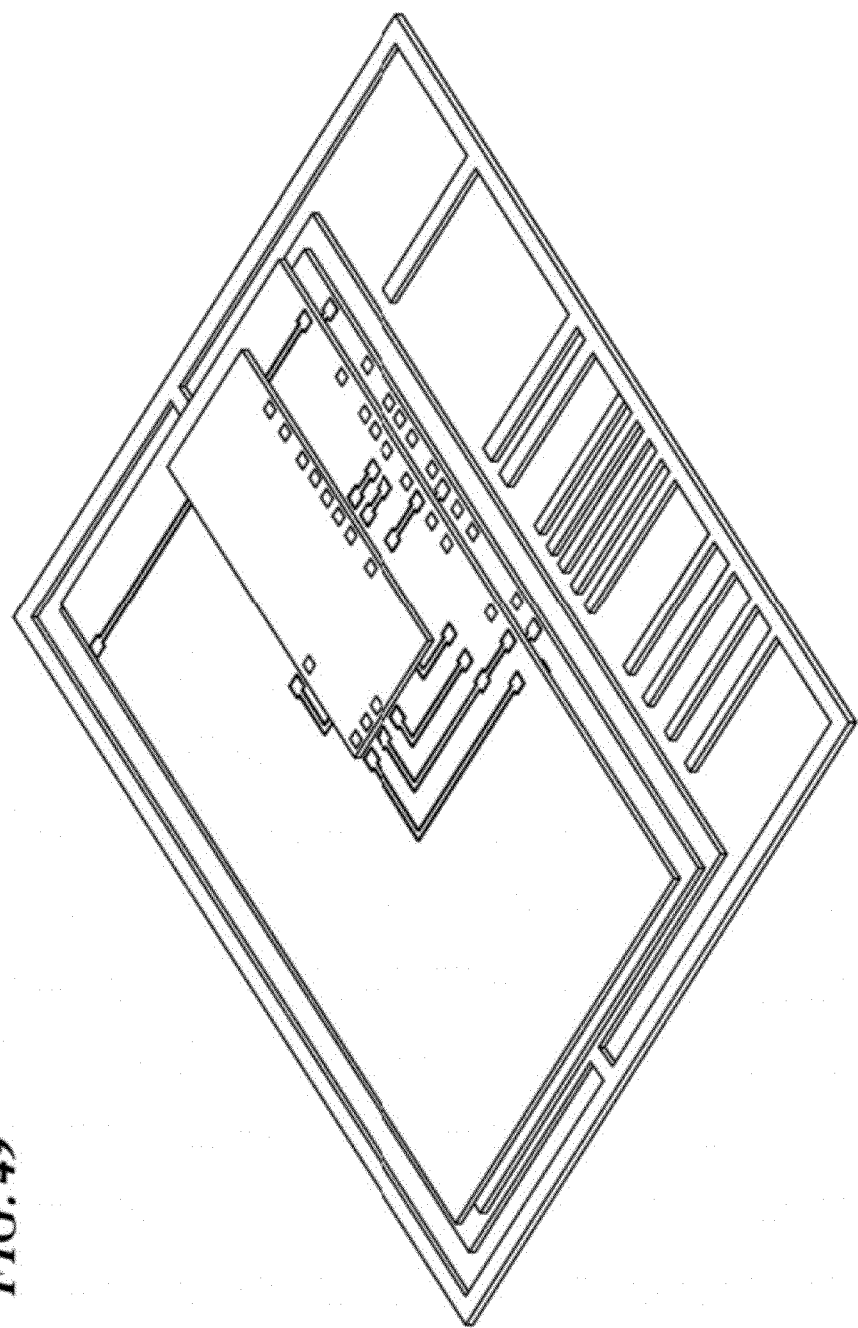
FIG. 49 shows a bird's eye view illustrating the second semiconductor device in the third manufacturing step according to the fourth manufacturing method of the present invention.
Figure 50:
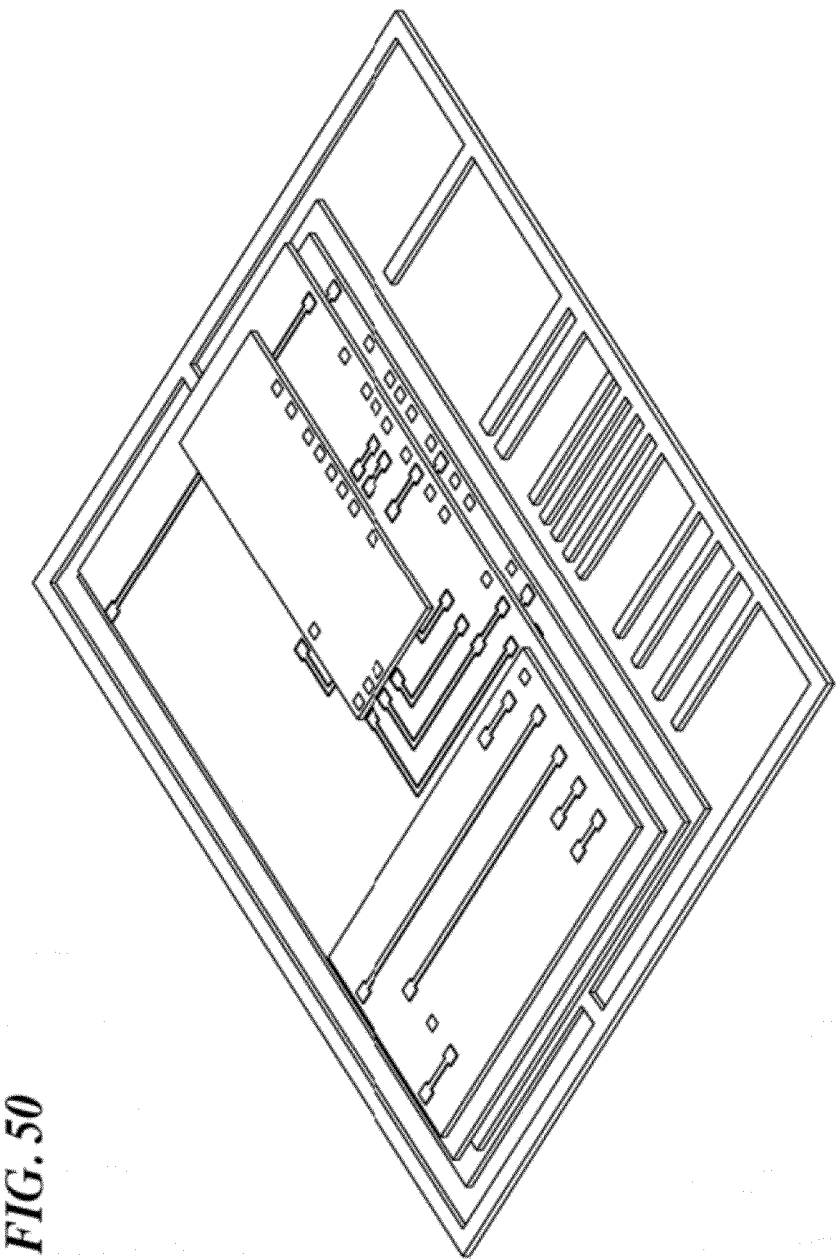
FIG. 50 shows a bird's eye view illustrating the second semiconductor device in the fourth manufacturing step according to the fourth manufacturing method of the present invention.
Figure 51:
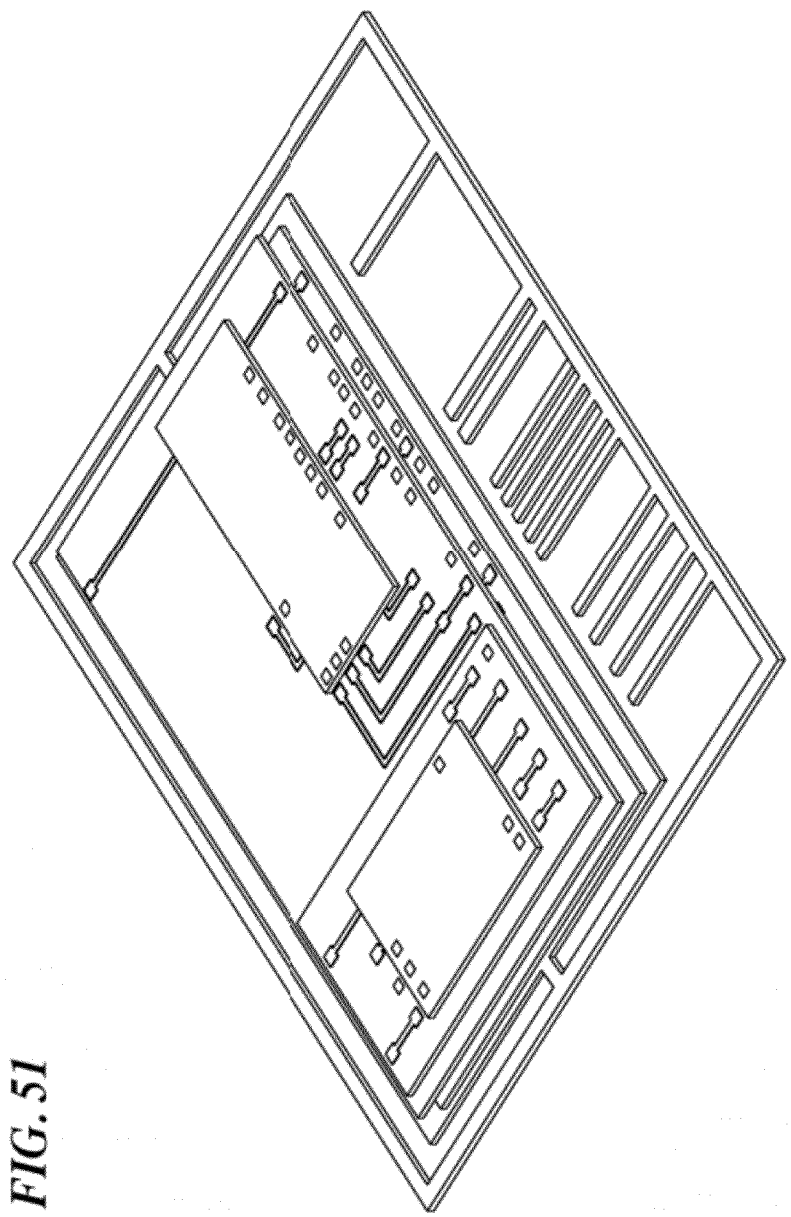
FIG. 51 shows a bird's eye view illustrating the second semiconductor device in the fifth manufacturing step according to the fourth manufacturing method of the present invention.

Step 214 is described below. In FIG. 47, the fourth chip is mounted on the stage 301 using a bonding agent, etc. FIG. 48 is a view illustrating the third chip laminated on the fourth chip using a bonding agent, etc. FIG. 49 is a view illustrating the fifth chip laminated on the third chip using a bonding agent, etc. FIG. 50 is a view illustrating the first chip laminated on the third chip using a bonding agent, etc. FIG. 51 is a view illustrating the second chip laminated on the first chip using a bonding agent, etc. It should be noted that the chips 1 through 5 can be mounted on the stage after first laminating them together in advance. Furthermore, Step 214 can be omitted in the respective semiconductor devices of the hereinafter described FIG. 56 and FIG. 57. In such a case, a manufacturing device jig, etc. is used for the subsequent steps, in which connections are made using bonding wires. The jig may be a film.

Figure 52:
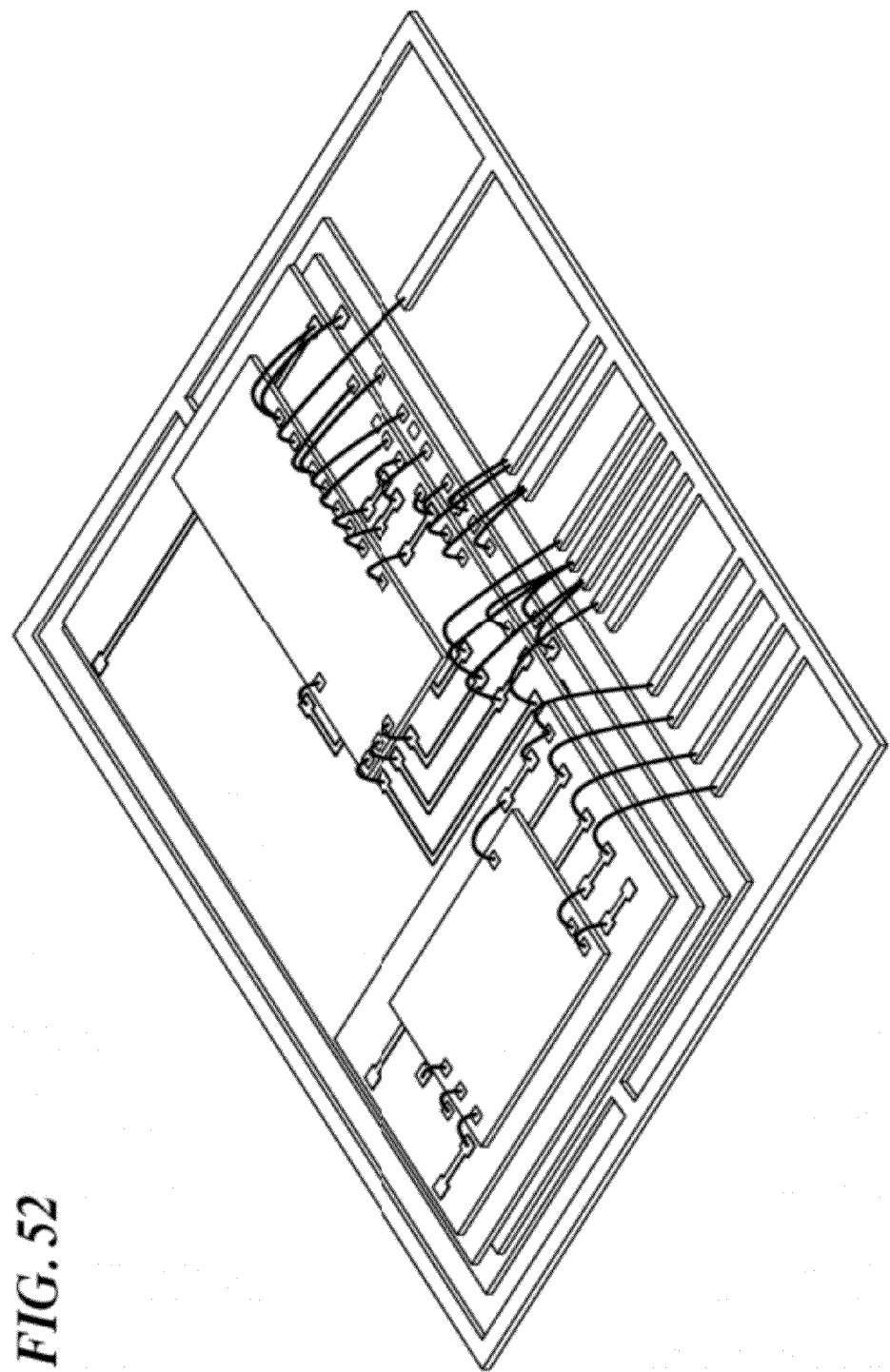
FIG. 52 shows a bird's eye view illustrating the second semiconductor device in the sixth manufacturing step according to the fourth manufacturing method of the present invention.

Step 215 is described below. In FIG. 52, the multiple leads 302, redistribution wiring line nodes and internal terminal electrodes (chip pads) of each chip are interconnected using bonding wires 40.

Figure 53:
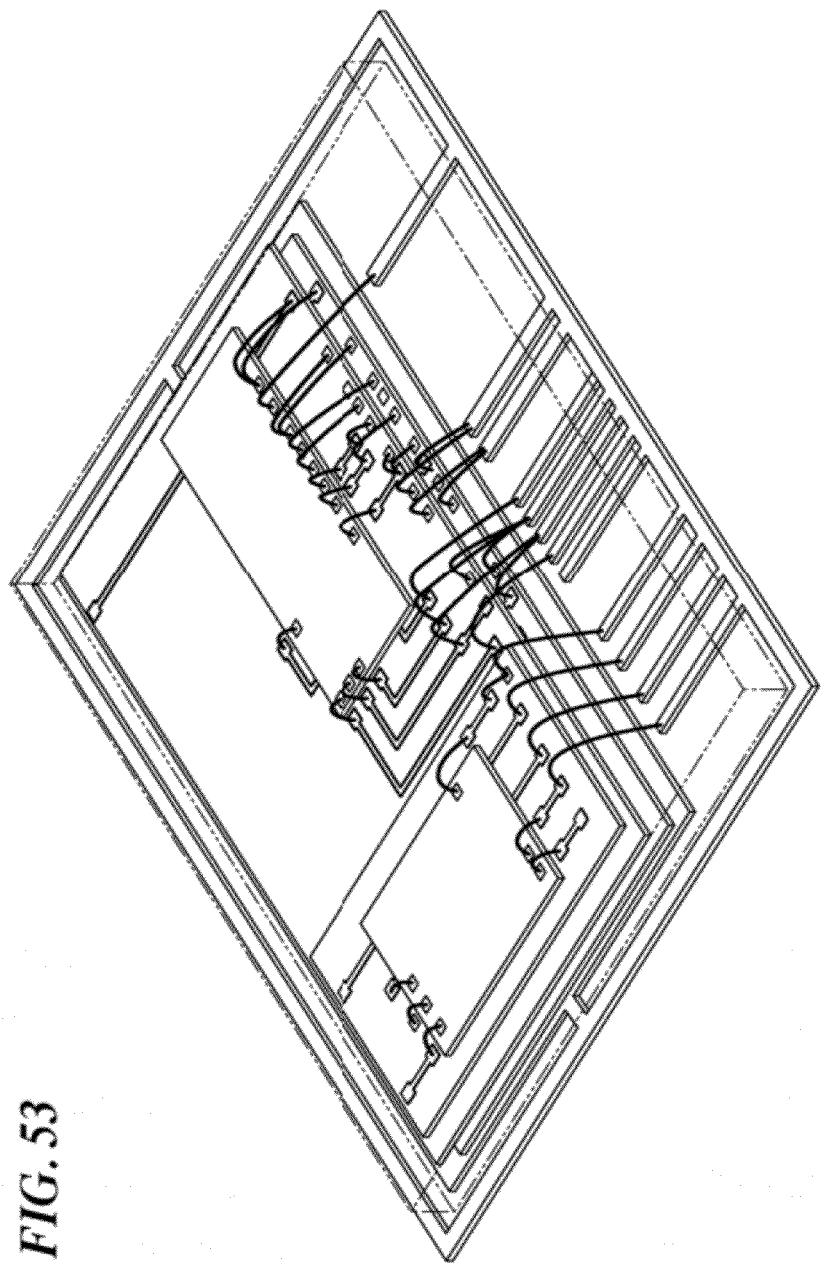
FIG. 53 shows a bird's eye view illustrating the second semiconductor device in the seventh manufacturing step according to the fourth manufacturing method of the present invention.

Step 216 is described below. In FIG. 53, the external shape of the semiconductor device is formed by molding after wire-bonding. The back surface of at least a portion of the leads 302 is not encapsulated.

Figures 45, 46:
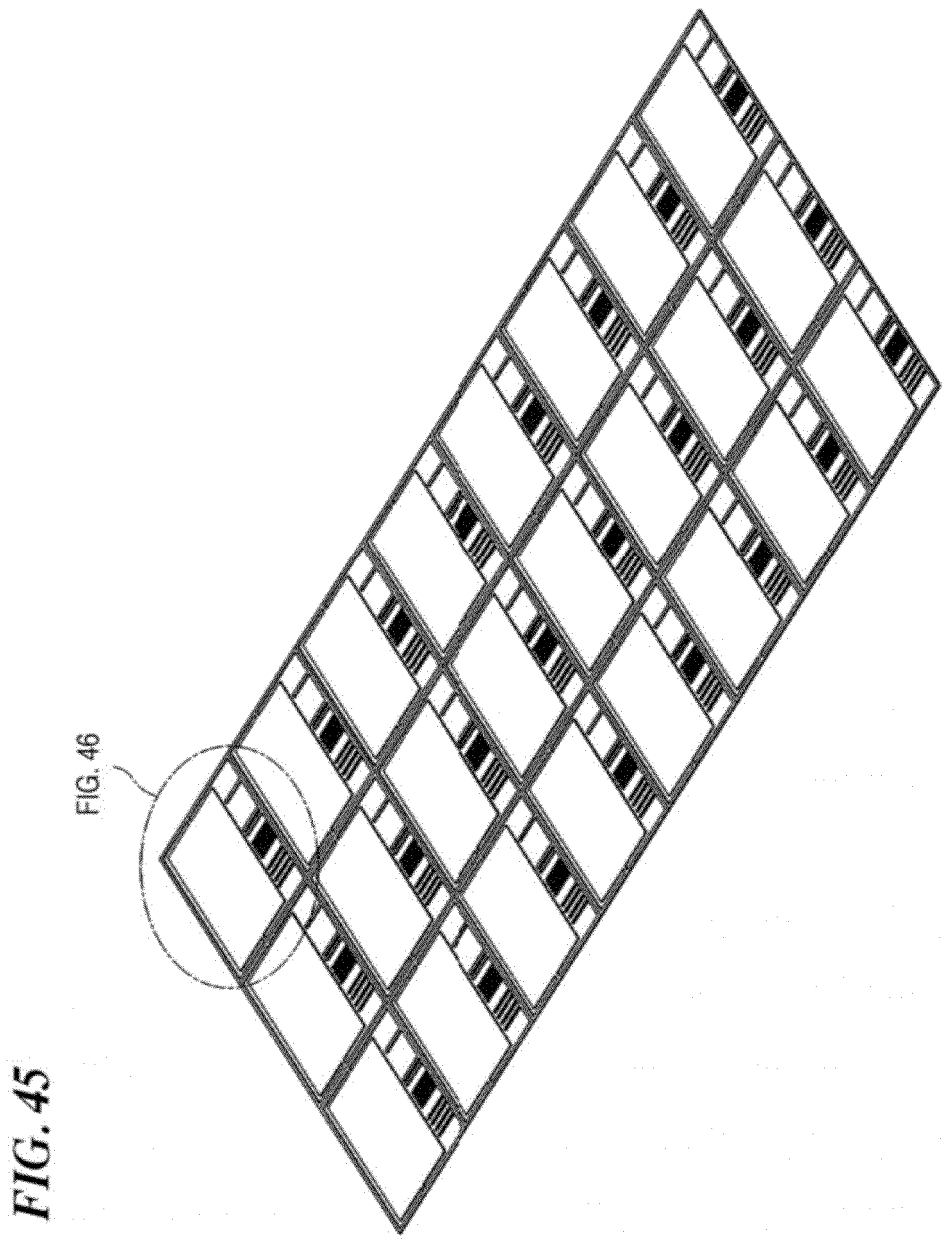
FIG. 45 shows a diagram illustrating a member used in the semiconductor device of FIG. 43.
FIG. 46 shows an enlarged view of the member of FIG. 45.
Figure 46:
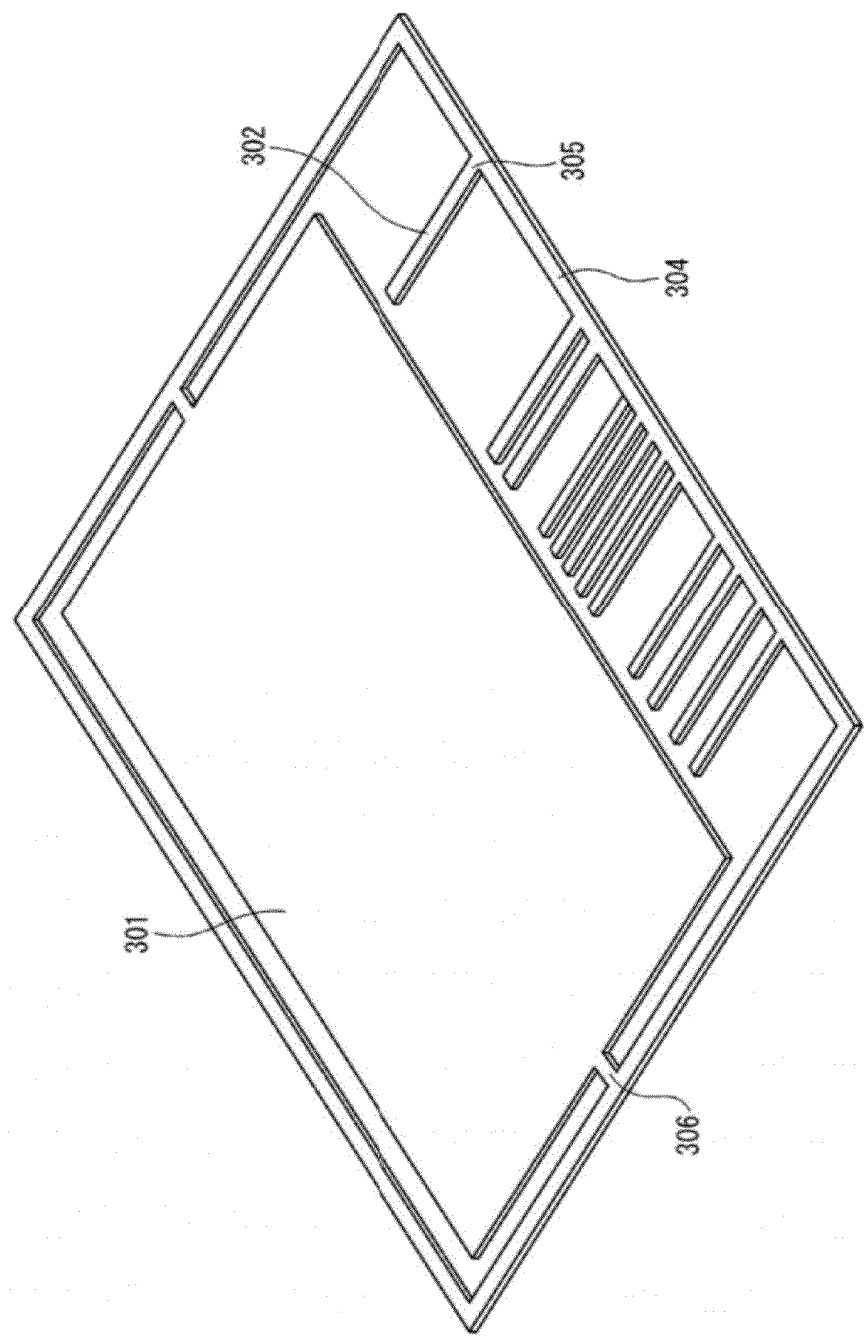
Figure 55:
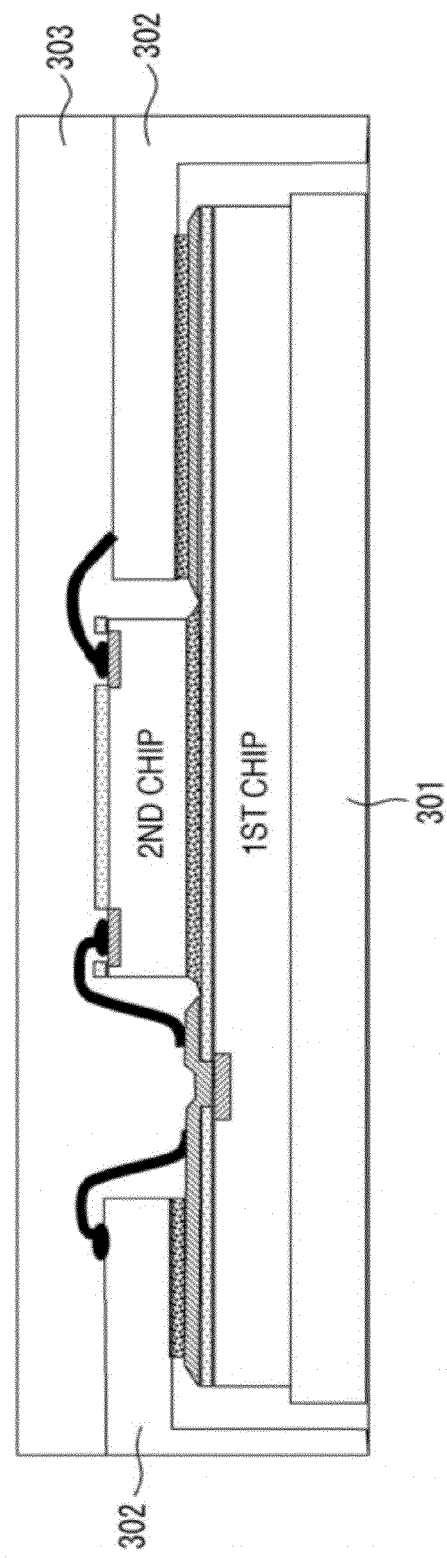
FIG. 55 shows a cross-sectional view illustrating a third semiconductor device according to the present invention.
Figure 56:
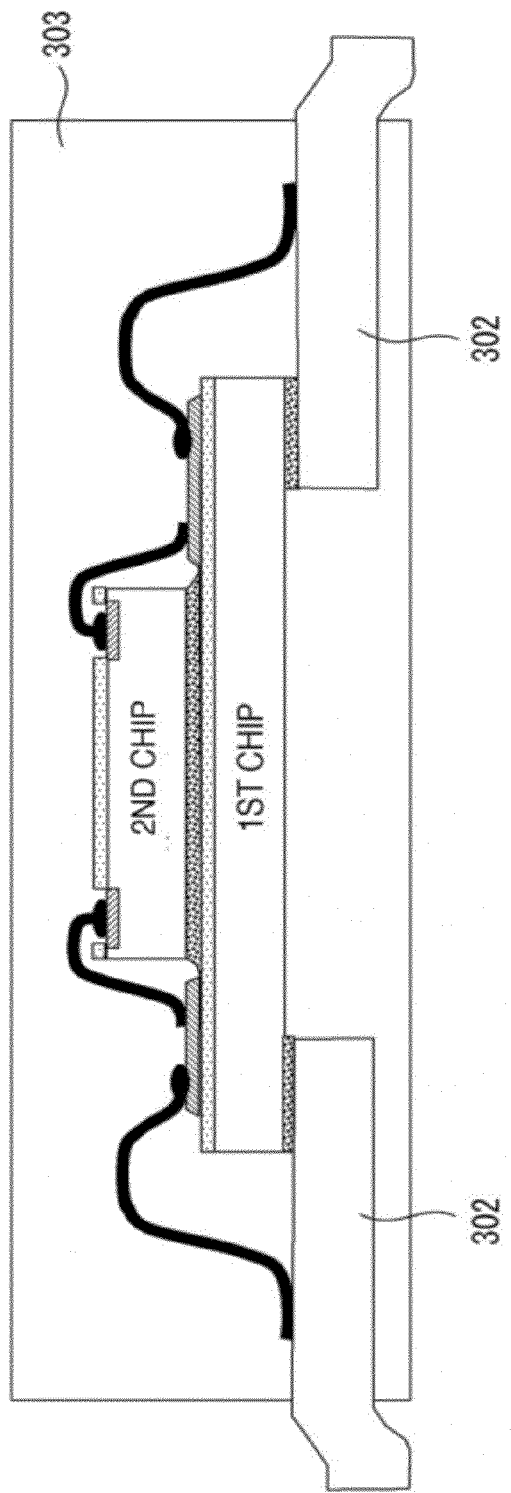
FIG. 56 shows a cross-sectional view illustrating a fourth semiconductor device according to the present invention.
Figure 57:
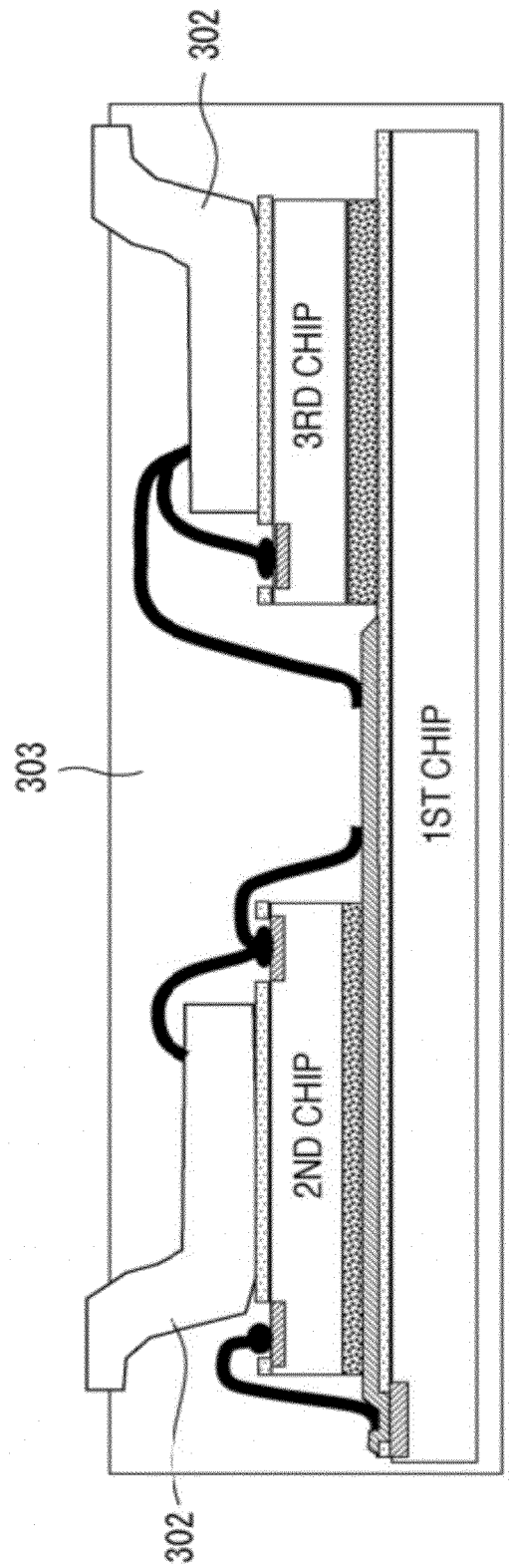
FIG. 57 shows a cross-sectional view illustrating a fifth semiconductor device according to the present invention.

FIG. 46 illustrates a metallic material corresponding to a single semiconductor device. For example, this is a final produce in the form of a card-shaped semiconductor device. The metallic material is an interface necessary for the semiconductor device for communication with the exterior. The interface also includes a power supply. The metallic material comprises a stage 301, multiple leads 302, a lead frame 304 that supports them, stage-interconnecting portions 306 connecting the stage with the leads and lead frame, and lead-interconnecting portions 305. The metallic material is normally comprised of a material of superior electrical conductivity, such as Kovar, No. 42 Alloy (42% Ni-iron), copper-based alloys, and the like. The thickness is preferably at least 100 micrometers. This is due to the fact that in the semiconductor devices 2 through 5 the leads ensure the rigidity of the entire semiconductor device. Furthermore, this is due to the need to support multiple chips in the hereinafter described semiconductor devices 3-5 (FIGS. 55-57). Sometimes the necessary portion is plated. A board made up of a metallic material of high mechanical strength is subjected to processing as depicted in FIG. 45 using stamping or an etch treatment process based on photolithographic techniques. FIG. 45 illustrates a first metallic material used for 24 semiconductor devices arranged in a grid-like configuration. The first metallic material is employed in above-described Step 214. Twenty four fourth chips are laminated on the first metallic material in a batch process. In Step 215, multiple leads corresponding to the 24 chips are connected using bonding wires. In the same manner, in Step 216, the twenty four fourth chips are batch processed.

Step 217 is described below. Once the 24 semiconductor devices have passed the manufacturing steps 214 through 216 on the first metallic material, multiple stage-interconnecting portions 306 and multiple lead-interconnecting portions 305 are cut by punching, etc., thereby completing the fabrication of the 24 second semiconductor devices.

Semiconductor devices 3 through 5 are described below. The respective cross-sectional views of the semiconductor devices 3-5 correspond to FIGS. 55-57. Only the differences from the second semiconductor device will be described below. The third semiconductor device (FIG. 55) has at least some of the leads 302 disposed on the first chip, with a bonding agent or another insulating material used in between. The stage 301 is not necessary and, in such a case, the first chip (with the second chip already laminated on the first chip) which is, as described above, adhered to a manufacturing device jig (film) etc. instead of the stage 301, is bonded to the leads 302 and then connected using bonding wires. The film may be stripped prior to the encapsulation step. The leads 302 may be bonded to the second chip. Bonding to the first chip and to the second chip is also possible. In the fourth semiconductor device (FIG. 56), chips are disposed on at least some of the leads 302, with a bonding agent or another insulating material used in between. The stage 301 is not used. The stage 301 may be provided on the back surface of the first chip. In the fifth semiconductor device (FIG. 57), some of the leads are bonded to the first and second chips (the front side, where the electronic circuitry is) and electrical connections are provided from these leads to the internal terminal electrodes (chip pick-up electrodes) of the first chip via the circuit substrate (redistribution wiring lines) formed on the surface of the first chip with the help of bonding wires. The external terminals of the leads can be of various shapes and can protrude, exposed, from the encapsulant. Various internal structures and methods of exposure of the external terminals, not shown, can be obtained using combinations of the respective features of the semiconductor devices 1-5.

While the preferable embodiments of the inventive semiconductor devices 2-5 have been described above.

The present invention, without being limited to the above-described embodiments, permits various modifications that do not depart from the gist of the present invention and, as will be readily appreciated, these modifications also fall within the scope of the invention.

For example, the fourth manufacturing method (FIG. 44) can be modified in the following manner. Step 203 in the first manufacturing method (FIG. 38) (bonding the chip to the wafer) can be interposed between Steps 202 and 206 in the fourth manufacturing method. In addition, in Step 114 in the fourth manufacturing method, the two chips that have been laminated already (the first chip and the second chip) are used as a single unit substrate (unit chip) and, in semiconductor devices, (FIG. 56, FIG. 57) that do not contain the lead frame stage 301, as described above, a manufacturing device jig (film) is used instead of the stage 301.

(Supplementary Notes)

Below, in the form of supplementary notes, the semiconductor device according to the present invention is disclosed in the form of supplementary notes.

<Supplementary Note A-1>

A method of manufacturing a circuit substrate, wherein, on a semiconductor substrate comprising internal terminal electrode, the circuit substrate forming external terminal electrode electrically coupling the internal terminal electrode to the exterior, the method comprising: masking, during which a metallic metal mask that has openings exposing a portion of the surface of the semiconductor substrate including the internal terminal electrode and is connected to the negative side is placed over the semiconductor substrate; film forming, during which metallic conductor layer is formed from positively charged ion particles by an ion plating process on the portion of the surface of the semiconductor substrate and on the metal mask; lift-off, during which the metal mask is stripped away, leaving a wiring line that is contained a wiring layer including the metallic conductor layer, the wiring line electrically coupled to the internal terminal electrode and formed on a portion of the surface of the semiconductor substrate; and forming, the external terminal electrode electrically coupled to the wiring line.

<Supplementary Note A-2>

The method of manufacturing a circuit substrate according to Supplementary Note A-1, wherein the semiconductor substrate comprises a internal wiring line that is finer than the wiring line of metallic conductor electrically coupled to the internal terminal electrode, the internal wiring line formed by a photolithographic process using a stepper.

<Supplementary Note A-3>

The method of manufacturing a circuit substrate according to Supplementary Note A-2, wherein the semiconductor substrate is a collective substrate obtained by repeatedly forming identical circuits, the method further comprising a cutting, during which individual unit substrates are produced by the cutting the collective substrate at least after performing the lift-off.

<Supplementary Note A-4>

The method of manufacturing a circuit substrate according to Supplementary Note A-3, wherein the cutting is performed after the external terminal electrode forming.

<Supplementary Note A-5>

The method of manufacturing circuit substrate according to Supplementary Notes A-3 or 4, wherein the collective substrate is a semiconductor wafer and the unit substrates are semiconductor chips.

<Supplementary Note A-6>

The method of manufacturing a circuit substrate according to any one of Supplementary Notes A-3 through A-5, further comprising an insulating film forming, selectively supplying a flowable insulating material to the surface of the semiconductor substrate with exception of the portion intended for forming the external terminal electrode, and covering an edge portions of upper face of the wiring layer by utilizing a surface tension of the insulating material after performing the lift-off and prior to performing the external terminal electrode forming and the cutting the collective substrate.

<Supplementary Note A-7>

The method of manufacturing a circuit substrate according to any one of Supplementary Notes A-1 through A-6, wherein a plurality of the wiring layers are formed using a series of successive steps including the single masking, a plurality of successive of the film forming, and the single lift-off corresponding to the single masking.

<Supplementary Note A-8>

The method of manufacturing a circuit substrate according to Supplementary Note A-7, wherein the plurality of successive film forming that includes a first film forming that forms a first metallic conductor and a second film forming that forms a second metallic conductor.

<Supplementary Note A-9>

The method of manufacturing a circuit substrate according to any one of Supplementary Notes A-1 through A-6, the method comprising: a first group of steps including the masking that makes use of a first of the metal mask, at least one of the film forming, and the lift-off that corresponds to the masking, and, furthermore, a second group of steps including a second masking, during which a second metallic metal mask that has openings exposing a first area intended for the external terminal electrode is placed over the semiconductor substrate, at least one of a second film forming, during which metallic conductor layer is formed by an ion plating process in the first area and on the second metal mask, and a second lift-off, during which the second metal mask is stripped away, leaving a second wiring line that is contained a second wiring layer including the metallic conductor layer formed in the first area, and in which a plurality of wiring layers are formed using the first and second groups of steps.

<Supplementary Note A-10>

The method of manufacturing a circuit substrate according to any one of Supplementary Notes A-9, wherein the plurality of wiring layers includes: a first wiring layer as the wiring layer, which has a first end portion covering the internal terminal electrode, a second end portion serving as an area intended for external terminal electrode, and a redistribution wiring portion extending across the surface of the semiconductor substrate and the redistribution wiring portion connecting the first end portion with the second end portion, and a second wiring layer, which covers the second end portion of the first wiring layer and is in contact with the first wiring layer, and, further wherein in the external terminal electrode forming, the external terminal electrode is formed such that is in contact with the second wiring layer.

<Supplementary Note A-11>

The method of manufacturing a circuit substrate according to any one of Supplementary Notes A-1 through A-10, which does not include steps of resist coating, exposure, development, and resist stripping in connection with the formation of the wiring layer.

<Supplementary Note B-1>

A method of manufacturing a circuit substrate, wherein, on a substrate comprising internal terminal electrode, the circuit substrate forming external terminal electrode that electrically coupling the internal terminal electrode to the exterior, the method comprising: masking, during which a metallic metal mask that has openings exposing a portion of the surface of the substrate including the internal terminal electrode and is connected to the negative side is placed over the substrate; film forming, during which metallic conductors layer is formed from positively charged ion particles using an ion plating process on the portion of the surface of the substrate and on the metal mask, the ion plating process applying a predetermined potential to the substrate and applying a deposition energy of 0.01 eV to 250 eV to a deposition metal ionized by a potential different from the predetermined potential; lift-off, during which the metal mask is stripped away, leaving a wiring line that is contained a wiring layer including the metallic conductor layer, the wiring line electrically coupled to the internal terminal electrode and formed on a portion of the surface of the substrate; and forming, the external terminal electrode electrically coupled to the wiring line.

<Supplementary Note B-2>

The method of manufacturing a circuit substrate according to Supplementary Note B-1, wherein a deposition energy of 5 eV to 100 eV is applied to the ionized deposition metal.

<Supplementary Note B-3>

The method of manufacturing a circuit substrate according to Supplementary Note B-1, wherein the substrate comprises a internal wiring line electrically coupled to the internal terminal electrode, the internal wiring line formed by a photolithographic process.

<Supplementary Note B-4>

The method of manufacturing a circuit substrate according to Supplementary Note B-3, wherein the substrate is a collective substrate obtained by repeatedly forming identical circuits, the method further comprising a cutting, during which individual unit substrates are produced by the cutting the collective substrate.

<Supplementary Note B-5>

The method of manufacturing a circuit substrate according to Supplementary Note B-4, wherein the cutting is performed after the external terminal electrode forming.

<Supplementary Note B-6>

The method of manufacturing a circuit substrate according to Supplementary Notes B-4 or 5, wherein the collective substrate is a semiconductor wafer and the unit substrates are semiconductor chips.

<Supplementary Note B-7>

The method of manufacturing a circuit substrate according to any one of Supplementary Notes B-4 through B-6, further comprising an insulating film forming, selectively supplying a flowable insulating material to the surface of the substrate with exception of the portion intended for forming the external terminal electrode after performing the lift-off and prior to performing the external terminal electrode forming and the cutting the collective substrate.

<Supplementary Note B-8>

The method of manufacturing a circuit substrate according to Supplementary Note B-7, wherein an edge portions of upper face of the wiring layer are covered with the insulating material in the insulating film forming.

<Supplementary Note B-9>

The method of manufacturing a circuit substrate according to any one of Supplementary Notes B-1 through B-8, wherein a plurality of wiring layers are formed using a series of successive steps including the single masking, a plurality of successive of the film forming, and the single lift-off corresponding to the single masking.

<Supplementary Note B-10>

The method of manufacturing a circuit substrate according to Supplementary Note B-9, wherein the plurality of successive film forming that includes a first film forming that forms a first metallic conductor and a second film forming that forms a second metallic conductor.

<Supplementary Note B-11>

The method of manufacturing a circuit substrate according to any one of Supplementary Notes B-1 through B-8, which comprises: a first group of steps including the masking that makes use of a first of the metal mask, at least one of the film forming, and the lift-off that corresponds to the masking, and, furthermore, a second group of steps including a second masking, during which a second metallic metal mask that has openings exposing a first area intended for external terminal electrode is placed over the substrate, at least one of a second film forming, during which metallic conductor layer is formed by an ion plating process in the first area and on the second metal mask, and a second lift-off, during which the second metal mask is stripped away, leaving a second wiring line that is contained a second wiring layer including the metallic conductor layer formed in the first area, and in which a plurality of wiring layers are formed using the first and second groups of steps.

<Supplementary Note B-12>

The method of manufacturing circuit substrate according to any one of Supplementary Notes B-11, wherein the plurality of wiring layer includes: a first wiring layer as the wiring layer, which has a first end portion covering the internal terminal electrodes, a second end portion serving as an area intended for external terminal electrode, and a redistribution wiring portion extending across the surface of the substrate and the redistribution wiring portion connecting the first end portion with the second end portion, and a second wiring layer, which covers the second end portion of the first wiring layer and is in contact with the first wiring layer, and, further wherein in the external terminal electrode forming, the external terminal electrode is formed such that is in contact with the second wiring layer.

<Supplementary Note B-13>

The method of manufacturing a circuit substrate according to any one of Supplementary Notes B-1 through B-12, which does not include steps of resist coating, exposure, development, and resist stripping in connection with the formation of the wiring layer.

<Supplementary Note B-14>

The method of manufacturing a circuit substrate according to any one of Supplementary Notes B-1 through B-13, wherein the substrate is a semiconductor wafer.

<Supplementary Note B-15>

The method of manufacturing a circuit substrate according to any one of Supplementary Notes B-1 through B-14, wherein a principal portion of the deposition energy is 25±10 eV.

What is claimed is:

1. A circuit substrate, comprising:
   a substrate containing silicon and comprising an internal terminal electrode containing metal;
   a wiring layer containing metal chosen from group of Cu, Al, Ti, and Ni that is formed on a portion of a surface of the substrate and is electrically coupled to the internal terminal electrode;
   an insulating film that covers a second portion of the surface of the wiring layer while not covering a first portion of a surface of the wiring layer; and
   an external terminal electrode containing metal and electrically couple the internal terminal electrode to the exterior by covering the first portion of the wiring layer and electrically coupling to the wiring layer;
   wherein the second portion of the wiring layer includes an edge portion viewed from the direction perpendicular to the surface of the substrate;
   wherein the angle of the cross-section of the wiring layer taken perpendicularly to the surface of the substrate in the edge portion contacting with the substrate is 55° (55 degree) or less; and
   wherein the wiring layer that comprises a plurality of mutually independent columnar crystals extending in a direction different from the direction of the surface of the substrate.

2. The circuit substrate according to claim 1, wherein the plurality of columnar crystals has mutually different crystal orientations.

3. The circuit substrate according to claim 1, wherein the plurality of columnar crystals has mutually different heights above the surface of the substrate.

4. The circuit substrate according to claim 1, wherein:
   the substrate that comprises a first substrate and a second insulating film;
   the first substrate that includes an internal wiring line formed thereon; and
   the second insulating film containing organic material that is in surface contact with the surface of the first substrate and covers the first substrate with the exception of the region of the internal terminal electrode formed on the surface of the first substrate.

5. The circuit substrate according to claim 4, wherein the wiring layer is in contact with the surface of the second insulating film and covers a portion of the second insulating film.

6. The circuit substrate according to claim 1, wherein the first portion is an enclosed region obtained by removing the portion constituting the edge portion that has the angle from the pattern shape of the surface of the wiring layer.

7. The circuit substrate according to claim 1, wherein the height from the substrate of the insulating film is higher than the height from the substrate of the surface of the wiring layer on the external terminal electrode side.

8. The circuit substrate according to claim 1, wherein:
   the wiring layer that includes a first wiring layer and a second wiring layer, which are laminated from the substrate in the direction of the external terminal electrode;
   the first wiring layer is connected to the internal terminal electrode;
   the second wiring layer, which is connected to the first wiring layer and contains a second edge portion connected to the external terminal electrode; and
   the angle of the cross-section of the second wiring layer taken perpendicularly to the surface of the substrate in the second edge portion is 55° (55 degree) or less.

9. The circuit substrate according to claim 1, wherein the edge portion includes a portion enclosing the first portion.

10. The circuit substrate according to claim 9, wherein the wiring layer includes:
    a first wiring layer, which has a first end portion that covers the internal terminal electrode, a second end portion, and a redistribution wiring portion that extends across the surface of the substrate and connects the first end portion and the second end portion; and
    a second wiring layer, which covers the second end portion of the first wiring layer and is in electrical communication with the first wiring layer;
    wherein the first portion of the wiring layer is provided on the second wiring layer without being provided on the first wiring layer; and
    wherein the second portion of the wiring layer is provided on the first and second wiring layers, respectively.

11. The circuit substrate according to claim 1, wherein the internal terminal electrode include a layer obtained by plating the surface in contact as surface with the wiring layer.

12. The circuit substrate according to claim 1, wherein the internal terminal electrode contain aluminum and the wiring layer contains aluminum.

13. The circuit substrate according to claim 1, wherein the substrate is a semiconductor wafer formed by repeating identical circuits.

14. The circuit substrate according to claim 1, wherein:
    the substrate is a semiconductor substrate containing silicon; and
    the semiconductor substrate that includes a internal wiring line that is finer than the wiring lines of the wiring layer electrically connected to the internal terminal electrode.

15. A circuit substrate, comprising:
    a substrate containing silicon and comprising an internal terminal electrode containing metal;
    a wiring layer containing a metal chosen from the group of Cu, Al, Ti, and Ni that is formed on a portion of a surface of the substrate and has one end thereof connected to the internal terminal electrode;
    an insulating film contacting as a surface with the wiring layer; and
    an external terminal electrode containing metal that connects the other end of the wiring layer and is used for connecting to the exterior;

wherein the angle of the cross-section of the wiring layer taken perpendicularly to the surface of the substrate in an edge portion that the wiring layer contains is 55° (55 degree) or less; and wherein the wiring layer that contains a plurality of mutually independent columnar crystals extending perpendicularly in a direction different from the direction of the surface of the substrate.

16. The circuit substrate according to claim 15, wherein the plurality of columnar crystals has mutually different crystal orientations.

17. The circuit substrate according to claim 15, wherein the plurality of columnar crystals has mutually different heights above the surface of the substrate.

18. The circuit substrate according to claim 15, wherein the internal terminal electrode contain aluminum and the wiring layer contains aluminum.

19. The circuit substrate according to claim 15, wherein:

the wiring layer that includes a first wiring layer and second wiring layer, which are laminated from the substrate in the direction of the external terminal electrode;

the first wiring layer is connected to the internal terminal electrode;

the second wiring layer, which is connected to the first wiring layer and contains a second edge portion that is connected to the external terminal electrode and is formed in a layer different from the first wiring layer;

the angle of the cross-section of the second wiring layer taken perpendicularly to the surface of the substrate in the second edge portion is 55° (55 degree) or less; and the first and second wiring layers that contains a plurality of columnar crystals, respectively.

20. The circuit substrate according to claim 15, wherein:

the substrate that comprises a first substrate and a second insulating film;

the first substrate that comprises an internal wiring line formed thereon;

the second insulating film that contains organic material that is in surface contact with the surface of the first substrate and covers the first substrate with the exception of the region of the internal terminal electrode formed on the surface of the first substrate; and the wiring layer is in surface contact with the surface of the second insulating film and covers a portion of the second insulating film.

21. The circuit substrate according to claim 15, wherein:

the substrate is a semiconductor substrate containing silicon; and the semiconductor substrate that includes internal wiring lines that are finer than the wiring lines of the wiring layer electrically connected to the internal terminal electrode.

22. The circuit substrate according to claim 15, wherein the substrate is a semiconductor wafer formed by repeating identical circuits.

* * * * *